(12) United States Patent
Cook et al.

(10) Patent No.: US 11,404,270 B2
(45) Date of Patent: Aug. 2, 2022

(54) MICROELECTRONIC DEVICE SUBSTRATE FORMED BY ADDITIVE PROCESS

(71) Applicant: Texas Instruments Incorporated, Dallas, TX (US)

(72) Inventors: Benjamin Stassen Cook, Addison, TX (US); Daniel Lee Revier, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/206,050

(22) Filed: Nov. 30, 2018

(65) Prior Publication Data
US 2020/0176251 A1    Jun. 4, 2020

(51) Int. Cl.
*H01L 21/02* (2006.01)
*H01L 21/8234* (2006.01)
(Continued)

(52) U.S. Cl.
CPC ........ *H01L 21/02623* (2013.01); *B33Y 30/00* (2014.12); *H01L 21/02288* (2013.01);
(Continued)

(58) Field of Classification Search
CPC ..... H01L 21/823493; H01L 21/823892; H01L 21/823481; H01L 21/823878;
(Continued)

(56) References Cited

U.S. PATENT DOCUMENTS

| 7,216,009 B2 | 5/2007 | Farnworth et al. |
| 7,951,422 B2 | 5/2011 | Pan et al. |

(Continued)

FOREIGN PATENT DOCUMENTS

| FR | 2848724 A1 * | 6/2004 | ............ H01L 21/84 |
| KR | 100382538 B1 * | 7/2003 | |
| WO | WO-2009131587 A1 * | 10/2009 | ....... H01L 29/66651 |

OTHER PUBLICATIONS

Quirk and Serda. Semiconductor Manufacturing Technology, Prentice Hall, 2001, p. 290 (Year: 2001).*

*Primary Examiner* — Yu Chen
(74) *Attorney, Agent, or Firm* — Ray A. King; Charles A. Brill; Frank D. Cimino

(57) ABSTRACT

A microelectronic device is formed by forming at least a portion of a substrate of the microelectronic device by one or more additive processes. The additive processes may be used to form semiconductor material of the substrate. The additive processes may also be used to form dielectric material structures or electrically conductive structures, such as metal structures, of the substrate. The additive processes are used to form structures of the substrate which would be costly or impractical to form using planar processes. In one aspect, the substrate may include multiple doped semiconductor elements, such as wells or buried layers, having different average doping densities, or depths below a component surface of the substrate. In another aspect, the substrate may include dielectric isolation structures with semiconductor material extending at least partway over and under the dielectric isolation structures. Other structures of the substrate are disclosed.

9 Claims, 44 Drawing Sheets

(51) Int. Cl.
*H01L 21/66* (2006.01)
*H01L 21/8238* (2006.01)
*H01L 21/3205* (2006.01)
*B33Y 30/00* (2015.01)
*H01L 27/092* (2006.01)
*H01L 21/762* (2006.01)
*H01L 21/67* (2006.01)

(52) U.S. Cl.
CPC .. *H01L 21/02532* (2013.01); *H01L 21/02628* (2013.01); *H01L 21/02686* (2013.01); *H01L 21/32051* (2013.01); *H01L 21/76294* (2013.01); *H01L 21/823481* (2013.01); *H01L 21/823493* (2013.01); *H01L 21/823814* (2013.01); *H01L 22/12* (2013.01); *H01L 27/0928* (2013.01); *H01L 21/02216* (2013.01); *H01L 21/6715* (2013.01); *H01L 21/823487* (2013.01)

(58) Field of Classification Search
CPC ......... H01L 21/76294; H01L 21/76297; H01L 21/02211–02216; H01L 21/02288; H01L 21/02628; H01L 21/02532; H01L 21/76224; H01L 27/0928; H01L 27/3246; H01L 51/0005; H01L 21/02623; H01L 21/02625; H01L 21/02282–0229; H01L 21/208; H01L 21/2085; H01L 21/6835; H01L 21/6836; H01L 21/823431; H01L 21/823821; H01L 21/845; H01L 21/84; H01L 27/0886; H01L 27/0924; H01L 27/1211; H01L 27/1203; H01L 21/76283; H01L 21/76229; H01L 21/02617–02653; H01L 21/683–6836; H01L 21/68714–68792; H01L 21/6536; H01L 21/7806; B33Y 30/00; B33Y 10/00; B29C 64/106–135; B29C 64/171–182; B29C 64/40

See application file for complete search history.

(56) References Cited

U.S. PATENT DOCUMENTS

| | | | |
|---|---|---|---|
| 8,048,814 B2 | 11/2011 | Meisel et al. | |
| 8,632,702 B2 | 1/2014 | Hieslmair et al. | |
| 8,900,915 B2 | 12/2014 | Rockenberger et al. | |
| 8,912,083 B2 | 12/2014 | Liu et al. | |
| 9,006,720 B2 | 4/2015 | Chiruvolu et al. | |
| 9,475,695 B2 | 10/2016 | Li et al. | |
| 9,646,874 B1* | 5/2017 | Wojciechowski | H01L 21/3213 |
| 9,887,313 B2 | 2/2018 | Mader et al. | |
| 2008/0044964 A1* | 2/2008 | Kamath | H01L 27/1285 438/164 |
| 2008/0138955 A1* | 6/2008 | Ye | H01L 29/7834 438/300 |
| 2008/0171425 A1 | 7/2008 | Poplavskyy et al. | |
| 2010/0115672 A1 | 5/2010 | Mirkin et al. | |
| 2010/0237495 A1 | 9/2010 | Pagalia et al. | |
| 2011/0240997 A1 | 10/2011 | Rockenberger et al. | |
| 2013/0105806 A1 | 5/2013 | Liu et al. | |
| 2013/0160833 A1 | 6/2013 | Loscutoff et al. | |
| 2014/0124794 A1* | 5/2014 | Weihua | H01L 21/823878 257/77 |
| 2014/0151706 A1 | 6/2014 | Liu et al. | |
| 2014/0170800 A1 | 6/2014 | Loscutoff et al. | |
| 2015/0004375 A1* | 1/2015 | Hou | H01L 51/0014 428/195.1 |
| 2015/0035091 A1 | 2/2015 | Ziglioli | |
| 2016/0218175 A1* | 7/2016 | Carothers | H01L 21/78 |
| 2016/0300753 A1* | 10/2016 | Hieda | H01L 21/0262 |
| 2017/0092547 A1* | 3/2017 | Tang | H01L 29/20 |
| 2017/0117356 A1* | 4/2017 | Carothers | H01L 28/00 |
| 2017/0197823 A1 | 7/2017 | Wachtler et al. | |
| 2018/0166583 A1* | 6/2018 | Cho | H01L 27/1292 |
| 2019/0311950 A1* | 10/2019 | Mehandru | H01L 21/76897 |

* cited by examiner

MICROELECTRONIC DEVICE SUBSTRATE FORMED BY ADDITIVE PROCESS

TECHNICAL FIELD

This relates generally to microelectronic devices, and more particularly to microelectronic devices formed using additive processes.

BACKGROUND

Dimensions of components in microelectronic devices such as integrated circuits have been shrinking. It is becoming more desirable to integrate a wider diversity of the types of the components, such as logic, power, low noise, high voltage, and high speed, into individual microelectronic devices, to increase the functionalities of the microelectronic devices. The various types of components have structural members, such as source and drain regions, wells, lateral isolation, and sometimes buried layers, which have different dopant and spatial requirements. Fabricating a microelectronic device with such diverse components involves a large number of process steps, such as lithography, ion implant, and so on, to form the structural members, adversely increasing the fabrication cost and complexity. In some cases, structural elements of different types of components may be formed concurrently with dopant and spatial values that represent a compromise for all the components, resulting in reduced performance or reliability for the components, and for the microelectronic device as a whole.

SUMMARY

In described examples, a microelectronic device is formed by forming at least a portion of a substrate of the microelectronic device by an additive process. In one aspect, the microelectronic device may be formed by forming a first semiconductor region of the substrate by a first additive process, the first semiconductor region having a first conductivity type, the first semiconductor region extending through the substrate, and forming a second semiconductor region by a second additive process, the second semiconductor region having a second conductivity type opposite from the first conductivity type, the second semiconductor region being located laterally adjacent to the first semiconductor region and extending through the substrate.

In another aspect, the microelectronic device may be formed by forming a first doped semiconductor structure for a first component by a first additive process in the substrate of the microelectronic device, and forming a second doped semiconductor structure for a second component by a second additive process in the substrate of the microelectronic device. The first doped semiconductor structure and the second doped semiconductor structure provide similar functionalities for the first component and the second component, respectively. The first doped structure has a first conductivity type, a first average dopant density, a first peak dopant density, a first upper surface located at a first upper depth below a component surface of the substrate, and a first lower surface located at a first lower depth below the component surface. The second doped structure has a second conductivity type, a second average dopant density, a second peak dopant density, a second upper surface located at a second upper depth below the component surface, and a second lower surface located at a second lower depth below the component surface. At least one of the second average dopant density and the second peak dopant density, the second upper depth and the second lower depth has a different value from the first average dopant density and the first peak dopant density, the first upper depth and the first lower depth.

In a further aspect, the microelectronic device may be formed by forming a dielectric region in the substrate, the dielectric region being located over a semiconductor base region having a base crystalline structure, and forming a semiconductor region over the dielectric region by an additive process, wherein a crystalline structure of the semiconductor region matches the base crystalline structure.

In yet another aspect, the microelectronic device may be formed by forming an electrically conductive structure containing metal or metal silicide, in the substrate, the electrically conductive structure being located over a semiconductor base region having a base crystalline structure, and forming a semiconductor region over the electrically conductive region by an additive process, wherein a crystalline structure of the semiconductor region matches the base crystalline structure. The electrically conductive structure may be manifested as a local interconnect, a via structure extending to a back surface of the substrate, or a substrate shunting layer.

In a further aspect, the microelectronic device may be formed by forming a first semiconductor region by a first additive process in the substrate, the first semiconductor region having a first band gap, and forming a second semiconductor region by a second additive process in the substrate, the second semiconductor region being located laterally adjacent to the first semiconductor region, the second semiconductor region having a second band gap larger than the first bandgap.

In another aspect, the microelectronic device may be formed by forming at least a first portion of the substrate by a first additive process in a workpiece containing the substrate of the microelectronic device and another substrate of another microelectronic device, and forming at least a second portion of the second substrate by a second additive process in the workpiece, wherein the second substrate has a different configuration of doped regions from the substrate of the microelectronic device.

In a further aspect, additive process may be used to form singulation assist structures in the substrate around a lateral perimeter of the microelectronic device.

In another aspect, additive processes may be used to form a corrective sublayer of precursor to improve a planarity of a top surface of the substrate.

In a further aspect, additive processes may be used to form active components on a MEMS movable structure.

In another aspect, additive processes may be used to form a substrate of the microelectronic device on a package structure containing leads.

In a further aspect, additive processes may be used to form a single crystal semiconductor layer on surface of a workpiece, in which the surface is free of a crystalline structure.

DETAILED DESCRIPTION OF EXAMPLE EMBODIMENTS

Figure 1A:
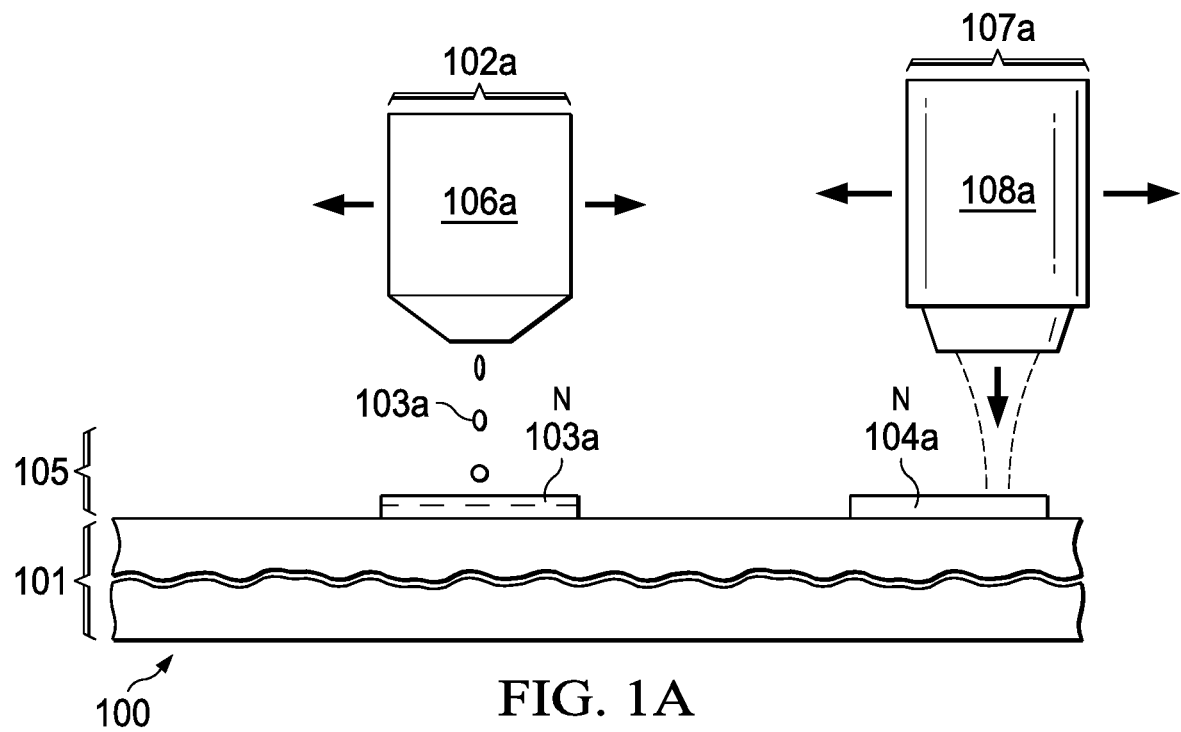
FIG. 1A through FIG. 1G are cross sections of a microelectronic device depicted in stages of an example method of formation.

The drawings are not necessarily drawn to scale. Example embodiments are not limited by the illustrated ordering of acts or events, as some acts or events may occur in different orders and/or concurrently with other acts or events. Furthermore, not all illustrated acts or events are required to implement a methodology in accordance with example embodiments.

A microelectronic device may be manifested as an integrated circuit, a discrete semiconductor device, an optoelectronic device, a microelectrical mechanical system (MEMS) device, or such. The substrate includes structural elements located under a component surface of the substrate. Copper or aluminum interconnects of the microelectronic device and input/output terminals, such as bond pads, may be located above the component surface. The structural elements of the substrate may include doped semiconductor regions such as wells, buried layers, source and drain regions, threshold adjustment regions, and so on. The structural elements of the substrate may include dielectric regions, such as isolation trenches.

The microelectronic device may include different types of components, such as logic transistors, memory transistors, power transistors, isolated transistors, vertical bipolar transistors, heterojunction bipolar transistors, and so on, each requiring a set of structural components in the substrate. The structural elements of a substrate of the microelectronic device may be formed by one or more additive processes. In this description, the term "additive process" can mean a process of forming the structural elements by selectively placing material for the substrate in a region for the structural elements. Examples of additive processes include binder jetting, material jetting, directed energy deposition, material extrusion, powder bed fusion, sheet lamination, vat photopolymerization, direct laser deposition, electrostatic deposition, laser sintering, electrochemical deposition, and photo-polymerization extrusion.

Additive processes may be used to form the structural elements without performing photolithographic operations, ion implant operations, or etch operations. Additive processes may be performed so as to concurrently form a set of structural elements having a common material characteristic, advantageously reducing fabrication costs. For example, silicon structural elements with varied dopant densities and dopant polarities may be formed concurrently by combined disposition of silicon precursor material with dopant material, in appropriate amounts. Similarly, isolation structures, containing dielectric material, of different shapes and sizes may be formed concurrently in a semiconductor substrate by controlling spatial distributions of dispensed dielectric material. Additive processes may also be used to form structural elements which are costly or impractical to form using planar processes. For example, buried dielectric layers and buried metal or metal silicide local interconnects may be formed in semiconductor substrates using an additive process dispensing a dielectric material precursor, a metal precursor, or a metal silicide material precursor, concurrently with another additive process dispensing a semiconductor material precursor. Use of additive processes may be combined with a subtractive process, such as laser ablation, to form the structural elements. Sacrificial or temporary structural elements may be formed by additive processes in the substrate of the microelectronic device, and may subsequently be removed, such as by dissolution or evaporation, to provide cavities or to release other structural elements, such as cantilevered beams, membranes, or proof masses.

FIG. 1A through FIG. 1G are cross sections of a microelectronic device depicted in stages of an example method of formation. Referring to FIG. 1A, the microelectronic device 100 is formed on a workpiece 101, which has a crystalline structure. The workpiece 101 may be implemented as a semiconductor wafer, such as a silicon wafer, for example. A first additive process 102a dispenses an n-type semiconductor precursor 103a onto the workpiece 101 in areas for an n-type semiconductor material 104a of a substrate 105 of the microelectronic device 100. The first additive process 102a may be implemented as a first material jetting process 102a using a first material jetting apparatus 106a, sometimes referred to as an ink jet apparatus 106a. Other additive processes for dispensing the n-type semiconductor precursor 103a are within the scope of this example. The first material jetting apparatus 106a may be moved relative to the workpiece 101, selectively dispensing the n-type semiconductor precursor 103a as needed in the areas for the n-type semiconductor material 104a. Alternatively, the workpiece 101 may be moved relative to the first material jetting apparatus 106a, or a combination of both movement modes may be used. The n-type semiconductor precursor 103a may include silicon nanoparticles, doped with phosphorus, arsenic, or antimony. The n-type semiconductor precursor 103a may further include liquid silicon precursor material such as neopentasilane, isotetrasilane, or cyclohexasilane. A thin layer of the n-type semiconductor precursor 103a is dispensed before a subsequent conversion to the n-type semiconductor material 104a. The thin layer of the n-type semiconductor precursor 103a may have a thickness of 30 nanometers to 100 nanometers, for example.

The n-type semiconductor precursor 103a is converted to the n-type semiconductor material 104a by a first localized heating process 107a. The n-type semiconductor material 104a has the same crystalline structure as the workpiece 101 in direct contact with the n-type semiconductor material 104a. The first localized heating process 107a may locally heat the dispensed n-type semiconductor precursor 103a to form an epitaxial sublayer of the n-type semiconductor material 104a. Using the silicon nanoparticles in the n-type semiconductor precursor 103a may enable forming the epitaxial sublayer of the n-type semiconductor material 104a at a much lower temperature than convention bulk epitaxial processes. For example, using silicon nanoparticles with diameters less than 30 nanometers, and mixed with neopentasilane, isotetrasilane, or cyclohexasilane, may enable forming the epitaxial sublayer of the n-type semiconductor material 104a at less than 500° C. The first localized heating process 107a uses a first localized heating apparatus 108a, which may be implemented as a pulsed laser apparatus 108a or other radiation source which can be focused to heat the n-type semiconductor precursor 103a in an area that is, for example, 10 microns to 50 microns in size. A wavelength or output spectrum of the first localized heating process 107a may be matched to an absorption spectrum of the n-type semiconductor precursor 103a to reduce heating of the workpiece 101. Having the thickness of the thin layer of the n-type semiconductor precursor 103a less than 100 nanometers may facilitate the conversion to the n-type semiconductor material 104a with properties such as carrier mobility and crystal lattice defects that are close to those attained in commercial silicon semiconductor wafers.

Figure 1B:
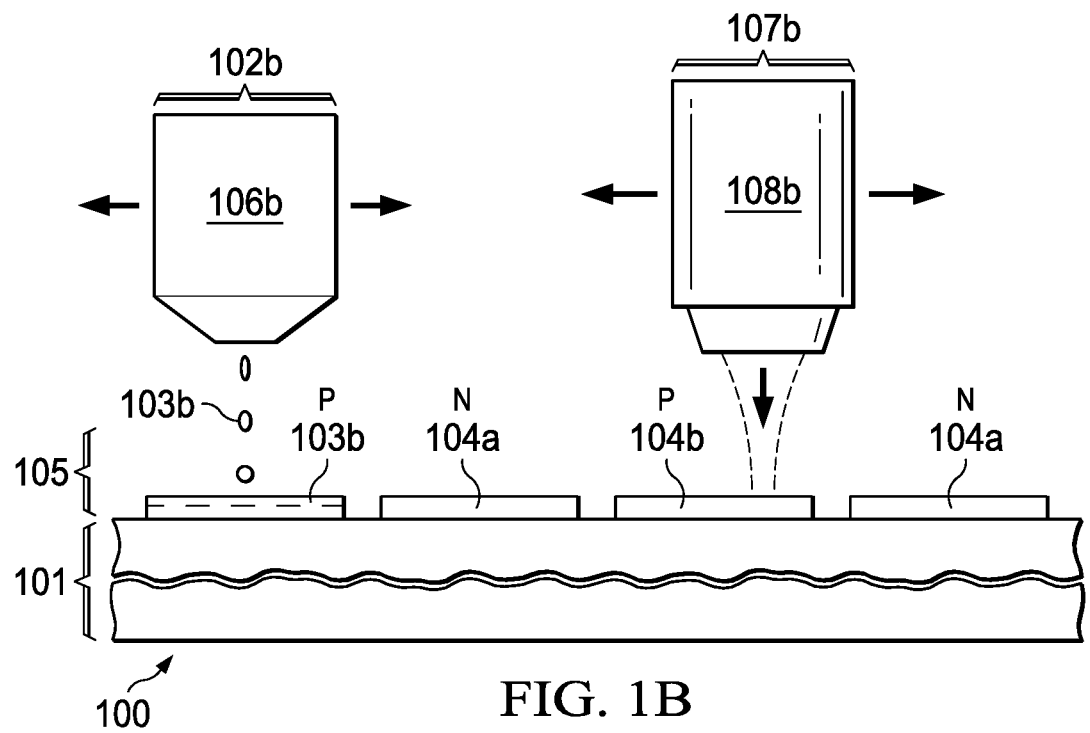

Referring to FIG. 1B, a second additive process 102b dispenses a p-type semiconductor precursor 103b onto the workpiece 101 in areas for a p-type semiconductor material 104b of the substrate 105. The second additive process 102b may be implemented as a second material jetting process 102b using a second material jetting apparatus 106b, as indicated in FIG. 1B, or may be implemented as another additive process. The p-type semiconductor precursor 103b may include silicon nanoparticles, doped with boron, gallium, or indium. The p-type semiconductor precursor 103b may have a composition similar to the n-type semiconductor precursor 103a of FIG. 1A, with appropriate changes to provide p-type dopants instead of n-type dopants.

The p-type semiconductor precursor 103b is converted to the p-type semiconductor material 104b by a second localized heating process 107b using a second localized heating apparatus 108b. The p-type semiconductor material 104b has the same crystalline structure as the workpiece 101 in direct contact with the p-type semiconductor material 104b. The second localized heating process 107b may be implemented as a continuation of the first localized heating process 107a of FIG. 1A, and the second localized heating apparatus 108b may be implemented as the first localized heating apparatus 108a. Alternatively, the first localized heating process 107a and the second localized heating process 107b may be replaced with a blanket flash anneal process that heats the n-type semiconductor precursor 103a and the p-type semiconductor precursor 103b across the microelectronic device 100.

Figure 1C:
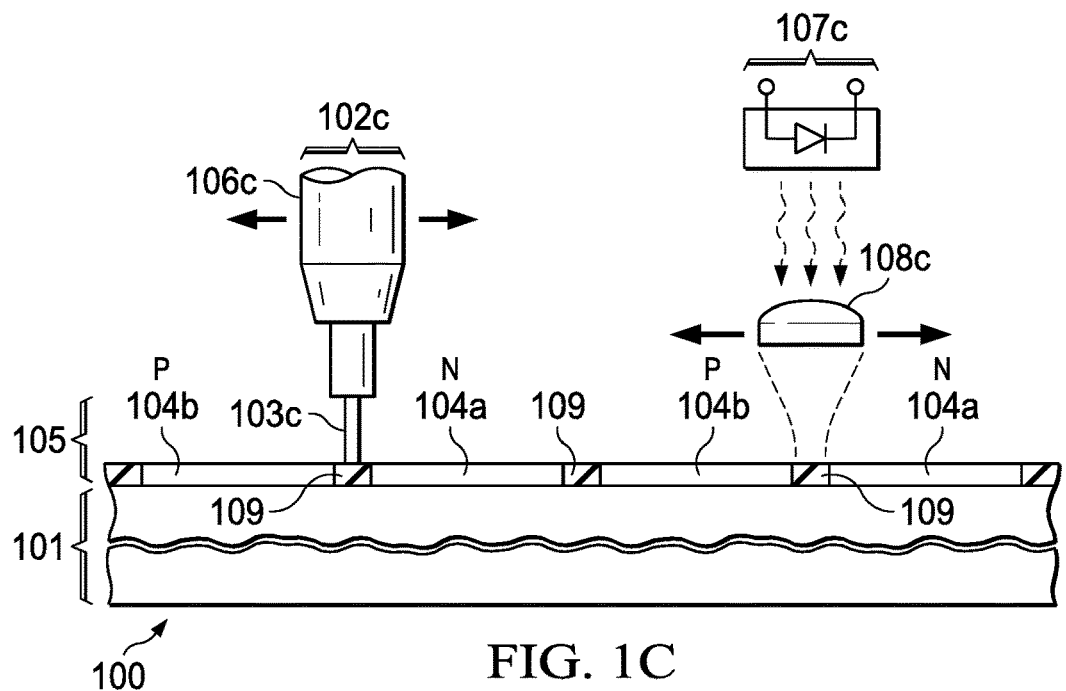

Referring to FIG. 1C, a third additive process 102c dispenses a dielectric precursor 103c onto the workpiece 101 in areas for isolation structures 109 of the substrate 105. The third additive process 102c may be implemented as a material extrusion process 102c using a material extrusion apparatus 106c, as indicated in FIG. 1C, or may be implemented as another additive process. The dielectric precursor 103c may include, for example, methyl silsesquioxane (MSQ), hydrogen silsesquioxane (HSQ), or tetraethyl orthosilicate (TEOS). The dielectric precursor 103c may include dielectric nanoparticles, such as silicon dioxide nanoparticles. Alternatively, the dielectric precursor 103c may include precursors for other dielectric materials, such as precursors for silicon nitride, silicon oxynitride, boron nitride, aluminum oxide, or titanium oxide, and may include nanoparticles of silicon nitride, silicon oxynitride, boron nitride, aluminum oxide, or titanium oxide.

The dielectric precursor 103c is converted to dielectric material to form the isolation structures 109 by a third localized heating process 107c. The third localized heating process 107c may locally heat the dielectric precursor 103c without significantly heating the n-type semiconductor material 104a or the p-type semiconductor material 104b. The third localized heating process 107c may be implemented using a scanning focused light emitting diode (LED) apparatus 108c, as depicted in FIG. 1C. The third localized heating process 107c may be implemented as another heating process, including a continuation of the second localized heating process 107b of FIG. 1B. Alternatively, the third localized heating process 107c may be implemented as a blanket heating process that heats the dielectric precursor 103c along with the n-type semiconductor material 104a and the p-type semiconductor material 104b across the microelectronic device 100.

The isolation structures 109 may include silicon dioxide-based dielectric material such as silicon dioxide, organosilicate glass (OSG), phosphosilicate glass (PSG), or borophosphosilicate glass (BPSG). The isolation structures 109 may include other dielectric material, such as silicon nitride-based dielectric material, boron nitride-based dielectric material, aluminum oxide-based dielectric material, or titanium oxide-based dielectric material. The isolation structures 109 may include some hydrogen content, as a result of being formed using the dielectric precursor 103c.

Figure 1D:
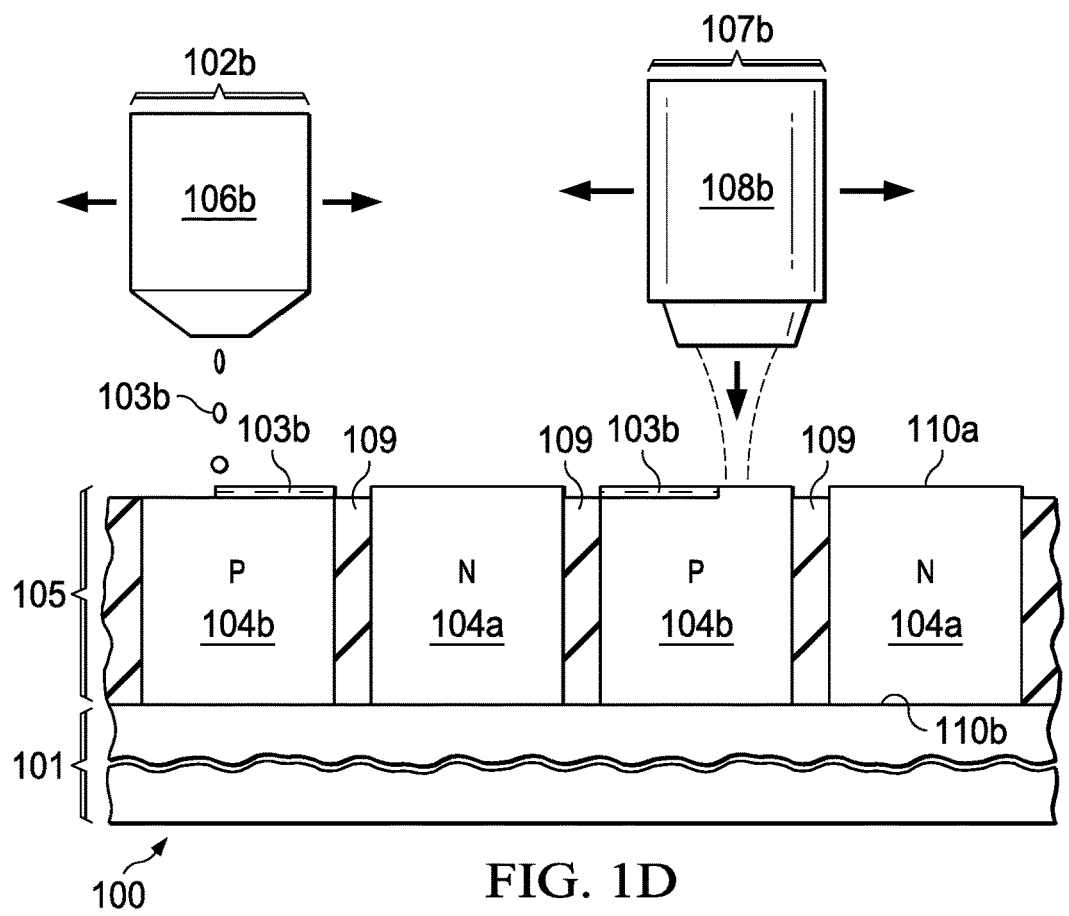

Referring to FIG. 1D, the substrate 105 is formed by repeating the steps disclosed in reference to FIG. 1A through FIG. 1C, for multiple iterations. In this example, the n-type semiconductor material 104a and the p-type semiconductor material 104b each extend through the substrate 105, from a component surface 110a to a bottom surface 110b of the substrate 105, located opposite from the component surface 110a, the bottom surface 110b contacting the workpiece 101. The isolation structures 109 may each extend through the substrate 105, laterally separating the n-type semiconductor material 104a from the p-type semiconductor material 104b.

Lateral dimensions of the isolation structures 109 may be significantly less than a thickness of the substrate 105, advantageously reducing an area of the microelectronic device 100 and thus reducing fabrication costs. Similarly, lateral dimensions of the n-type semiconductor material 104a and the p-type semiconductor material 104b may be significantly less than the thickness of the substrate 105, further reducing area and fabrication cost of the microelectronic device 100. Forming the substrate 105 using the additive processes as disclosed in reference to FIG. 1A through FIG. 1D provides these advantages, which would be difficult to attain using conventional ion implant and diffusion processes on a semiconductor wafer.

Figure 1E:
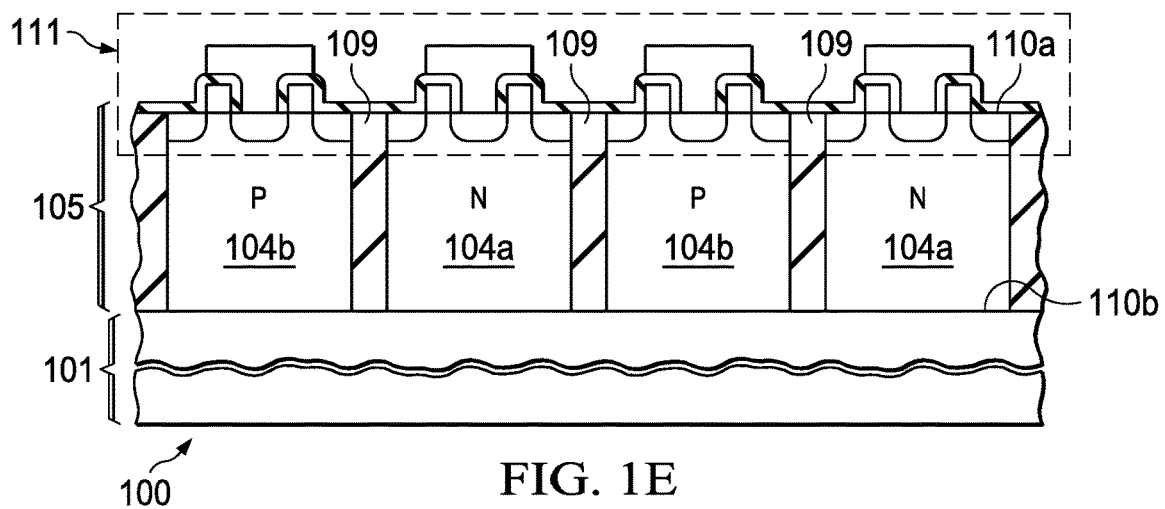

Referring to FIG. 1E, component structures 111 are formed on the component surface 110a of the substrate 105. The component structures 111 may be implemented as gates and source regions of vertical metal oxide semiconductor (MOS) transistors, as depicted in FIG. 1E. The component structures 111 may be formed using planar processes, such as thin film deposition processes, photolithographic processes to form etch masks or ion implant masks, etching process such as reactive ion etch (RIE) processes, or ion implant processes. Some of the component structures 111 may be formed using additive processes.

Figure 1F:
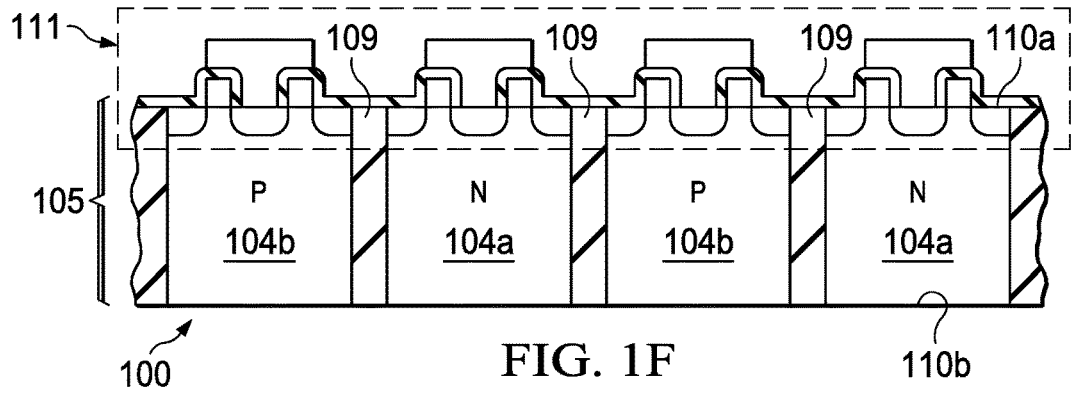

Referring to FIG. 1F, the microelectronic device 100 may be separated from the workpiece 101. The substrate 105 may be cleaved from the workpiece 101, for example by forming a defect layer proximate to a boundary between the substrate 105 and the workpiece 101, and separating the substrate 105 from the workpiece 101 along the defect layer. Alternatively, the workpiece 101 may be removed by etching or grinding.

Figure 1G:
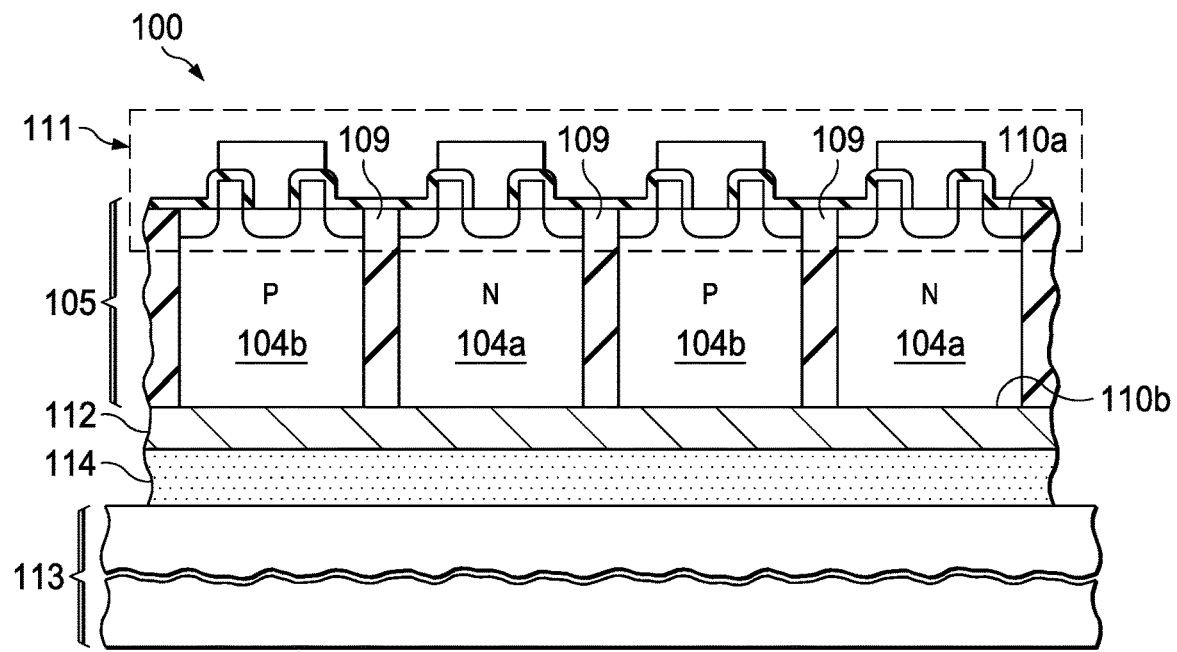

Referring to FIG. 1G, a backside metal layer 112 may be formed on the substrate 105 opposite from the component surface 110a. The backside metal layer 112 may provide a common terminal, such as a common drain terminal, for the component structures 111. The backside metal layer 112 may include an adhesion sublayer which has titanium, titanium tungsten, or such. The backside metal layer 112 may also include a high conductivity sublayer which has copper, aluminum, or such and provides a low sheet resistance, for example, less than 0.02 ohms/square, for the backside metal layer 112.

The microelectronic device 100 may be attached to a carrier 113, which may be implemented as a lead frame, a chip carrier, a printed circuit board (PCB), or such. The microelectronic device 100 may be attached to the carrier 113 by an attachment layer 114, which may be implemented, for example, as a solder layer, an electrically conductive adhesive, or an electrically insulating adhesive layer.

Figure 2A:
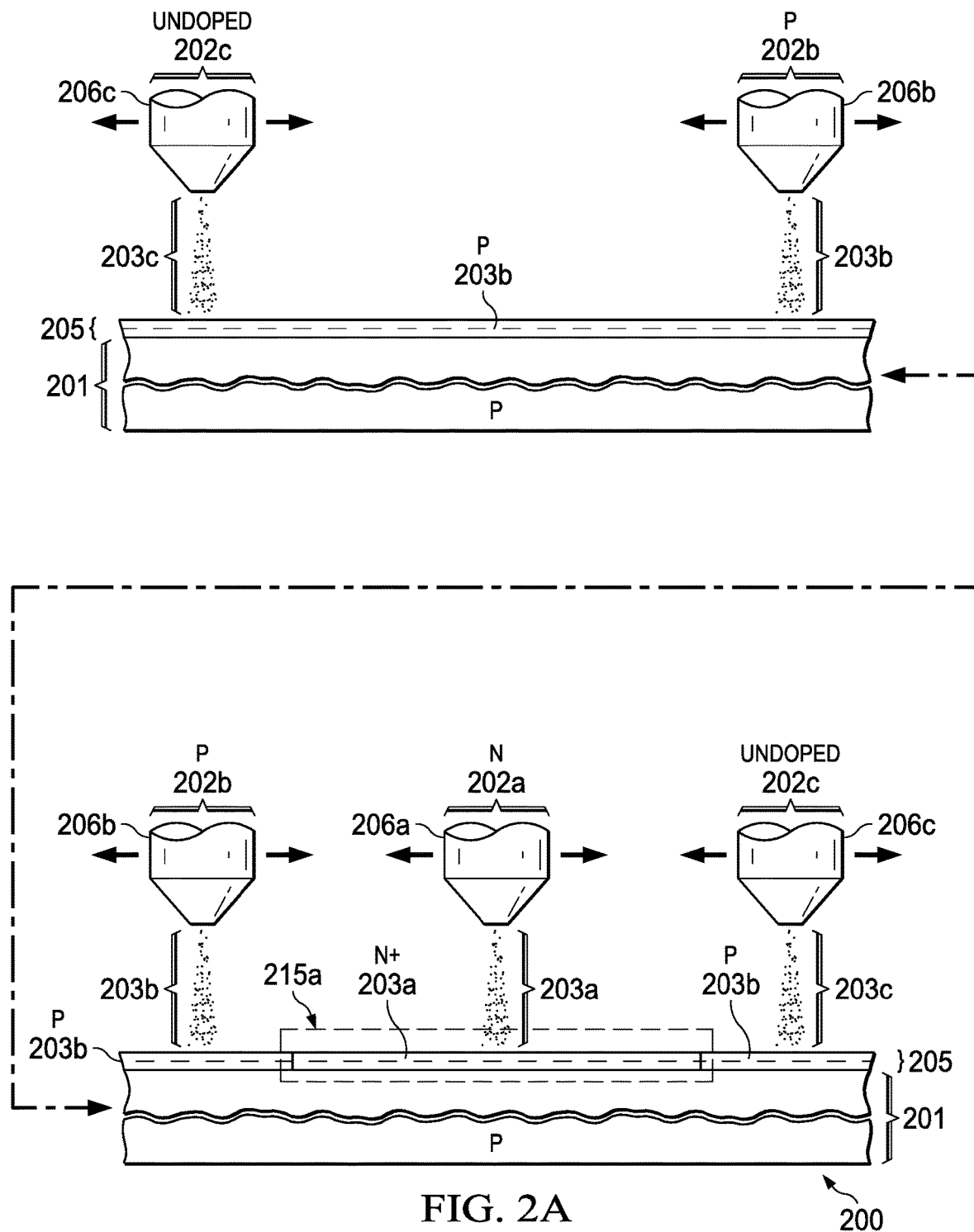
FIG. 2A through FIG. 2E are cross sections of a microelectronic device depicted in stages of another example method of formation.

FIG. 2A through FIG. 2E are cross sections of a microelectronic device depicted in stages of another example method of formation. Referring to FIG. 2A, the microelectronic device 200 is formed on a workpiece 201, which has a crystalline structure. The workpiece 201 may be implemented as a semiconductor wafer, such as a silicon wafer. In this example, the workpiece 201 may be implemented as p-type semiconductor material, such as p-type silicon. A first additive process 202a dispenses an n-type semiconductor precursor 203a onto the workpiece 201 in an area for a first buried layer 215a of a substrate 205 of the microelectronic device 200. A second additive process 202b dispenses a p-type semiconductor precursor 203b onto the workpiece 201 in areas of the substrate 205 outside of the area for the first buried layer 215a. A third additive process 202c dispenses undoped semiconductor precursor 203c onto the workpiece 201 in the areas outside the area for the first buried layer 215a, mixing with the p-type semiconductor precursor 203b to provide a desired dopant density. The third additive process 202c may optionally dispense the undoped semiconductor precursor 203c onto the workpiece 201 in the area for the first buried layer 215a, mixing with the n-type semiconductor precursor 203a to provide a desired dopant density. The n-type semiconductor precursor 203a may include any of the materials disclosed in reference to the n-type semiconductor precursor 103a of FIG. 1A. Similarly, the p-type semiconductor precursor 203b may include any of the materials disclosed in reference to the p-type semiconductor precursor 103b of FIG. 1A. The undoped semiconductor precursor 203c may include any of the materials in the n-type semiconductor precursor 203a or the p-type semiconductor precursor 203b, except for the dopant materials.

The first additive process 202a, the second additive process 202b, and the third additive process 202c may be implemented as similar additive processes, for example, electrostatic deposition processes, using a first electrostatic deposition apparatus 206a to dispense the n-type semiconductor precursor 203a, a second electrostatic deposition apparatus 206b to dispense the p-type semiconductor precursor 203b, and a third electrostatic deposition apparatus 206c to dispense the undoped semiconductor precursor 203c, as depicted in FIG. 1A.

The first additive process 202a, the second additive process 202b, and the third additive process 202c may dispense the n-type semiconductor precursor 203a, the p-type semiconductor precursor 203b, and the undoped semiconductor precursor 203c to form a sublayer of uniform thickness across the microelectronic device 200. A sublayer of uniform thickness may advantageously facilitate forming a semiconductor sublayer of uniform thickness during a subsequent anneal process. Dispensing the doped precursor material with the undoped precursor material may reduce the number of separate additive process dispensers used to form the microelectronic device 200, thus reducing equipment costs associated with fabrication of the microelectronic device 200.

In another version of this example, n-type regions and p-type regions of the substrate 205, may be formed using precursor materials with desired dopant levels, eliminating a need for mixing doped precursor material with undoped precursor material. Dispensing the precursor materials with the desired dopant levels may improve uniformity of dopants in the n-type regions and p-type regions, advantageously improving performance of the microelectronic device 200.

Figure 2B:
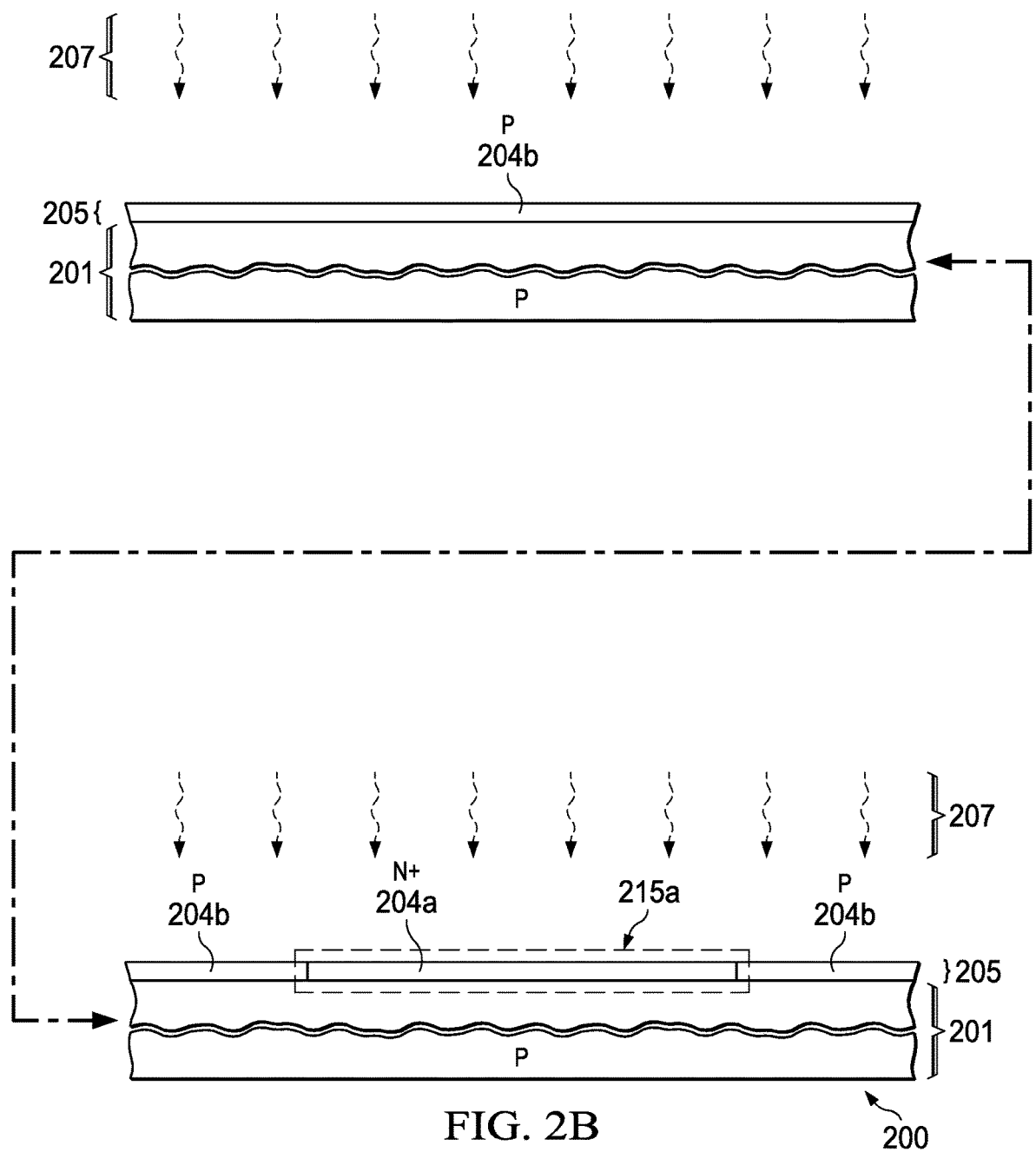

Referring to FIG. 2B, a blanket heating process 207 converts the n-type semiconductor precursor 203a of FIG. 2A, and the undoped semiconductor precursor 203c of FIG. 2A, if mixed with the n-type semiconductor precursor 203a, into an n-type semiconductor material 204a. The blanket heating process 207 concurrently converts the p-type semiconductor precursor 203b of FIG. 2A and the undoped semiconductor precursor 203c into a p-type semiconductor material 204b. In one version of this example, the blanket heating process 207 may be implemented as a flash anneal, which heats the n-type semiconductor precursor 203a, the p-type semiconductor precursor 203b, and the undoped semiconductor precursor 203c for a time span of 1 microsecond to 1 second to a temperature which forms the n-type semiconductor material 204a and the p-type semiconductor material 203b. In another version, the blanket heating process 207 may be implemented as a spike anneal, which heats the n-type semiconductor precursor 203a, the p-type semiconductor precursor 203b, and the undoped semiconductor precursor 203c for a time span of 1 second to 10 seconds. Alternatively, the blanket heating process 207 may be implemented as a scanned anneal process which heats areas of the n-type semiconductor precursor 203a, the p-type semiconductor precursor 203b, and the undoped semiconductor precursor 203c, and is scanned across the microelectronic device 200. The n-type semiconductor material 204a and the p-type semiconductor material 204b have the same crystalline structure as the workpiece 201 in direct contact with the n-type semiconductor material 204a and the p-type semiconductor material 204b, respectively.

Figure 2C:
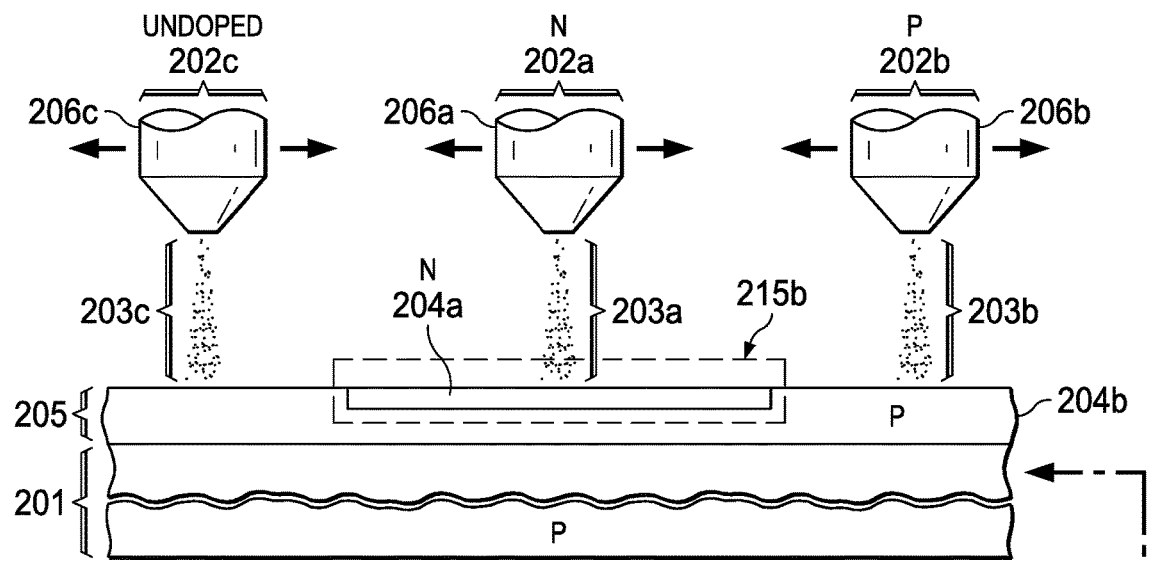
Figure 2C:
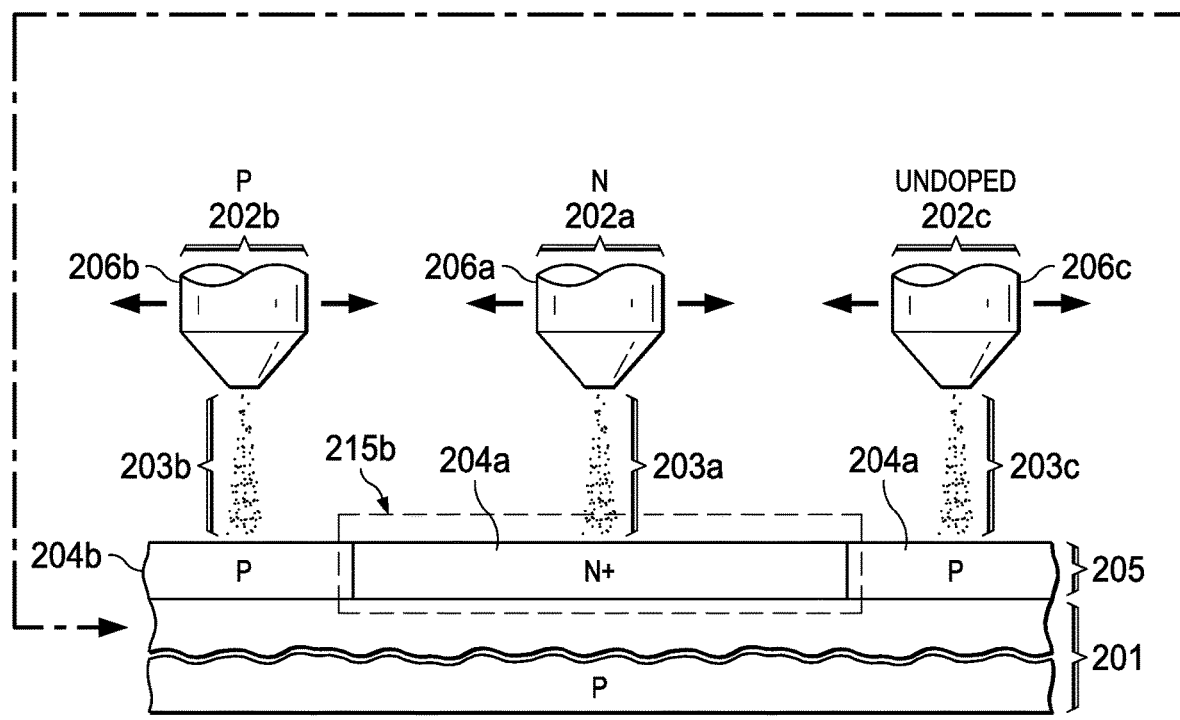

Referring to FIG. 2C, the first additive process 202a, the second additive process 202b, and the third additive process 202c are repeated to form additional sublayers of the n-type semiconductor precursor 203a, the p-type semiconductor precursor 203b, and the undoped semiconductor precursor 203c on the n-type semiconductor material 204a and the p-type semiconductor material 204b. After each sublayer of the n-type semiconductor precursor 203a, the p-type semiconductor precursor 203b, and the undoped semiconductor precursor 203c is formed, the blanket heating process 207 of FIG. 2B is performed to convert the n-type semiconductor precursor 203a, the p-type semiconductor precursor 203b, and the undoped semiconductor precursor 203c to additional sublayers of the n-type semiconductor material 204a and the p-type semiconductor material 204b. The additional sublayers of the n-type semiconductor material 204a and the p-type semiconductor material 204b have the same crystalline structure as the underlying n-type semiconductor material 204a and the p-type semiconductor material 204b.

The first additive process 202a dispenses the n-type semiconductor precursor 203a in an area for a second buried layer 215b that is separate from the first buried layer 215a. The second buried layer 215b of this example is located further from the workpiece 201 than the first buried layer 215a, with a region of the p-type semiconductor material 204b formed between the second buried layer 215b and the workpiece 201. An average dopant density of the second buried layer 215b may be different from an average dopant density of the first buried layer 215a. For example, the first buried layer 215a may be used to provide substrate current to a p-channel metal oxide semiconductor (PMOS) transistor, and so may have an average dopant density of $10^{19}$ cm$^{-3}$ to $10^{20}$ cm$^{-3}$ to reduce debiasing of a channel region of the PMOS transistor. The second buried layer 215b may be used to isolate a p-type well for an isolated n-channel metal oxide semiconductor (NMOS) transistor, and so may have an average dopant density of $10^{15}$ cm$^{-3}$ to $10^{17}$ cm$^{-3}$ to reduce leakage current between the second buried layer 215b and the surrounding p-type semiconductor material 204b.

Figure 2D:
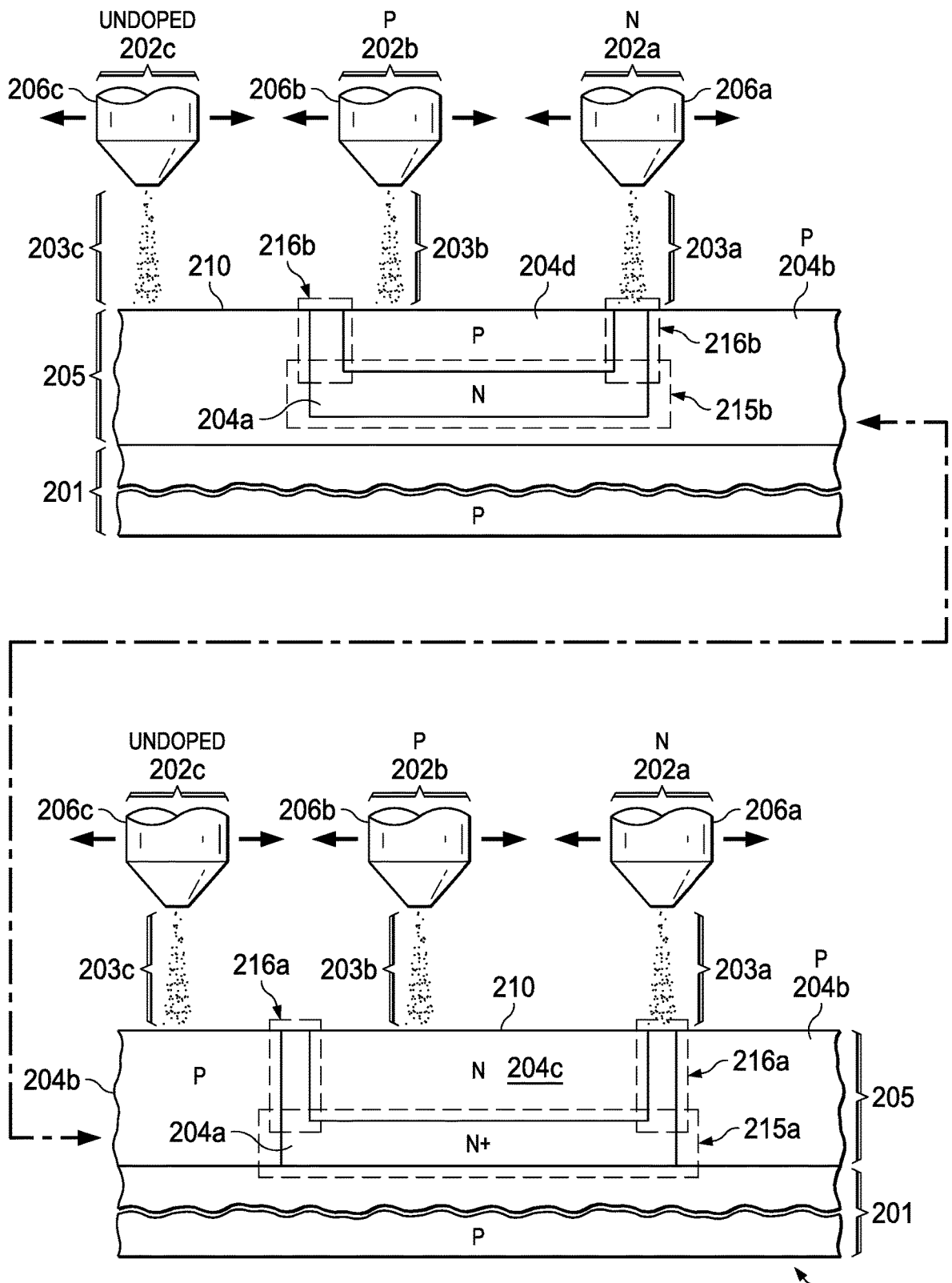

Referring to FIG. 2D, formation of the substrate 205 is continued with iterations of the first additive process 202a, the second additive process 202b, and the third additive process 202c, to form additional sublayers of the n-type semiconductor precursor 203a, the p-type semiconductor precursor 203b, and the undoped semiconductor precursor 203c, with formation of each sublayer followed by the blanket heating process 207 of FIG. 2B. The substrate 205 has a component surface 210 located opposite from the workpiece 201.

The second buried layer 215b is located closer to the component surface 210 than the first buried layer 215a. Forming the first buried layer 215a and the second buried layer 215b using the additive processes 202a, 202b, and 202c may reduce a fabrication cost of the microelectronic device 200 compared to forming the first buried layer 215a and the second buried layer 215b using planar processes, which involve separate implant, drive and epitaxial growth processes for each of the buried layers 215a and 215b. The component surface 210 may be flat across the buried layers 215a and 215b, as depicted in FIG. 2D, which may provide additional process margin for subsequent processes which are sensitive to surface topology, such as gate patterning. Forming the buried layers 215a and 215b by planar processes commonly produces recesses in the component surface 210 over the buried layers 215a and 215b, due to higher oxidation rates of the substrate 205 during thermal drives.

A thickness of the first buried layer 215a may be greater than a thickness of the second buried layer 215b, to provide desired functionalities for the first buried layer 215a and the second buried layer 215b. Dopant distributions in the first buried layer 215a and the second buried layer 215b may be adjusted to provide desired leakage currents and breakdown voltages during operation of the microelectronic device 200. For example, dopant densities adjacent to the p-type material 204b may be significantly lower than the average dopant densities in the buried layers 215a and 215b and may have dopant profiles which are difficult or costly to attain using planar processes.

The substrate 205 is formed with first n-type sinkers 216a extending from the component surface 210 of the substrate 205 to a lateral perimeter of the first buried layer 215a. The first n-type sinkers 216a may have an average dopant density similar to the first buried layer 215a, and may have a width less than 1 micron, advantageously reducing an area of the microelectronic device 200. Forming the first n-type sinkers 216a with the first additive process 202a may enable having the width less than 1 micron, in view of the low temperature used to form the substrate 205, which is difficult to attain using planar processes.

The substrate 205 is formed with second n-type sinkers 216b extending from the component surface 210 of the substrate 205 to a lateral perimeter of the second buried layer 215b. The second n-type sinkers 216b may have a width less than 1 micron, accruing the advantage disclosed in reference to the first n-type sinkers 216a.

An n-type well 204c is formed over the first buried layer 215a, inside the first n-type sinkers 216a. The n-type well 204c may be formed by the first additive process 202a, and optionally in combination with the third additive process 202c, to have a dopant distribution to support an extended drain PMOS transistor. A p-type well 204d is formed over the second buried layer 215b, inside the second n-type sinkers 216b. The p-type well 204d may be formed by the second additive process 202b, and optionally in combination with the third additive process 202c, to have a dopant distribution to support an NMOS transistor. The p-type well 204d is electrically isolated from the p-type semiconductor material 204b surrounding the second buried layer 215b by a combination of the second buried layer 215b and the second n-type sinkers 216b.

Figure 2E:
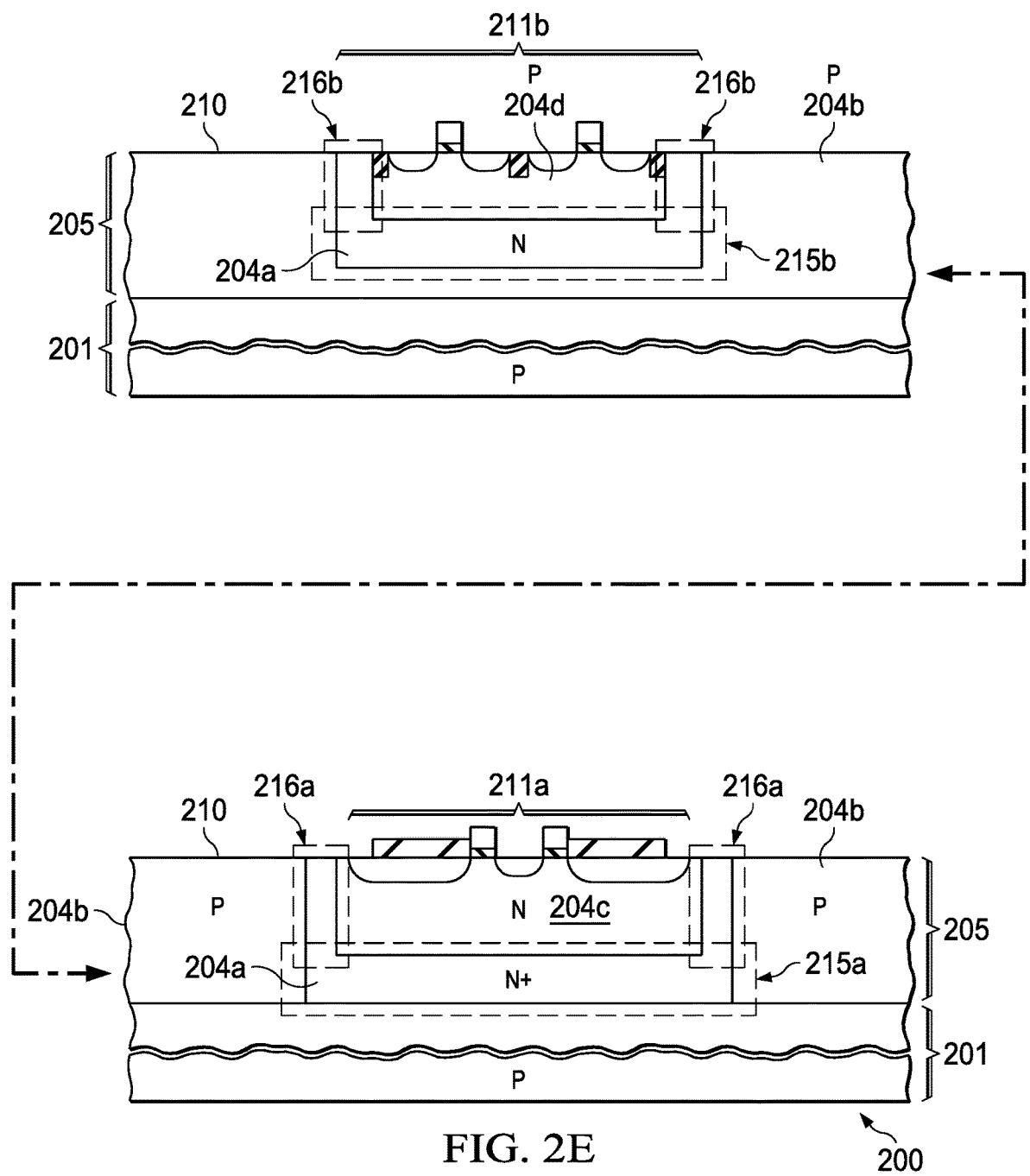

Referring to FIG. 2E, an extended drain PMOS transistor 211a is formed on the n-type well 204c. The n-type well 204c may be formed to have a lower dopant density under extended drains of the extended drain PMOS transistor 211a and a higher dopant density under a channel region of the extended drain PMOS transistor 211a, which may advantageously provide a desired operating voltage and threshold for the extended drain PMOS transistor 211a in a smaller area than could be attained by having uniform dopant density in the n-type well 204c. Forming the lower dopant density under the extended drains and the higher dopant density under the channel region using planar processes may require mask and implant steps, undesirably adding to fabrication costs. The first buried layer 215a and the first n-type sinkers 216a may provide a low resistance connection to the n-type well 204c under the channel region.

Isolated NMOS transistors 211b are formed on the p-type well 204d. The average dopant density and dopant distribution of the second buried layer 215b and the second n-type sinkers 216b may be selected to enable the isolated NMOS transistors 211b to operate at a desired voltage with a desired leakage current to the p-type semiconductor material 204b surrounding the second buried layer 215b. The dopant distribution of the second buried layer 215b and the second n-type sinkers 216b may have a spatial distribution that is impractical to attain using ion implant and anneal processes, such as a linearly increasing dopant density.

Figure 3A:
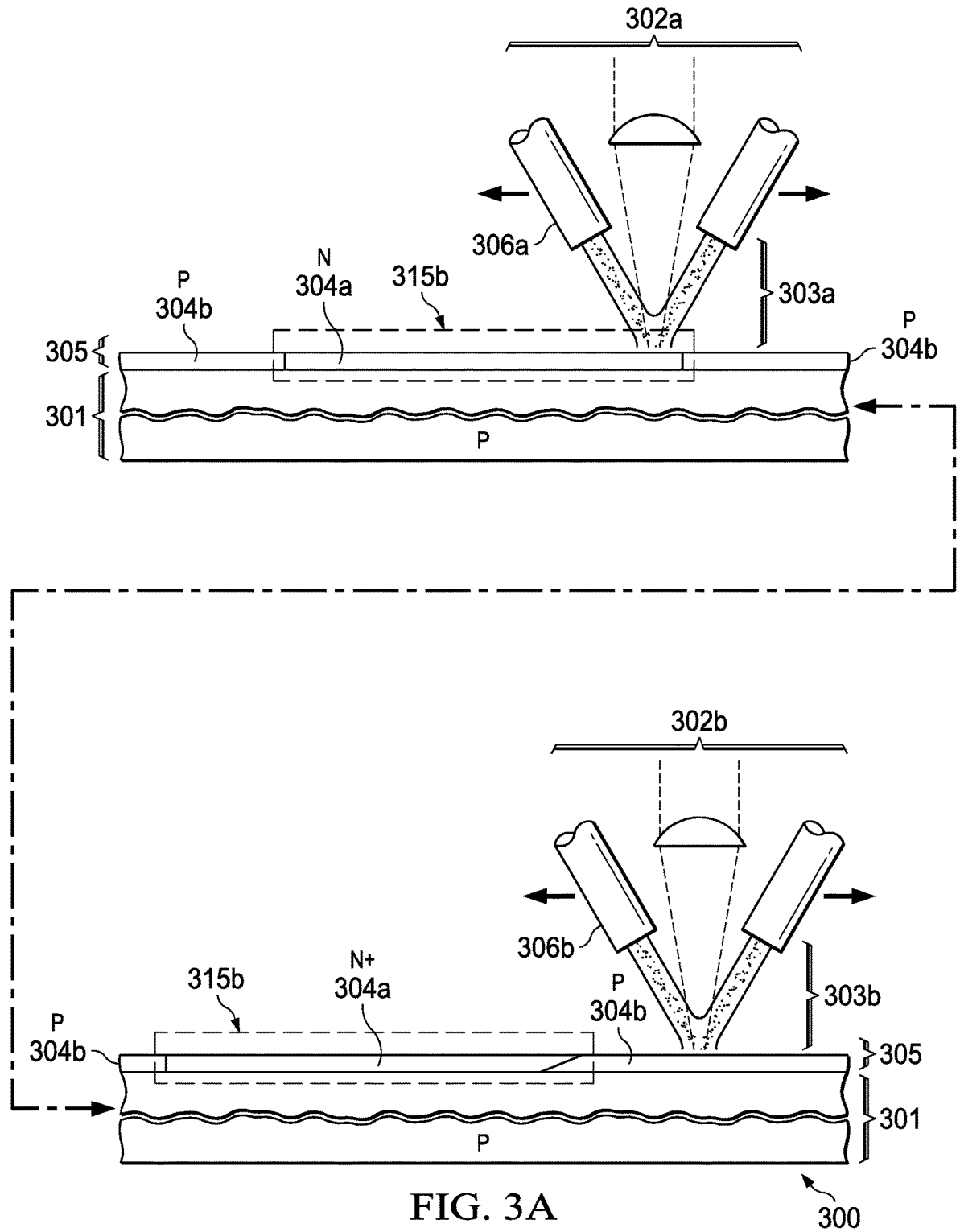
FIG. 3A through FIG. 3C are cross sections of a microelectronic device depicted in stages of a further example method of formation.
Figure 3B:
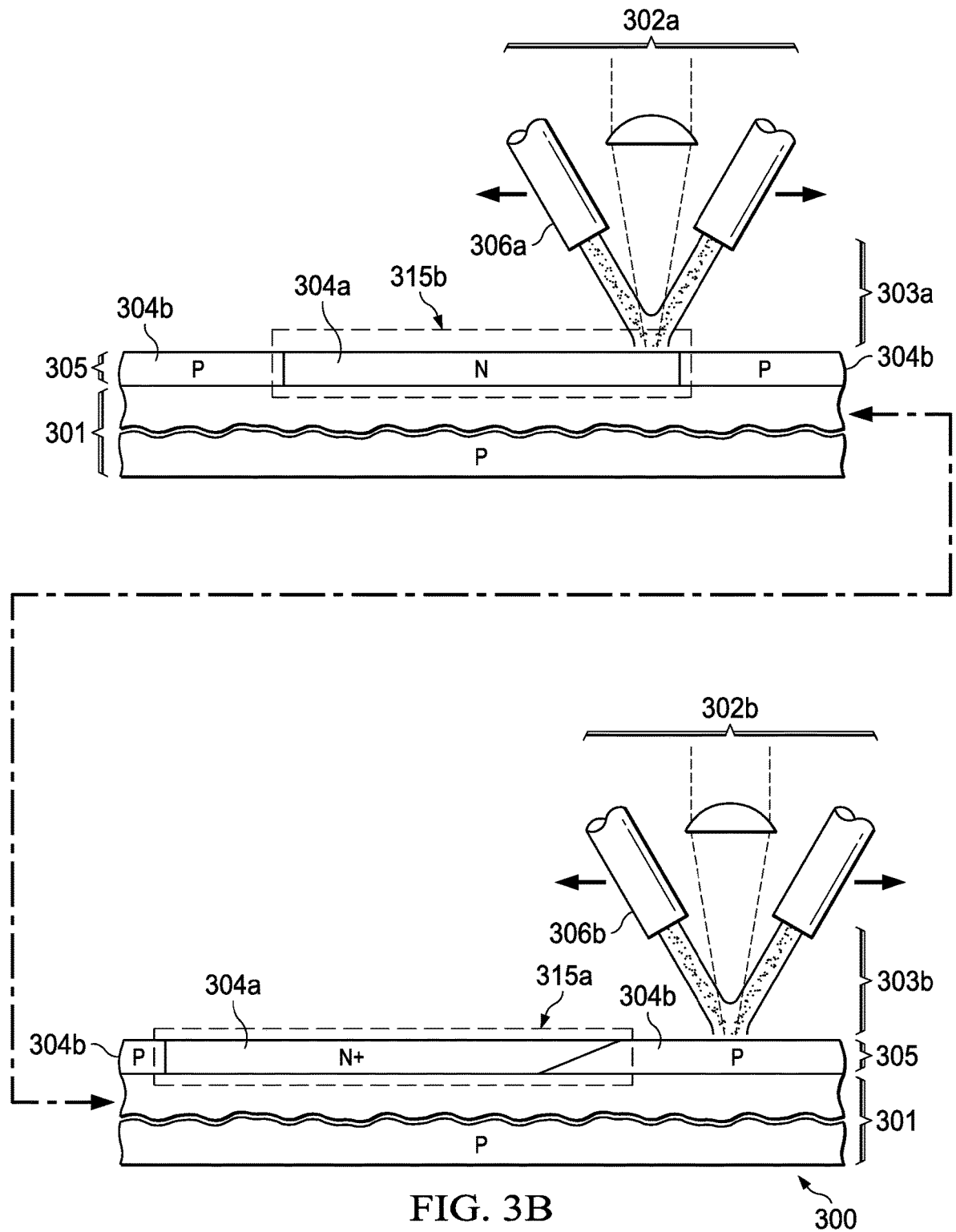
Figure 3C:
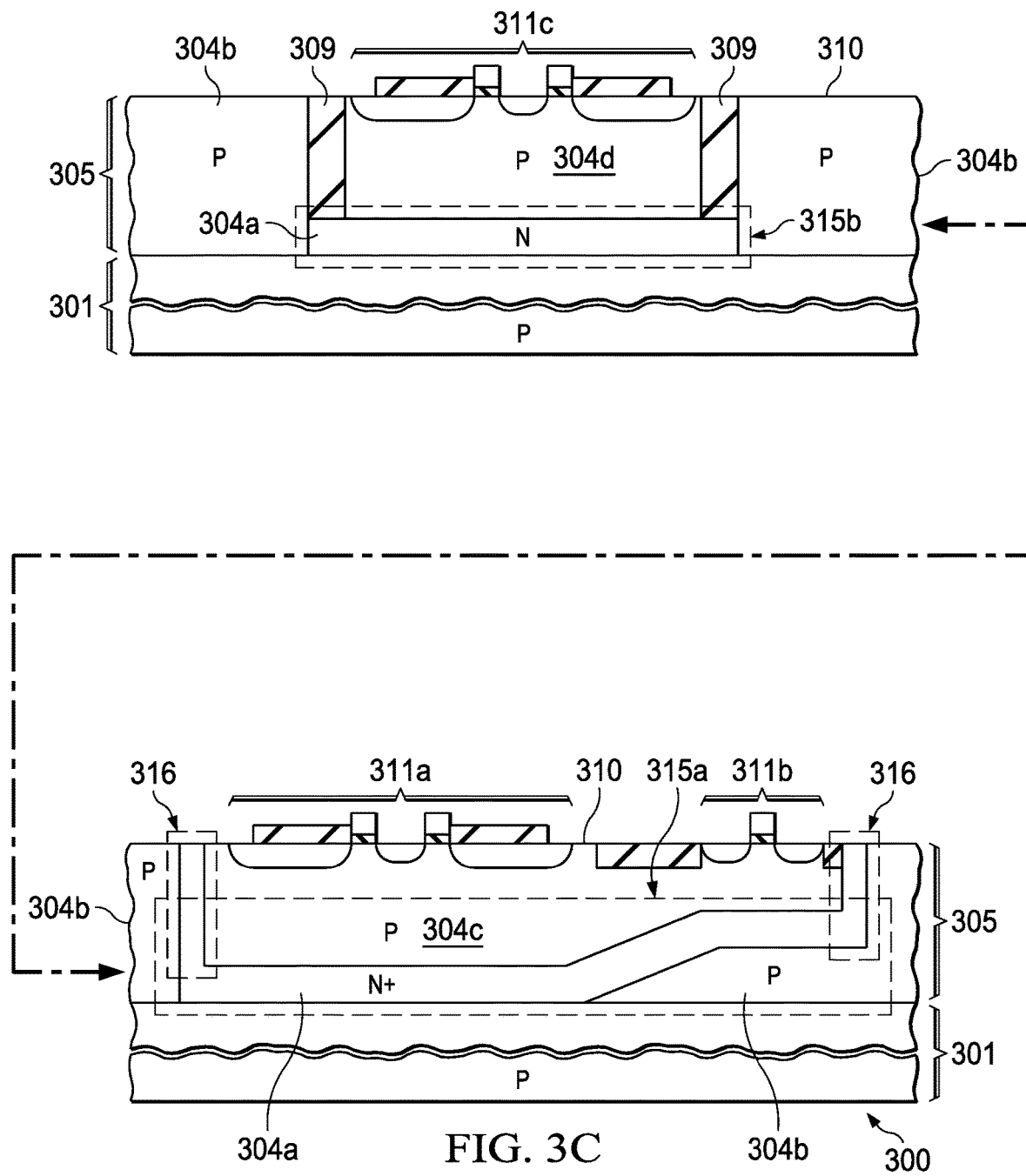

FIG. 3A through FIG. 3C are cross sections of a microelectronic device depicted in stages of a further example method of formation. Referring to FIG. 3A, the microelectronic device 300 is formed on a workpiece 301, which has a crystalline structure. The workpiece 301 may be implemented as a semiconductor wafer, such as a p-type silicon wafer. A first additive process 302a dispenses an n-type semiconductor precursor 303a onto the workpiece 301 in an area for a first buried layer 315a of a substrate 305 of the microelectronic device 300, and in an area for a second buried layer 315b of the substrate 305. A second additive process 302b dispenses a p-type semiconductor precursor 303b onto the workpiece 301 in areas of the substrate 305 outside of the area for the first buried layer 315a and outside of the area for the second buried layer 315b. A third additive process, not shown in FIG. 3A, may optionally dispense undoped semiconductor precursor onto the workpiece 301, mixing with the n-type semiconductor precursor 303a or with the p-type semiconductor precursor 303b to provide desired dopant densities. An average dopant density of the first buried layer 315a may be different from an average dopant density of the second buried layer 315b, which may be costly to attain using masked ion implant and anneal processes.

The n-type semiconductor precursor 303a may include any of the materials disclosed in reference to the n-type semiconductor precursor 103a of FIG. 1A. Similarly, the p-type semiconductor precursor 303b may include any of the materials disclosed in reference to the p-type semiconductor precursor 103b of FIG. 1A. The undoped semiconductor precursor may include any of the materials in the n-type semiconductor precursor 303a or the p-type semiconductor precursor 303b, except for the dopant materials. The first additive process 302a, the second additive process 302b, and the third additive process, if used, may be implemented as similar additive processes, for example, directed energy deposition processes, using a first directed energy deposition apparatus 306a which dispenses the n-type semiconductor precursor 303a in a shield gas and having a focused laser beam which heats the n-type semiconductor precursor 303a, a second directed energy deposition apparatus 306b to dispense the p-type semiconductor precursor 303b, as depicted in FIG. 1A, and a third directed energy deposition apparatus, not shown in FIG. 3A, to dispense the undoped semiconductor precursor. After the n-type semiconductor precursor 303a and the p-type semiconductor precursor 303b, and the undoped semiconductor precursor, if implemented, are dispensed onto the workpiece 301 to form a sublayer of the precursors 303a and 303b and the undoped semiconductor precursor, the sublayer is heated to convert the n-type semiconductor precursor 303a to an n-type semiconductor material 304a and convert the p-type semiconductor precursor 303b to a p-type semiconductor material 304b. The sublayer may be heated by a localized heating process, as disclosed in reference to FIG. 1A and FIG. 1B, or may be heated by a blanket heating process, as disclosed in reference to FIG. 2B, for example.

Referring to FIG. 3B, the first additive process 302a, the second additive process 302b, and optionally the third additive process are repeated to form additional sublayers of the n-type semiconductor precursor 303a, the p-type semiconductor precursor 303b, and optionally the undoped semiconductor precursor, on the n-type semiconductor material 304a and the p-type semiconductor material 304b. After each sublayer of the n-type semiconductor precursor 303a, the p-type semiconductor precursor 303b, and the undoped semiconductor precursor is formed, the sublayer is heated to convert the n-type semiconductor precursor 303a, the p-type semiconductor precursor 303b, and the undoped semiconductor precursor to additional sublayers of the n-type semiconductor material 304a and the p-type semiconductor material 304b. The additional sublayers of the n-type semiconductor material 304a and the p-type semiconductor material 304b have the same crystalline structure as the underlying n-type semiconductor material 304a and the p-type semiconductor material 304b.

Referring to FIG. 3C, formation of the substrate 305 is continued with iterations of the first additive process 302a, and the second additive process 302b, and optionally the third additive process, of FIG. 3B, which are repeated to form additional sublayers of the n-type semiconductor precursor 303a, the p-type semiconductor precursor 303b, and the undoped semiconductor precursor, of FIG. 3B. Formation of each sublayer is followed by a heating process, to convert the n-type semiconductor precursor 303a, the p-type semiconductor precursor 303b, and the undoped semiconductor precursor to the n-type semiconductor material 304a and the p-type semiconductor material 304b, respectively. The substrate 305 has a component surface 310 located opposite from the workpiece 301.

In this example, the first buried layer 315a has a sloped portion connecting a first portion of the first buried layer 315a at a first depth from the component surface 310 to a second portion of the first buried layer 315a at a second, more shallow, depth from the component surface 310. Forming the first buried layer 315a having the varying depth may be difficult and costly to attain using photolithographic, ion implant and anneal processes.

The second buried layer 315b may have a different average dopant density than the first buried layer 315a. Forming the first buried layer 315a and the second buried layer 315b using the additive processes 302a and 302b may reduce a fabrication cost of the microelectronic device 300 compared to forming the first buried layer 315a and the second buried layer 315b using planar processes.

The substrate 305 of this example is formed with n-type sinkers 316 extending from the component surface 310 of the substrate 305 to a lateral perimeter of the first buried layer 315a. The n-type sinkers 316 may have an average dopant density above $10^{18}$ cm$^{-3}$, and may have a width less than 1 micron, advantageously reducing an area of the microelectronic device 300, which may be difficult to attain using planar processes. The n-type sinkers 316 may have varying depths, conforming to the varying depth of the first buried layer 315a, which also may be difficult to attain using planar processes.

The substrate 305 is formed with isolation structures 309 extending from the component surface 310 of the substrate 305 to a lateral perimeter of the second buried layer 315b. The isolation structures 309 may be formed by an additive process as disclosed in reference to the isolation structures 109 of FIG. 1A through FIG. 1G, and may have a ratio of depth to width greater than 10, advantageously reducing an area of the microelectronic device 300. Forming the isolation structures 309 with the ratio of depth to width greater than 10 may be difficult or costly to attain using planar processes.

A first p-type well 304c is formed over the first buried layer 315a, inside the n-type sinkers 316. The first p-type well 304c may be formed by the first additive process 302a, and optionally in combination with the third additive process. The first p-type well 304c may be formed to have a first average dopant density over the first, deeper, portion of the first buried layer 315a, and a second, higher, average dopant density over the second, shallower, portion of the first buried layer 315a, which may advantageously be attained without additional fabrication cost or complexity using the first additive process 302a, and optionally in combination with the third additive process, but may be attained with additional cost and complexity using planar processes.

A second p-type well 304d is formed over the second buried layer 315b, inside the isolation structures 309. The second p-type well 304d may be formed by the second additive process 302b, and optionally in combination with the third additive process 302c, to have a variable dopant distribution. The second p-type well 304d is electrically isolated from the p-type semiconductor material 304b surrounding the second buried layer 315b by a combination of the second buried layer 315b and the isolation structures 309.

An extended drain NMOS transistor 311a is formed on the first p-type well 304c over the first, deeper, portion of the first buried layer 315a. The first p-type well 304c may be formed to have a lower dopant density under extended drains of the extended drain NMOS transistor 311a and a higher dopant density under a channel region of the extended drain NMOS transistor 311a, which may provide the advantages disclosed in reference to the n-type well 204c of FIG. 2E. Forming the first buried layer 315a to be deeper under the extended drain NMOS transistor 311a may enable operating the extended drain NMOS transistor 311a at a desired drain voltage without excess leakage current.

A first isolated NMOS transistor 311b is also formed on the first p-type well 304c, over the second, shallower, portion of the first buried layer 315a. The first isolated NMOS transistor 311b may be electrically coupled to the extended drain NMOS transistor 311a, for example to modulate a gate bias of the extended drain NMOS transistor 311a. The first p-type well 304c may be formed to have a higher dopant density under the first isolated NMOS transistor 311b, providing a desired threshold voltage for the first isolated NMOS transistor 311b that is different from a threshold of the extended drain NMOS transistor 311a. Forming the first buried layer 315a to be closer to the first isolated NMOS transistor 311b may reduce a drain-substrate capacitance of the first isolated NMOS transistor 311b, enabling the first isolated NMOS transistor 311b to operate at higher speed than would be possible if the first buried layer 315a had a uniform depth.

A second isolated NMOS transistor 311c is formed on the second p-type well 304d. The average dopant density and dopant distribution of the second buried layer 315b may be selected to enable the isolated NMOS transistors 311b to operate at a desired voltage with a desired leakage current to the p-type semiconductor material 304b under the second buried layer 315b. The dopant distribution of the second buried layer 315b and the n-type sinkers 316 may have a spatial distribution that is impractical to attain using ion implant and anneal processes, such as a linearly increasing dopant density. Isolating the second isolated NMOS transistor 311c with the isolation structures 309 may enable locating the second isolated NMOS transistor 311c closer to the isolation structures 309 than to n-type semiconductor isolation elements, such as sinkers, thereby advantageously reducing an area of the microelectronic device 300.

Figure 4A:
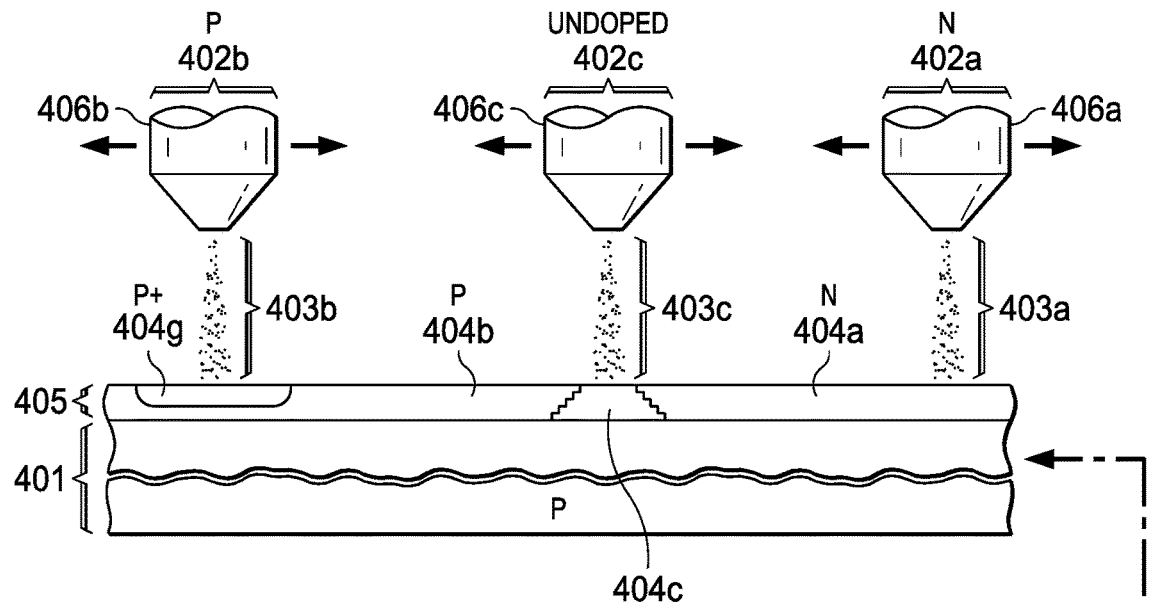
FIG. 4A through FIG. 4D are cross sections of a microelectronic device depicted in stages of another example method of formation.
Figure 4A:
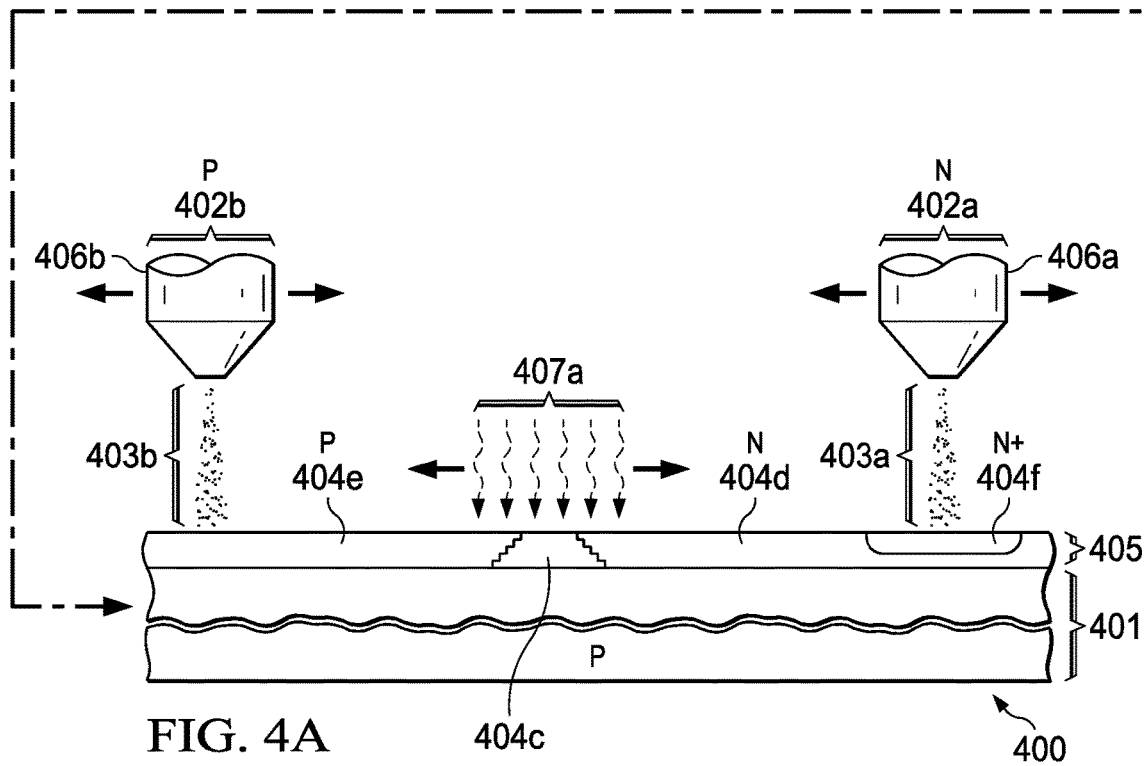

FIG. 4A through FIG. 4D are cross sections of a microelectronic device depicted in stages of another example method of formation. Referring to FIG. 4A, the microelectronic device 400 is formed on a workpiece 401, which has a crystalline structure. The workpiece 401 may be implemented as a semiconductor wafer, or a substrate with a crystalline layer extending to the top surface, such as a silicon on insulator (SOI) wafer. A first additive process 402a dispenses an n-type semiconductor precursor 403a onto the workpiece 401 in an area for a first n-type well 404a of a substrate 405 of the microelectronic device 400, and in an area for a second n-type well 404d of the substrate 405. A second additive process 402b dispenses a p-type semiconductor precursor 403b onto the workpiece 401 in an area for a first p-type well 404b, and in an area for a second p-type well 404e. An optional third additive process 402c may dispense undoped semiconductor precursor 403c onto the workpiece 401, mixing with the n-type semiconductor precursor 403a or with the p-type semiconductor precursor 403b to provide desired dopant densities. The first additive process 402a, the second additive process 402b, and the third additive process 402c may be implemented as electrostatic deposition processes using a first electrostatic deposition apparatus 406a, a second electrostatic deposition apparatus 406b, and a third electrostatic deposition apparatus 406c, respectively, as depicted in FIG. 4A. The first additive process 402a, the second additive process 402b, and the third additive process 402c may dispense the n-type semiconductor precursor 403a, the p-type semiconductor precursor 403b, and the undoped semiconductor precursor 403c, as needed, in areas between the wells 404a, 404b, 404d, and 404e, for a semiconductor material 404c. The n-type semiconductor precursor 403a, the p-type semiconductor precursor 403b, and the undoped semiconductor precursor 403c are dispensed to form sublayers on the workpiece 401, and are subsequently heated by a first heating process 407a, which may be implemented as a scanned, localized heating process, to form the wells 404a, 404b, 404d, and 404e, and the semiconductor material 404c between the wells 404a, 404b, 404d, and 404e. An average dopant density of the first n-type well 404a may be different from an average dopant density of the second n-type well 404d. Similarly, an average dopant density of the first p-type well 404b may be different from an average dopant density of the second p-type well 404e. Having multiple wells with different dopant densities may be more costly to attain using ion implant and anneal processes, compared to the first additive process 402a, the second additive process 402b, and the third additive process 402c.

The first additive process 402a dispenses the n-type semiconductor precursor 403a onto the substrate 405 in an area for an n-type latch-up shunt region 404f in the first n-type well 404a. The n-type latch-up shunt region 404f is formed with an average dopant density higher than an average dopant density of the first n-type well 404a, for example, 5 times to 20 times higher. The second additive process 402b dispenses the p-type semiconductor precursor 403b onto the substrate 405 in an area for a p-type latch-up shunt region 404g in the second n-type well 404e. The p-type latch-up shunt region 404g is formed with an average dopant density higher than an average dopant density of the second n-type well 404e, for example, 5 times to 20 times higher. The n-type latch-up shunt region 404f and the p-type latch-up shunt region 404g are formed concurrently with the surrounding first n-type well 404a and second n-type well 404e, respectively.

Figure 4B:
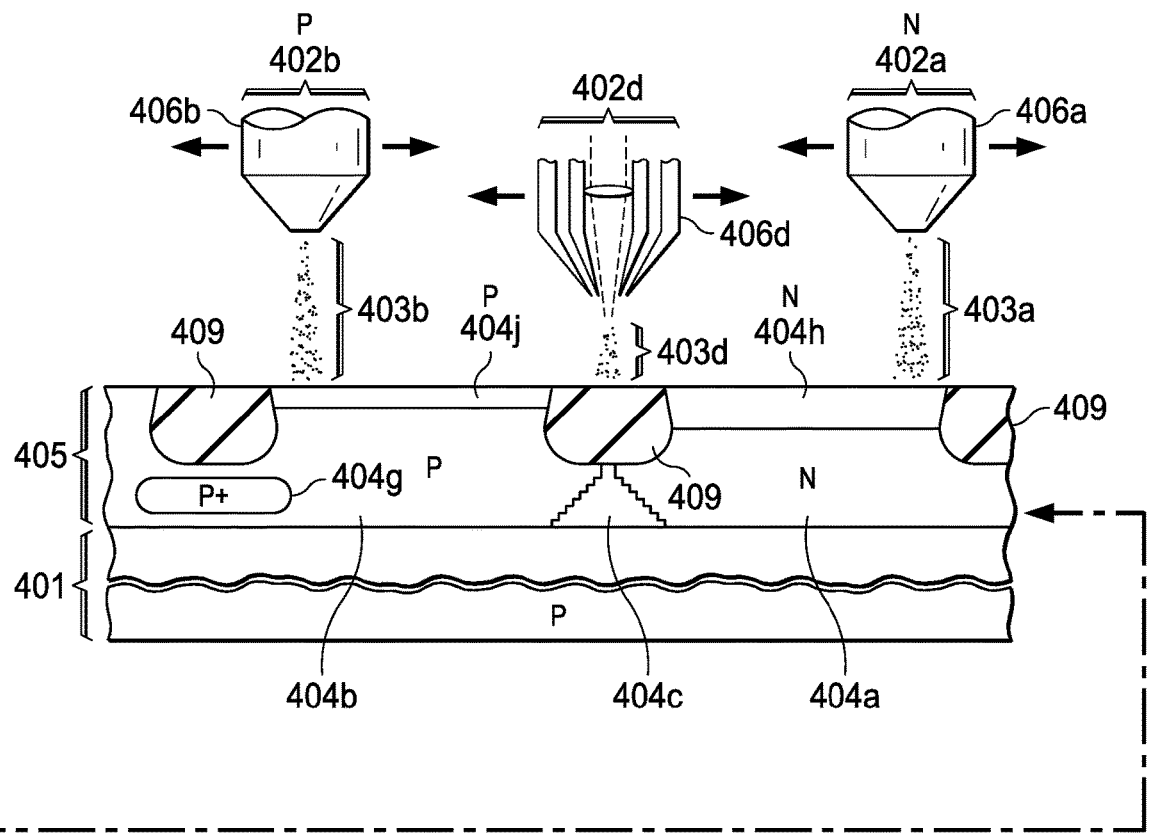
Figure 4B:
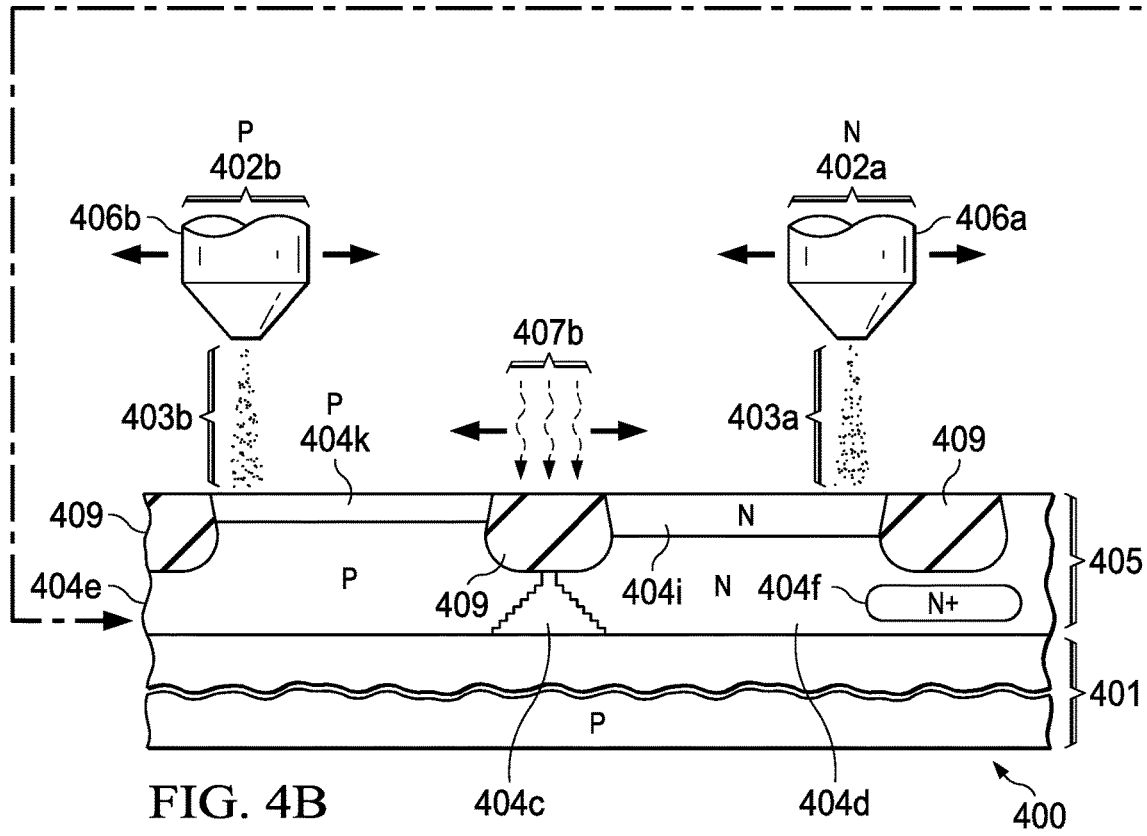

Referring to FIG. 4B, the first additive process 402a, the second additive process 402b, and optionally the third additive process 402c of FIG. 4A, are repeated to form additional sublayers of the n-type semiconductor precursor 403a, the p-type semiconductor precursor 403b, and the optionally undoped semiconductor precursor 403c of FIG. 4A, on the substrate 405. After each sublayer of the n-type semiconductor precursor 403a, the p-type semiconductor precursor 403b, and the undoped semiconductor precursor 403c, is formed, the sublayer is heated to convert the semiconductor precursors 403a, 403b, and 403c, to additional sublayers of the first n-type well 404a, the first p-type well 404b, the semiconductor material 404c, the second n-type well 404d, the second p-type well 404e, the n-type latch-up shunt region 404f, and the p-type latch-up shunt region 404g.

A fourth additive process 402d dispenses a dielectric precursor 403d onto the substrate 405 in areas for retrograde trench isolation structures 409. The fourth additive process 402d may be implemented as a directed energy process 402d using a directed energy apparatus 406d, as indicated in FIG. 4B, or may be implemented as another additive process. The dielectric precursor 403d may include, for example, MSQ, HSQ, or TEOS, silicon dioxide nanoparticles, or a combination thereof. Sublayers of the dielectric precursor 403d are heated by a second heating process 407b, which may be different from the first heating process 407a of FIG. 4A, to convert the dielectric precursor 403d into dielectric material such as silicon dioxide, of the retrograde trench isolation structures 409.

The first additive process 402a dispenses the n-type semiconductor precursor 403a onto the substrate 405 in an area for a first n-type punch-through layer 404h in the first n-type well 404a, and in an area for a second n-type punch-through layer 404i in the second n-type well 404d. The first n-type punch-through layer 404h has a higher average dopant density than the first n-type well 404a, and the second n-type punch-through layer 404i has a higher average dopant density than the second n-type well 404d. Moreover, the first n-type punch-through layer 404h may have an average dopant density different from the second n-type punch-through layer 404i. The second additive process 402b dispenses the p-type semiconductor precursor 403b onto the substrate 405 in an area for a first p-type punch-through layer 404j in the first p-type well 404b, and in an area for a second p-type punch-through layer 404k in the second p-type well 404e. The first p-type punch-through layer 404j has a higher average dopant density than the first p-type well 404b, and the second p-type punch-through layer 404k has a higher average dopant density than the second p-type well 404e. Moreover, the first p-type punch-through layer 404j may have an average dopant density different from the second p-type punch-through layer 404k. The n-type semiconductor precursor 403a is converted to the first n-type punch-through layer 404h and the second n-type punch-through layer 404i, and the p-type semiconductor precursor 403b is converted to the first p-type punch-through layer 404j and the second p-type punch-through layer 404k. The third additive process 402c of FIG. 4A may be used to add the undoped semiconductor precursor 403c of FIG. 4A, as needed, to attain desired dopant densities in the first n-type punch-through layer 404h, the second n-type punch-through layer 404i, the first p-type punch-through layer 404j and the second p-type punch-through layer 404k.

Figure 4C:
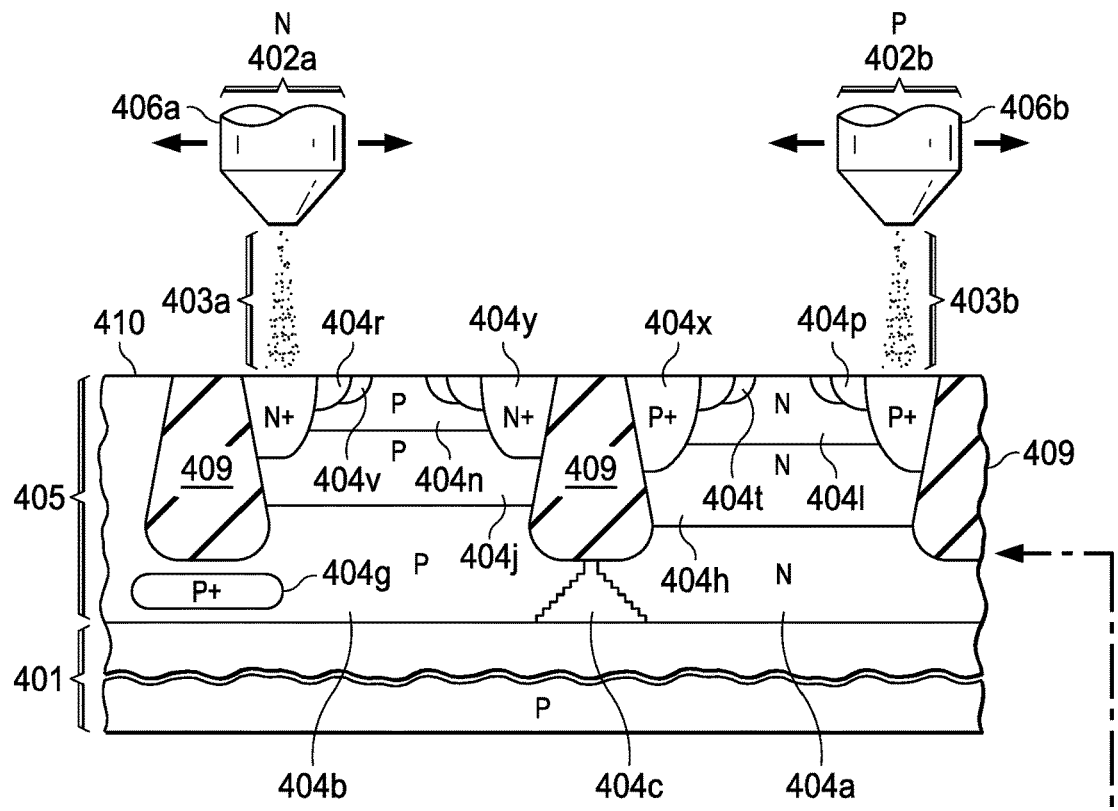
Figure 4C:
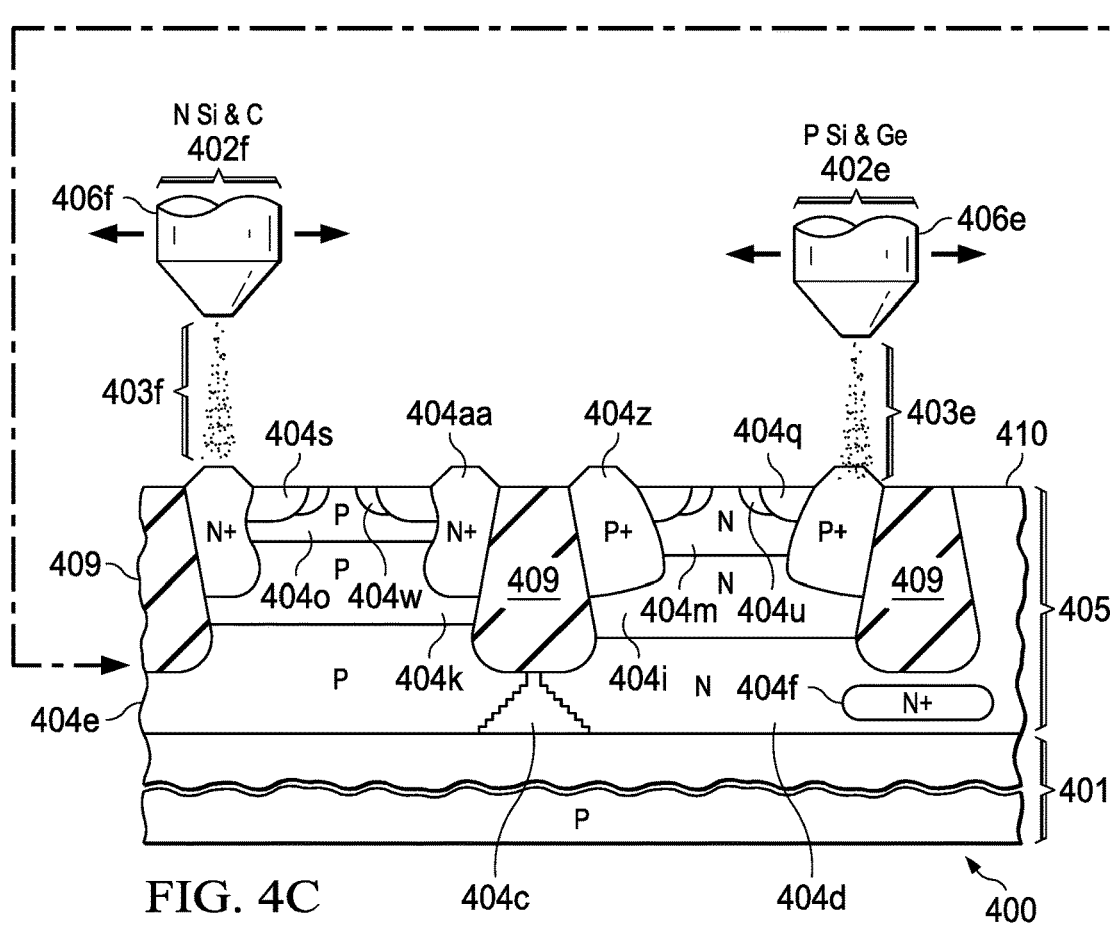

Referring to FIG. 4C, the first additive process 402a dispenses the n-type semiconductor precursor 403a onto the substrate 405 in an area for a first n-type threshold layer 404l over the first n-type punch-through layer 404h, and in an area for a second n-type threshold layer 404m over the second n-type punch-through layer 404i. The first n-type threshold layer 404l is formed to have a dopant density to provide a desired threshold voltage for a subsequently-formed first PMOS transistor 411a, shown in FIG. 4D, on the first n-type threshold layer 404l. Similarly, the second n-type threshold layer 404m is formed to have a dopant density to provide a desired threshold voltage for a subsequently-formed second PMOS transistor 411b, shown in FIG. 4D, on the second n-type threshold layer 404m. The dopant density of the first n-type threshold layer 404l may be different from the dopant density of the second n-type threshold layer 404m. The n-type semiconductor precursor 403a is converted to the first n-type threshold layer 404l and the second n-type threshold layer 404m. The third additive process 402c of FIG. 4A may be used to add the undoped semiconductor precursor 403c of FIG. 4A, as needed, to attain desired dopant densities in the first n-type threshold layer 404l and the second n-type threshold layer 404m.

Similarly, the second additive process 402b dispenses the p-type semiconductor precursor 403b onto the substrate 405 in an area for a first p-type threshold layer 404n over the first p-type punch-through layer 404j, and in an area for a second p-type threshold layer 404o over the second p-type punch-through layer 404k. The first p-type threshold layer 404n is formed to have a dopant density to provide a desired threshold voltage for a subsequently-formed first NMOS transistor 411c, shown in FIG. 4D, on the first p-type threshold layer 404n. Similarly, the second p-type threshold layer 404o is formed to have a dopant density to provide a desired threshold voltage for a subsequently-formed second NMOS transistor 411d, shown in FIG. 4D, on the second p-type threshold layer 404o. The dopant density of the first p-type threshold layer 404n may be different from the dopant density of the second p-type threshold layer 404o. The p-type semiconductor precursor 403b is converted to the first p-type threshold layer 404n and the second p-type threshold layer 404o. The third additive process 402c may be used to add the undoped semiconductor precursor 403c, as needed, to attain desired dopant densities in the first p-type threshold layer 404n and the second p-type threshold layer 404o.

Additional elements of the first PMOS transistor 411a, the second PMOS transistor 411b, the first NMOS transistor 411c, and the second NMOS transistor 411d are formed by dispensing the n-type semiconductor precursor 403a, the p-type semiconductor precursor 403b, and optionally the undoped semiconductor precursor 403c, onto the substrate 405 in sublayers, followed by heating, to convert the semiconductor precursors 403a, 403b, and 403c, into semiconductor material.

First p-type source/drain extensions 404p may be formed over the first n-type threshold layer 404l. Second p-type source/drain extensions 404q may be formed over the second n-type threshold layer 404m. First n-type source/drain extensions 404r may be formed over the first p-type threshold layer 404n. Second n-type source/drain extensions 404s may be formed over the second p-type threshold layer 404o. The first p-type source/drain extensions 404p, the second p-type source/drain extensions 404q, the first n-type source/ drain extensions 404r, and the second n-type source/drain extensions 404s may have different dopant densities from each other, and may have different spatial dimensions, to provide desired performance parameters, such as on-state currents and off-state currents, in the first PMOS transistor 411a, the second PMOS transistor 411b, the first NMOS transistor 411c, and the second NMOS transistor 411d, respectively.

First n-type halo regions 404t may be formed over the first n-type threshold layer 404l, adjacent to the first p-type source/drain extensions 404p. Second n-type halo regions 404u may be formed over the second n-type threshold layer 404m, adjacent to the second p-type source/drain extensions 404q. First p-type halo regions 404v may be formed over the first p-type threshold layer 404n, adjacent to the first n-type source/drain extensions 404r. Second p-type halo regions 404w may be formed over the second p-type threshold layer 404o, adjacent to the second n-type source/drain extensions 404s. The first n-type halo regions 404t, the second n-type halo regions 404u, the first p-type halo regions 404v, and the second p-type halo regions 404w may have different dopant densities from each other, and may have different spatial dimensions, to provide desired performance parameters, such as the on-state currents and the off-state currents, in the first PMOS transistor 411a, the second PMOS transistor 411b, the first NMOS transistor 411c, and the second NMOS transistor 411d, respectively.

First p-type source/drain regions 404x may be formed through the first n-type threshold layer 404l, adjacent to the first p-type source/drain extensions 404p. First n-type source/drain regions 404y may be formed through the first p-type threshold layer 404n, adjacent to the first n-type source/drain extensions 404r. The first p-type source/drain regions 404x and the first n-type source/drain regions 404y may be formed to have dopant distributions and spatial dimensions to provide desired performance parameters, such as the on-state currents and the off-state currents, in the first PMOS transistor 411a and the first NMOS transistor 411c respectively.

A fifth additive process 402e may dispense a compressive stress p-type semiconductor precursor 403e onto the substrate 405 in areas for compressive stress p-type source/drain regions 404z through the second n-type threshold layer 404m, adjacent to the second p-type source/drain extensions 404q. The compressive stress p-type semiconductor precursor 403e may include silicon and germanium precursors, for example, to impart compressive stress to a channel region of the second PMOS transistor 411b, which may provide a higher on-state current than can be attained with silicon source/drain regions. The fifth additive process 402e may form the compressive stress p-type source/drain regions 404z with shapes that enhance the compressive stress in the channel region of the second PMOS transistor 411b; planar processes are limited in the shapes of compressive stress p-type source/drain regions that can be formed. The compressive stress p-type source/drain regions 404z may produce a non-planar component surface 410, as depicted in FIG. 4C.

A sixth additive process 402f may dispense a tensile stress n-type semiconductor precursor 403f onto the substrate 405 in areas for tensile stress n-type source/drain regions 404aa through the second p-type threshold layer 404o, adjacent to the second n-type source/drain extensions 404s. The tensile stress n-type semiconductor precursor 403f may include silicon and carbon precursors, for example, to impart tensile stress to a channel region of the second NMOS transistor 411d, which may provide a higher on-state current than can be attained with silicon source/drain regions. The sixth additive process 402f may form the tensile stress n-type source/drain regions 404aa with shapes that enhance the tensile stress in the channel region of the second NMOS transistor 411d; planar processes are similarly limited in the shapes of tensile stress n-type source/drain regions that can be formed. The tensile stress n-type source/drain regions 404aa may also produce a non-planar component surface 410, as depicted in FIG. 4C.

The substrate 405 has a component surface 410 located opposite from the workpiece 401. The retrograde trench isolation structures 409 are narrower at the component surface 410 than at lower portions of the retrograde trench isolation structures 409, that is, deeper in the substrate 405. Having narrow lateral widths at the component surface 410 may advantageously reduce an area of the microelectronic device 400, while having lower portions that are wider may advantageously improve isolation between adjacent transistors in the microelectronic device 400. The retrograde trench isolation structures 409 may be formed by the fourth additive process 402d of FIG. 4B to have solid interior regions, free of voids, advantageously improving mechanical and electrical integrity and reliability of the microelectronic device 400. Forming isolation elements with the shapes and properties of the retrograde trench isolation structures 409 is difficult and costly using planar processes.

Figure 4D:
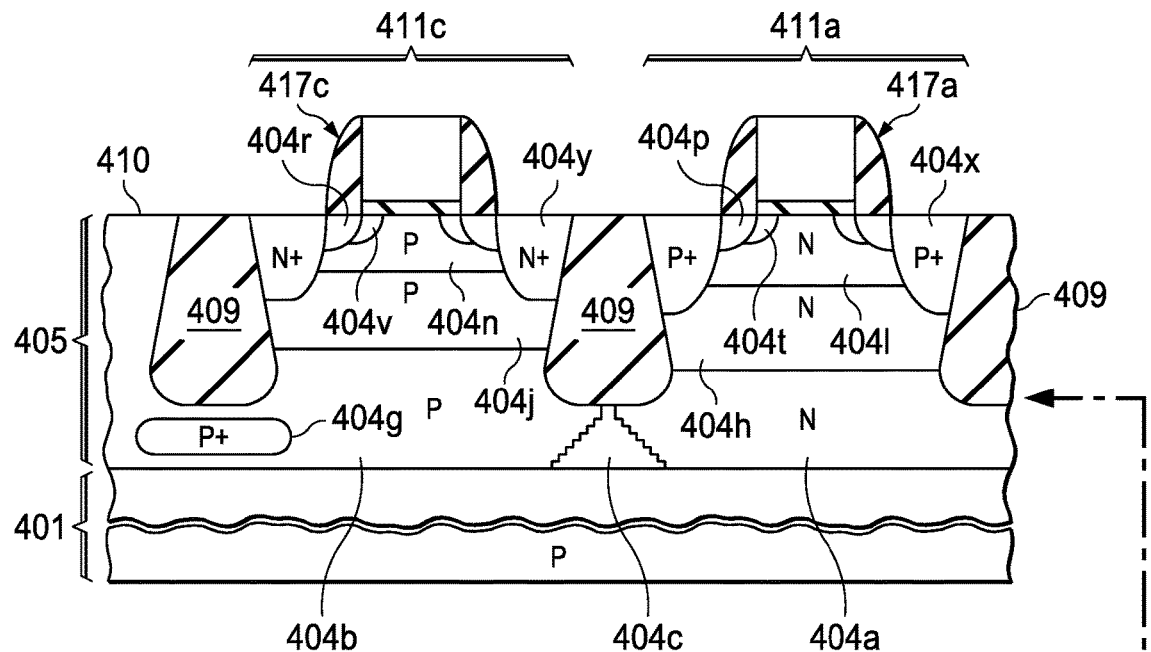
Figure 4D:
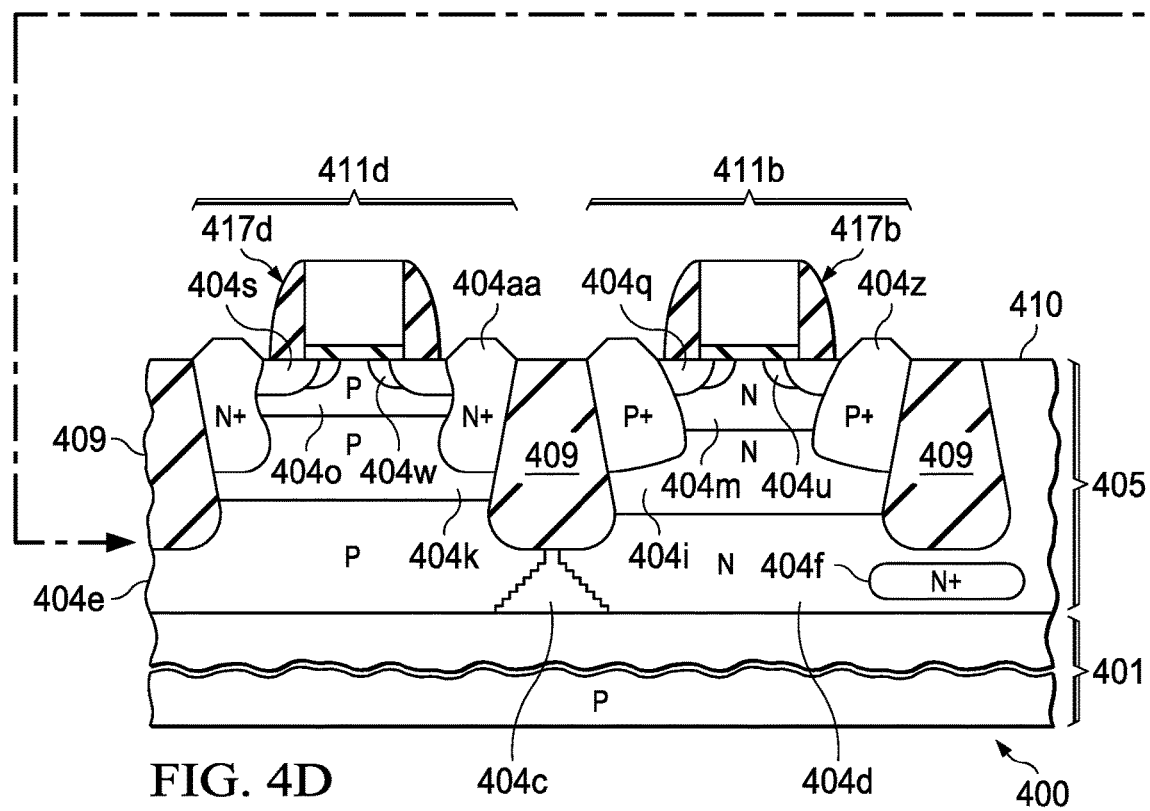

Referring to FIG. 4D, a first PMOS gate structure 417a is formed on the first n-type threshold layer 404l. The first PMOS gate structure 417a, combined with the first n-type punch-through layer 404h, the first n-type threshold layer 404l, the first n-type halo regions 404t, the first p-type source/drain extensions 404p, and the first p-type source/drain regions 404x, provides the first PMOS transistor 411a.

A second PMOS gate structure 417b is formed on the second n-type threshold layer 404m. The second PMOS gate structure 417b, combined with the second n-type punch-through layer 404i, the second n-type threshold layer 404m, the second n-type halo regions 404u, the second p-type source/drain extensions 404q, and the compressive stress p-type source/drain regions 404z, provides the second PMOS transistor 411b.

A first NMOS gate structure 417c is formed on the first p-type threshold layer 404n. The first NMOS gate structure 417c, combined with the first p-type punch-through layer 404j, the first p-type threshold layer 404n, the first p-type halo regions 404v, the first n-type source/drain extensions 404r, and the first n-type source/drain regions 404y, provides the first NMOS transistor 411c.

A second NMOS gate structure 417d is formed on the second p-type threshold layer 404o. The second NMOS gate structure 417d, combined with the second p-type punch-through layer 404k, the second p-type threshold layer 404o, the second p-type halo regions 404w, the second n-type source/drain extensions 404s, and the tensile stress n-type source/drain regions 404aa, provides the second NMOS transistor 411d.

The first PMOS gate structure 417a, the second PMOS gate structure 417b, the first NMOS gate structure 417c, or the second NMOS gate structure 417d may be formed by planar processes, by additive processes, or by a combination thereof.

The respective elements of the first PMOS transistor 411a, the second PMOS transistor 411b, the first NMOS transistor 411c, and the second NMOS transistor 411d, that is, the punch-through layers 404h, 404i, 404j, and 404k, the threshold layers 404l, 404m, 404n, and 404o, the halo regions 404t, 404u, 404v, and 404w, the source/drain extensions 404p, 404q, 404r, and 404s, and the source/drain regions 404x, 404z, 404y, and 404aa, may be formed by the additive processes 402a, 402b, and 402c to have different dopant distributions, to enhance the performance parameters, as noted. Forming the respective elements to have different dopant distributions may be efficiently accomplished using the additive processes 402a, 402b, and 402c by appropriate mixing of the semiconductor precursors 403a, 403b, and 403c. Forming the respective elements to have different dopant distributions using planar processes may be complex and costly, due to separate photolithography and ion implant steps needed.

Figure 5A:
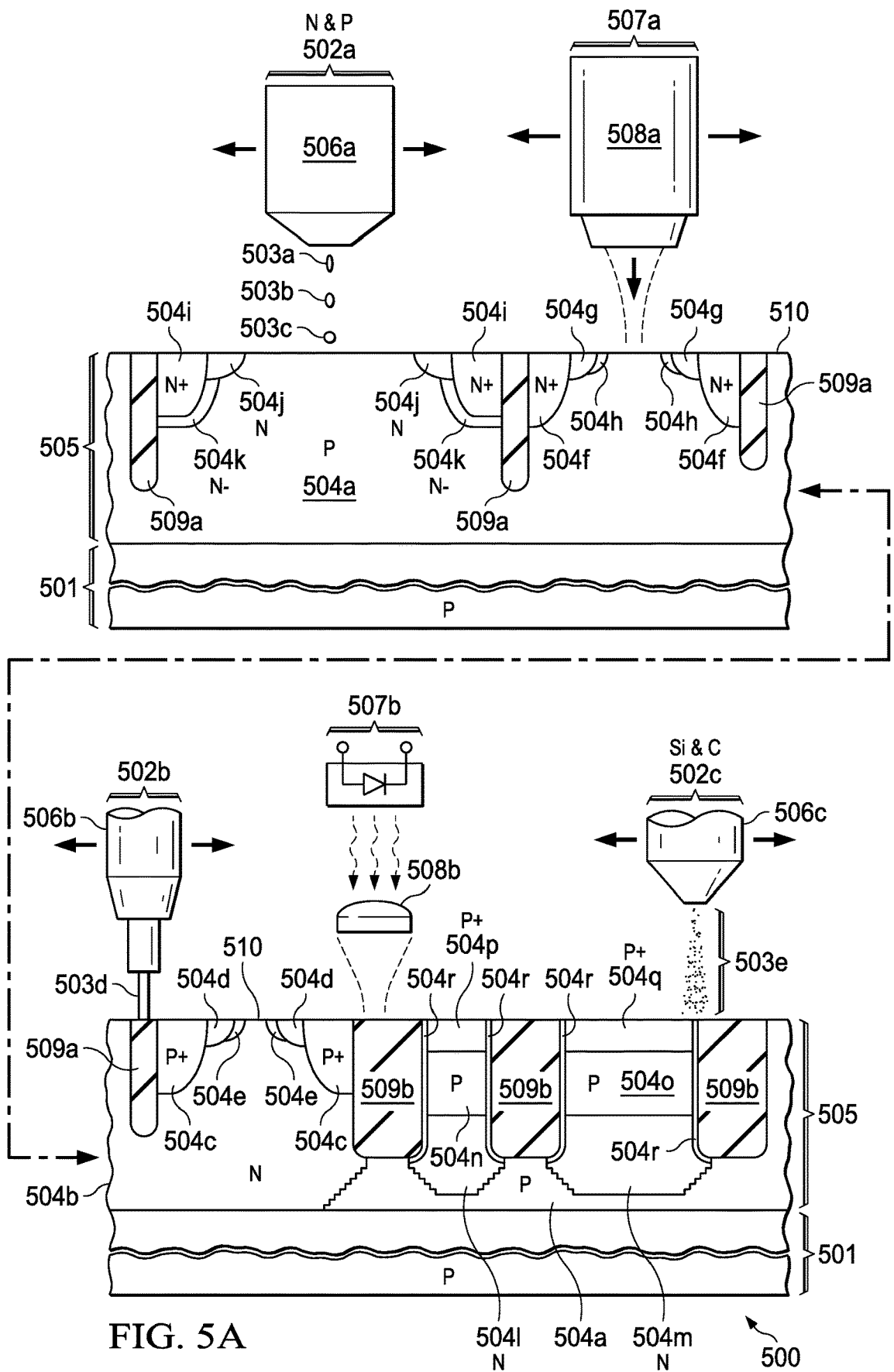
FIG. 5A and FIG. 5B are cross sections of a microelectronic device depicted in stages of a further example method of formation.
Figure 5B:
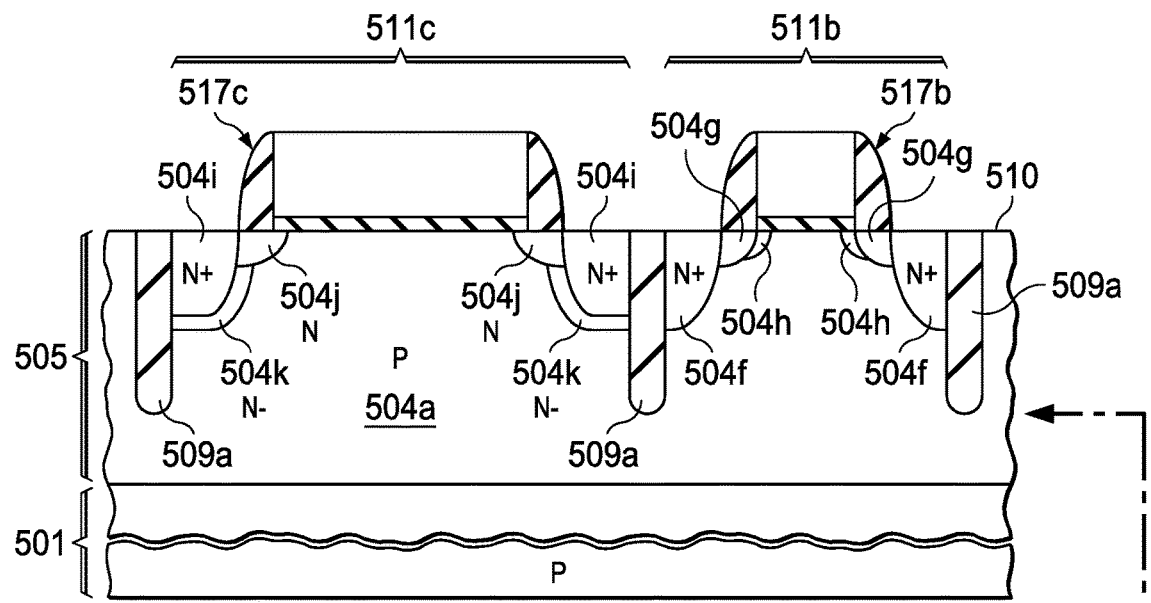
Figure 5B:
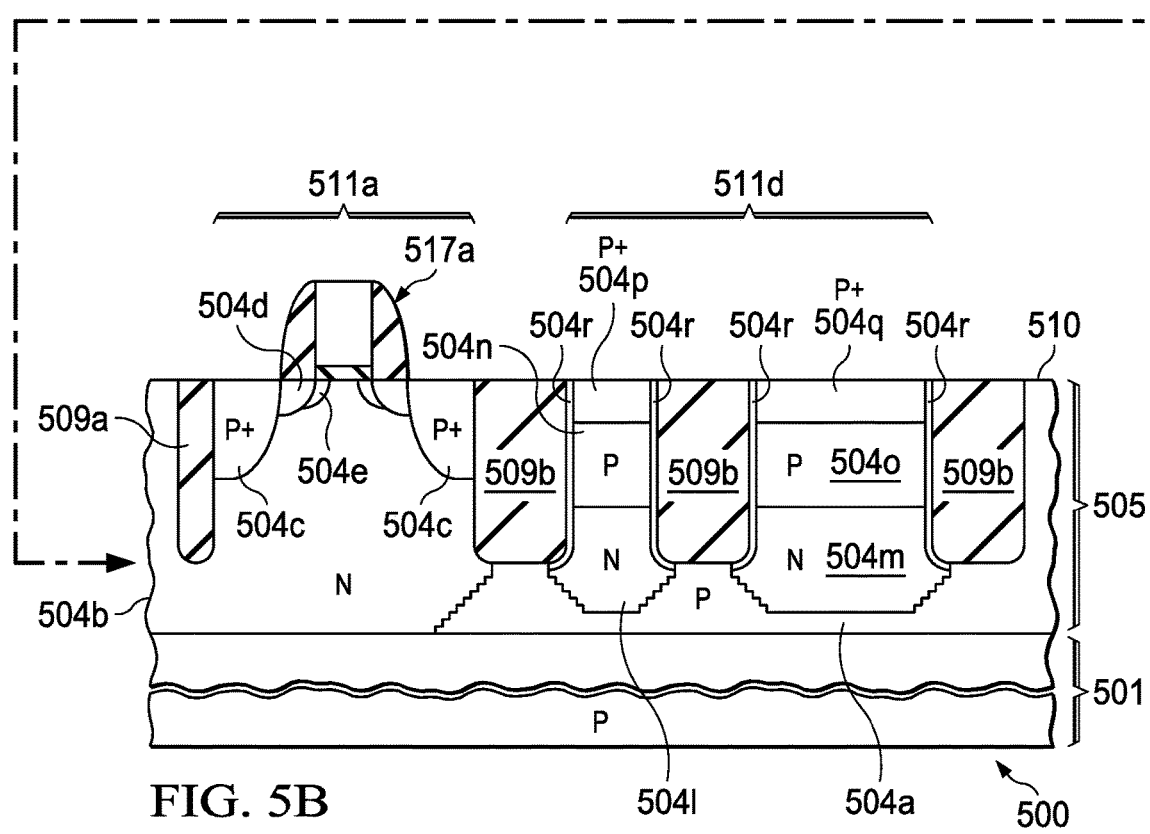

FIG. 5A and FIG. 5B are cross sections of a microelectronic device depicted in stages of a further example method of formation. Referring to FIG. 5A, the microelectronic device 500 is formed on a workpiece 501, which has a crystalline structure. A first additive process 502a dispenses a first combination of an n-type semiconductor precursor 503a, a p-type semiconductor precursor 503b, and an undoped semiconductor precursor 503c, using a multiple source dispensing apparatus 506a, onto the workpiece 501 in an area for a p-type semiconductor 504a of a substrate 505 of the microelectronic device 500. The p-type semiconductor 504a is located in an area for a logic NMOS transistor 511b, in an area for an analog NMOS transistor 511c, and in an area for a dual vertical PNP bipolar transistor 511d, all shown in FIG. 5B. Relative proportions of the n-type semiconductor precursor 503a, the p-type semiconductor precursor 503b, and the undoped semiconductor precursor 503c are adjusted by the multiple source dispensing apparatus 506a to provide a desired dopant density in the p-type semiconductor 504a. The first additive process 502a dispenses a second combination of the n-type semiconductor precursor 503a, the p-type semiconductor precursor 503b, and the undoped semiconductor precursor 503c onto the workpiece 501 in an area for an n-type semiconductor 504b of the substrate 505. The n-type semiconductor 504b is located in an area for a logic PMOS transistor 511a, shown in FIG. 5B. The first additive process 502a dispenses the n-type semiconductor precursor 503a, the p-type semiconductor precursor 503b, and the undoped semiconductor precursor 503c in sublayers, which are each heated by a first heating process 507a to convert each sublayer into the corresponding p-type semiconductor 504a or n-type semiconductor 504b. The multiple source dispensing apparatus 506a is depicted in FIG. 5A as a material jetting apparatus; the first additive process 502a may use another additive process having a multiple source dispensing apparatus, such as an electrostatic deposition process or a directed energy deposition process. Other additive processes having a multiple source dispensing apparatus are within the scope of this example. The first heating process 507a may be implemented as a scanned localized heating process, such as a scanned laser heating process, as indicated in FIG. 5A. Alternatively, the first heating process 507a may be implemented as a blanket heating process such as a flash heating process.

The first additive process 502a and the first heating process 507a are further used to form semiconductor elements of the logic PMOS transistor 511a, the logic NMOS transistor 511b, the analog NMOS transistor 511c, and the dual vertical PNP bipolar transistor 511d, in the substrate 505. The substrate 505 has a component surface 510 located opposite from the workpiece 501.

For the logic PMOS transistor 511a, the first additive process 502a and the first heating process 507a are used to form p-type source/drain regions 504c, p-type source/drain extensions 504d contacting the p-type source/drain regions 504c, and n-type halo regions 504e abutting the p-type source/drain extensions 504d. The p-type source/drain regions 504c, the p-type source/drain extensions 504d, and the n-type halo regions 504e may have dopant distributions which provide superior performance for the logic PMOS transistor 511a, compared to a comparable transistor formed by planar processes. For an example, the p-type source/drain regions 504c and the p-type source/drain extensions 504d may have a high dopant density along the component surface, to provide a low series resistance, while having a low dopant density along a boundary with the n-type semiconductor material 504b, to provide low leakage current across the boundary. Such a dopant distribution may be difficult to attain using ion implant and anneal processes, due to diffusion of the dopants. For another example, the n-type halo regions 504e may have a consistent dopant density and spatial dimensions, providing a consistent threshold voltage and off-state current for the logic PMOS transistor 511a, which has been difficult to attain using angled ion implant processes.

For the logic NMOS transistor 511b, the first additive process 502a and the first heating process 507a are used to form n-type source/drain regions 504f, n-type source/drain extensions 504g contacting the n-type source/drain regions 504f, and p-type halo regions 504h abutting the n-type source/drain extensions 504g. The n-type source/drain regions 504f, the n-type source/drain extensions 504g, and the p-type halo regions 504h may have dopant distributions which provide superior performance for the logic NMOS transistor 511b, compared to a comparable transistor formed by planar processes, similarly to the examples disclosed in reference to the logic PMOS transistor 511a.

For the analog NMOS transistor 511c, the first additive process 502a and the first heating process 507a are used to form n-type analog source/drain regions 504i, n-type analog source/drain extensions 504j contacting the n-type analog source/drain regions 504i, and n-type buffer regions 504k between the n-type analog source/drain regions 504i and the p-type semiconductor material 504a. The n-type buffer regions 504k may be formed with low dopant densities to enable operation of the analog NMOS transistor 511c at high drain voltages without high drain leakage currents. The analog NMOS transistor 511c may be formed without p-type halo regions, to provide a consistent threshold voltage and low noise for the analog NMOS transistor 511c, which requires an extra mask operation in fabrication sequences using planar processes in which the analog NMOS transistor 511c is formed concurrently with the logic NMOS transistor 511b.

For the dual vertical PNP bipolar transistor 511d, the first additive process 502a and the first heating process 507a are used to form a first n-type base 504l and a second n-type base 504m, contacting the p-type semiconductor material 504a, form a first p-type collector 504n contacting the first n-type base 504l and form a second p-type collector 504o contacting the second n-type base 504m, and form a first collector contact region 504p contacting the first p-type collector 504n and form a second collector contact region 504q contacting the second p-type collector 504o. The first n-type base 504l and the second n-type base 504m may have dopant densities and spatial dimensions to provide a desired gain, sometimes referred to as beta or $h_{fe}$, for the dual vertical PNP bipolar transistor 511d, which would require separate mask and ion implant processes for a version of the microelectronic device fabricated using planar processes. The first p-type collector 504n and the second p-type collector 504o may have low dopant densities, to provide low depletion current during operation of the microelectronic device 500, which would also require separate mask and ion implant processes for a version of the microelectronic device fabricated using planar processes. The first collector contact region 504p and the second collector contact region 504q may have high dopant densities to provide low resistance connections to the dual vertical PNP bipolar transistor 511d at the component surface 510. The dopant densities and spatial dimensions of the dual vertical PNP bipolar transistor 511d may enable the dual vertical PNP bipolar transistor 511d to be used in a precision temperature measurement circuit, providing a more accurate temperature measurement that may be attained using a dual vertical PNP bipolar transistor formed by planar processes concurrently with logic transistors.

A second additive process 502b dispenses a dielectric precursor 503d onto the workpiece 501 in areas for first isolation structures 509a and second isolation structures 509b in the substrate 505. A second heating process 507b converts the dielectric precursor 503d to dielectric material to form the first isolation structures 509a and the second isolation structures 509b. The second additive process 502b may be implemented as a material extrusion process 502b, as depicted in FIG. 5A, or may be implemented as another additive process, such as a binder jetting process, a material jetting process, a directed energy deposition process, a direct laser deposition process, an electrostatic deposition process, or a laser sintering process. The dielectric precursor 503d may include, for example, MSQ, HSQ, or TEOS, silicon dioxide nanoparticles, or a combination thereof. The second heating process 507b may be implemented as a scanned localized heating process, which may advantageously heat the dielectric precursor 503d without heating the adjacent semiconductor materials 504a and 504b of the substrate 505. The second heating process 507b may use a focused LED apparatus 508b, for example, as indicated in FIG. 5A. Other implementations of the second heating process 507b are within the scope of this example. The first isolation structures 509a may laterally isolate the logic PMOS transistor 511a, the logic NMOS transistor 511b, and the analog NMOS transistor 511c. The first isolation structures 509a may have varying depths and depth-to-width ratios greater than 10, which may be costly to attain using planar processes. The second isolation structures 509b may laterally isolate the dual vertical PNP bipolar transistor 511d, providing appropriate separation of the first n-type base 504l and the second n-type base 504m, to reduce interference between currents flowing through first n-type base 504l and the second n-type base 504m during operation of the microelectronic device 500. Forming the second isolation structures 509b concurrently with the first isolation structures 509a may be difficult or costly using planar processes, such as a shallow trench isolation process, due to the variations in width and depth between the first isolation structures 509a and the second isolation structures 509b.

A third additive process 502c dispenses an alternate semiconductor precursor 503e onto the substrate 505 in areas for reduced recombination regions 504r. The third additive process 502c may be implemented as a separate additive process from the first additive process 502a, for example, as an electrostatic deposition process 502c as depicted in FIG. 5A, or may be implemented as a continuation of the first additive process 502a. The reduced recombination regions 504r have semiconductor material with a higher bandgap energy than the p-type semiconductor material 504a and the n-type semiconductor material 504b, for example a semiconductor material including silicon and carbon. The alternate semiconductor precursor 503e may include separate silicon precursors and carbon precursors, and may include precursors containing both silicon and carbon. The alternate semiconductor precursor 503e is heated to convert the alternate semiconductor precursor 503e to the semiconductor material with the higher bandgap energy. The alternate semiconductor precursor 503e may be heated using the first heating process 507a, or may be heated by an alternate heating process. The reduced recombination regions 504r may advantageously reduce surface recombination of minority carriers in the components of the microelectronic device 500, for example, where the dual vertical PNP bipolar transistor 511d abuts the second isolation structures 509b. The reduced recombination regions 504r may be doped to match a dopant polarity of the semiconductor material of the dual vertical PNP bipolar transistor 511d directly adjacent to the reduced recombination regions 504r. The reduced recombination regions 504r may have graded bandgap profiles, wherein a bandgap of the reduced recombination regions 504r contacting the dual vertical PNP bipolar transistor 511d has a bandgap energy close to the semiconductor material of the dual vertical PNP bipolar transistor 511d, and the bandgap energy increases closer to the second isolation structures 509b. A composition of the alternate semiconductor precursor 503e may be varied during the third additive process 502c to provide the desired bandgap and dopant polarity.

Referring to FIG. 5B, a PMOS gate structure 517a is formed on the substrate 505 in the area for the logic PMOS transistor 511a. The PMOS gate structure 517a, combined with the n-type halo regions 504e, the p-type source/drain extensions 504d, and the p-type source/drain regions 504c, provides the logic PMOS transistor 511a.

An NMOS gate structure 517b is formed on the substrate 505 in the area for the logic NMOS transistor 511b. The NMOS gate structure 517b, combined with the p-type halo regions 504h, the n-type source/drain extensions 504g, and the n-type source/drain regions 504f, provides the logic NMOS transistor 511b.

An analog gate structure 517c is formed on the substrate 505 in the area for the analog NMOS transistor 511c. The analog gate structure 517c, combined with the n-type analog source/drain regions 504i, the n-type analog source/drain extensions 504j, and the n-type buffer regions 504k, provides the analog NMOS transistor 511c.

The PMOS gate structure 517a, the NMOS gate structure 517b, or the analog gate structure 517c, may be formed by planar processes, by additive processes, or by a combination thereof.

Figure 6:
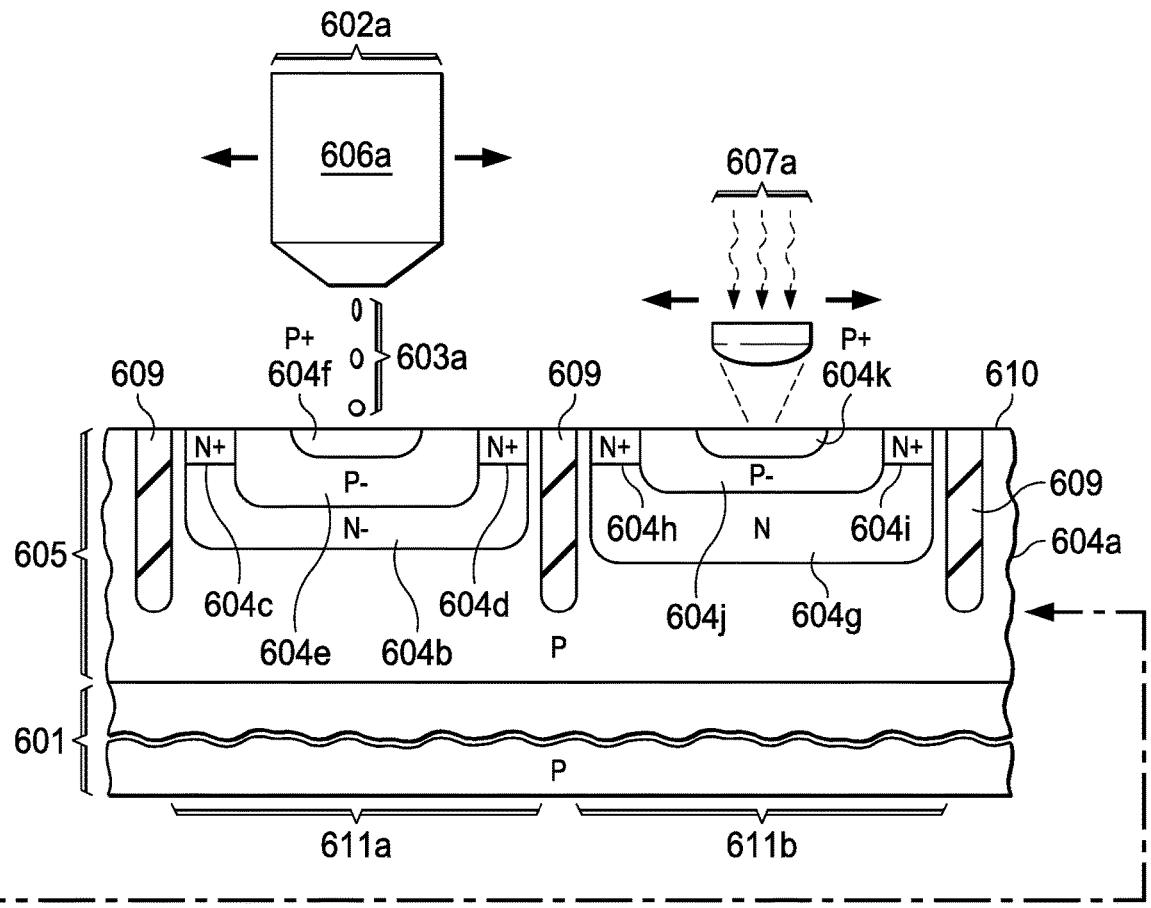
FIG. 6 is a cross section of a microelectronic device depicted in stages of another example method of formation.
Figure 6:
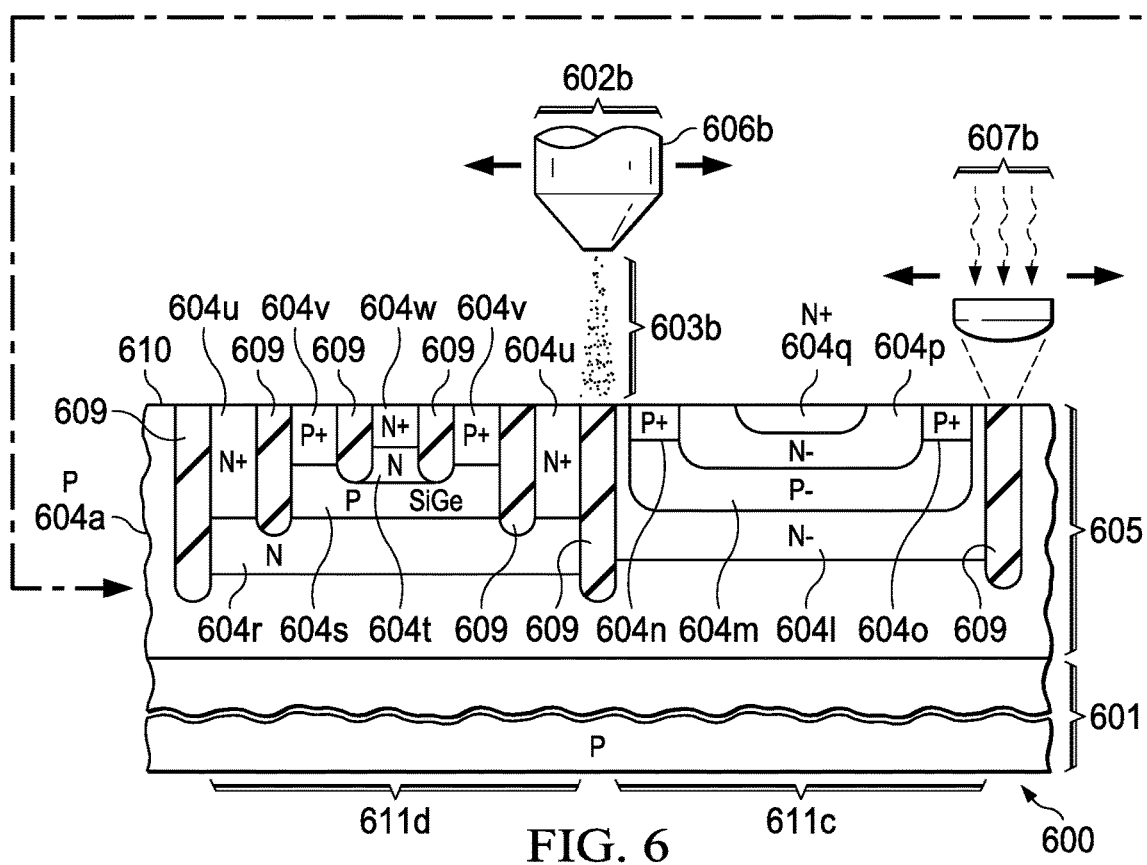

FIG. 6 is a cross section of a microelectronic device depicted in stages of another example method of formation. The microelectronic device 600 is formed on a workpiece 601, which has a crystalline structure. A first additive process 602a dispenses a semiconductor precursor 603a onto the workpiece 601 in an area for a p-type semiconductor 604a of a substrate 605 of the microelectronic device 600. The first additive process 602a may be implemented as a material jetting process 602a using a material jetting apparatus 606a, as depicted in FIG. 6. Alternatively, the first additive process 602a may be implemented as another additive process. A composition of the semiconductor precursor 603a is adjusted to provide a desired dopant density and polarity to form the p-type semiconductor 604a. The semiconductor precursor 603a is dispensed to form sublayers. Each sublayer is heated by a first heating process 607a to convert the semiconductor precursor 603a to the p-type semiconductor 604a. The first heating process 607a may be implemented as a localized heating process 607a which focuses radiant energy onto the microelectronic device 600, and is scanned laterally, applying heat where needed, as depicted in FIG. 6. Other implementations for the first heating process 607a are within the scope of this example.

The microelectronic device 600 includes a first n-channel junction field effect transistor (JFET) 611a, a second n-channel JFET 611b, a p-channel JFET 611c, and a heterojunction bipolar transistor 611d. Each of the first n-channel JFET 611a, the second n-channel JFET 611b, the p-channel JFET 611c, and the heterojunction bipolar transistor 611d have semiconductor elements located in the substrate 605. The semiconductor elements have a multiplicity of dopant densities and dopant polarities. The semiconductor elements are formed by iterative applications of the first additive process 602a and the first heating process 607a, forming sublayers of the semiconductor precursor 603a, and heating each sublayer to convert the semiconductor precursor 603a to semiconductor material of the corresponding semiconductor element. The composition of the semiconductor precursor 603a is adjusted to provide a desired dopant density and dopant polarity for each semiconductor element. The composition of the semiconductor precursor 603a may be adjusted by providing multiple sources of precursors to the material jetting apparatus 606a in appropriate quantities, with mixing of the precursors occurring in the material jetting apparatus 606a. Alternately, the composition of the semiconductor precursor 603a may be adjusted by dispensing different precursors into the sublayers, so that the precursors are mixed on the instant surface of the substrate 605. The precursors may include one or more n-type precursors having different n-type dopant concentrations, one or more p-type precursors having different p-type dopant concentrations, undoped precursors, n-type dopant precursors, or p-type dopant precursors.

The substrate 605 has a component surface 610 located opposite from the workpiece. The first n-channel JFET 611a, the second n-channel JFET 611b, the p-channel JFET 611c, and the heterojunction bipolar transistor 611d extend to the component surface 610.

The semiconductor elements of the first n-channel JFET 611a may include a first n-type channel 604b, a first n-type source 604c, a first n-type drain 604d, a first p-type gate 604e, and a first p-type gate contact region 604f. The first additive process 602a forms the first n-type channel 604b and the first p-type gate 604e with dopant densities and spatial dimensions to provide a desired threshold voltage and channel resistance for the first n-channel JFET 611a.

The semiconductor elements of the second n-channel JFET 611b may include a second n-type channel 604g, a second n-type source 604h, a second n-type drain 604i, a second p-type gate 604j, and a second p-type gate contact region 604k. The first additive process 602a forms the second n-type channel 604g and the second p-type gate 604j with dopant densities and spatial dimensions to provide a desired threshold voltage and channel resistance for the second n-channel JFET 611b that are different from the threshold voltage and channel resistance of the first n-channel JFET 611a. The second n-type channel 604g may have a larger vertical thickness and a higher average dopant density than the first n-type channel 604b, thus providing a higher threshold voltage and a lower channel resistance for the second n-channel JFET 611b compared to the first n-channel JFET 611a. Forming the first n-type channel 604b and the second n-type channel 604g with different dopant densities and spatial dimensions is accomplished by adjusting the composition of the semiconductor precursor 603a during execution of the first additive process 602a. Additional n-channel JFETs with further different dopant densities and spatial dimensions may be formed in the substrate 605 by similar adjustments to the composition of the semiconductor precursor 603a. Forming multiple JFETs with different dopant densities and spatial dimensions using planar processes entails multiple mask and ion implant operations, increasing fabrication costs.

The semiconductor elements of the p-channel JFET 611c may include an n-type back gate 604l, a p-type channel 604m, a p-type source 604n, a p-type drain 604o, an n-type gate 604p, and an n-type gate contact region 604q. The first additive process 602a forms the n-type back gate 604l, the p-type channel 604m, and the n-type gate 604p with dopant densities and spatial dimensions to provide a desired threshold voltage and channel resistance for the p-channel JFET 611c. The first additive process 602a forms the semiconductor elements of the p-channel JFET 611c concurrently with the semiconductor elements of the first n-channel JFET 611a and the second n-channel JFET 611b, by adjustments to the composition of the semiconductor precursor 603a, incurring an advantage similar to that disclosed for forming the first n-channel JFET 611a and the second n-channel JFET 611b concurrently.

The semiconductor elements of the heterojunction bipolar transistor 611d may include an n-type collector 604r, a p-type base 604s, an n-type emitter 604t, n-type collector contact regions 604u, p-type base contact regions 604v, and an n-type emitter contact region 604w. The p-type base 604s may be formed by the first additive process 602a to have a bandgap energy less than a bandgap energy of the n-type collector 604r and the n-type emitter 604t, which may advantageously improve a speed of the heterojunction bipolar transistor 611d during operation of the microelectronic device 600. The p-type base 604s may include silicon and germanium, with p-type dopants, for example, while the n-type collector 604r and the n-type emitter 604t may consist essentially of silicon and appropriate n-type dopants. The p-type base 604s may be formed by the first additive process 602a by adding a germanium precursor to the semiconductor precursor 603a when dispensing the semiconductor precursor 603a in an area for the p-type base 604s. The n-type emitter 604t may have a single crystal structure as a result of being formed by the first additive process 602a combined with the first heating process 607a, which may advantageously reduce noise in an emitter current through the heterojunction bipolar transistor 611d during operation of the microelectronic device 600, compared to a heterojunction bipolar transistor having a polycrystalline silicon emitter, common in heterojunction bipolar transistors formed by planar processes.

In an alternate version of this example, the semiconductor elements of the first n-channel JFET 611a, the second n-channel JFET 611b, the p-channel JFET 611c, and the heterojunction bipolar transistor 611d, may be formed by more than one additive process. In one aspect, p-type semiconductor elements may be formed by one additive process, and n-type semiconductor elements may be formed by another additive process. In another aspect, each of the semiconductor elements may be formed by a separate additive process.

Devices of the microelectronic device 600, including the first n-channel JFET 611a, the second n-channel JFET 611b, the p-channel JFET 611c, and the heterojunction bipolar transistor 611d, may be laterally isolated by isolation structures 609 which include dielectric material extending into the substrate 605 from the component surface 610. The semiconductor elements of the heterojunction bipolar transistor 611*d* may be laterally isolated by additional instances of the isolation structures 609. The isolation structures 609 may extend to different depths into the substrate 605 from the component surface 610, depending on the adjacent devices or semiconductor elements. For example, the isolation structures 609 isolating the first n-channel JFET 611*a* and the second n-channel JFET 611*b* from other devices may extend deeper than the n-type channels 604*b* and 604*g*. The isolation structures 609 isolating the p-channel JFET 611*c* may extend deeper than the n-type back gate 604*l*, which may be deeper than the isolation structures 609 isolating the first n-channel JFET 611*a* and the second n-channel JFET 611*b* from the other devices. The isolation structures 609 isolating the n-type collector contact regions 604*u* from the p-type base contact regions 604*v* may be deeper than the isolation structures 609 isolating the p-type base contact regions 604*v* from the n-type emitter contact region 604*w*, as depicted in FIG. 6.

The isolation structures 609 may be formed concurrently with the first n-channel JFET 611*a*, the second n-channel JFET 611*b*, the p-channel JFET 611*c*, and the heterojunction bipolar transistor 611*d*, by a second additive process 602*b*, which dispenses a dielectric precursor 603*b* onto the substrate 605 in areas for the isolation structures 609. The dielectric precursor 603*b* may be dispensed to form sublayers that are contiguous with the sublayers of the semiconductor precursor 603*a*. The dielectric precursor 603*b* may be converted to the dielectric material in the isolation structures 609 by a second heating process 607*b*. The second heating process 607*b* may be a separate process from the first heating process 607*a*, and may be adjusted to provide heating suitable for conversion of the dielectric precursor 603*b* into the dielectric material in the isolation structures 609, which may require a different temperature-time profile from that required to convert the semiconductor precursor 603*a* to crystalline semiconductor material. Thus, the isolation structures 609 may be formed concurrently with the semiconductor material in the substrate 605, advantageously eliminating mask processes to form etch masks, etch processes to form trenches for the isolation structures 609 and dielectric fill processes to fill the trenches with dielectric material. In particular, forming the isolation structures 609 having several different depths using the second additive process 602*b* may be accomplished more cost efficiently than by using planar processes.

Figure 7A:
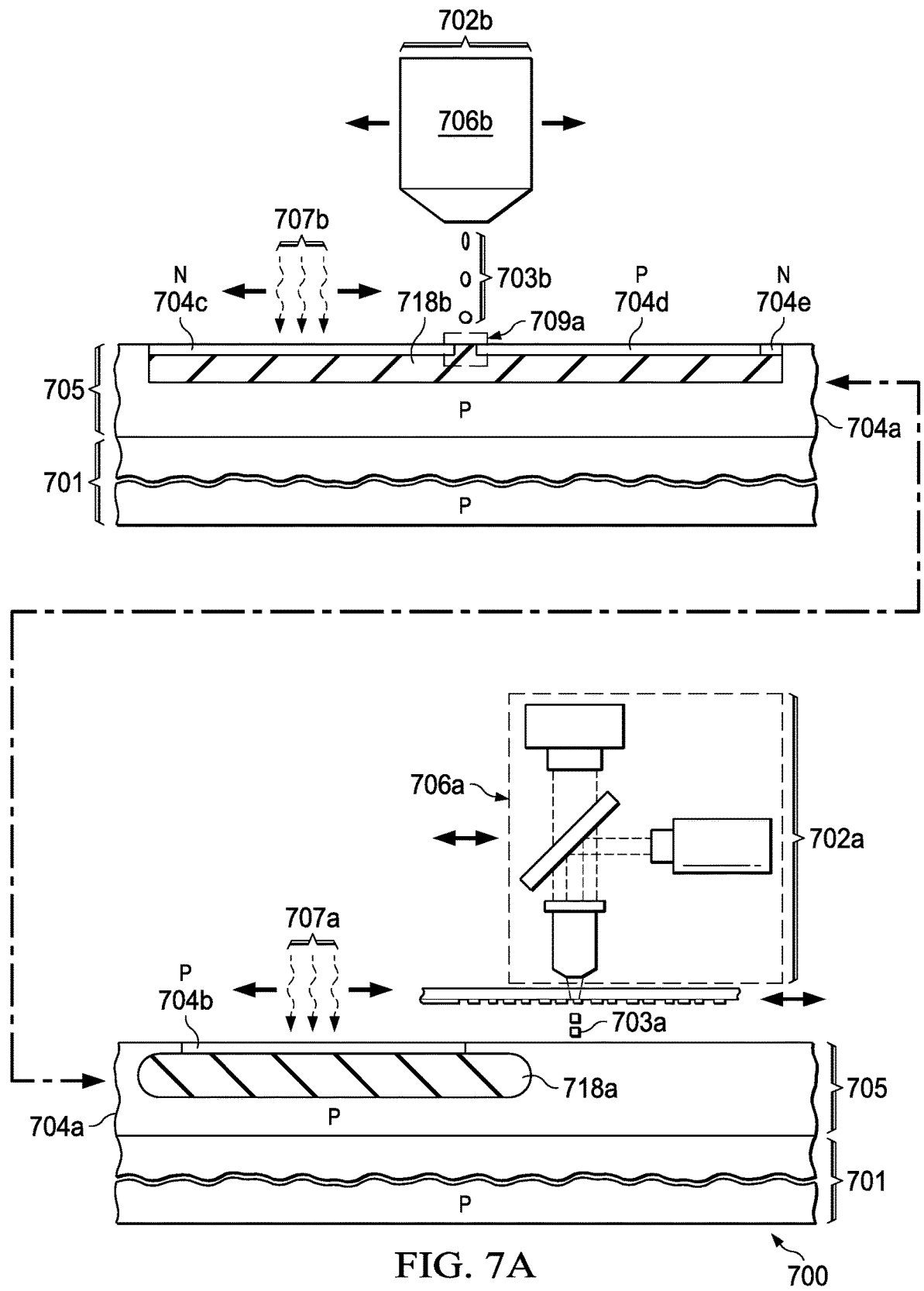
FIG. 7A through FIG. 7D are cross sections of a microelectronic device depicted in stages of a further example method of formation.

FIG. 7A through FIG. 7D are cross sections of a microelectronic device depicted in stages of a further example method of formation. Referring to FIG. 7A, the microelectronic device 700 is formed on a workpiece 701, which has a crystalline structure. A first additive process 702*a* dispenses a semiconductor precursor 703*a* onto the workpiece 701 to form a p-type semiconductor material 704*a* on the workpiece 701 for a substrate 705 of the microelectronic device 700. In one version of this example, the first additive process 702*a* may be implemented as a direct laser transfer process 702*a* using a single direct laser transfer apparatus 706*a* which adjusts a composition of the semiconductor precursor 703*a* to provide a desired dopant polarity and dopant density in the p-type semiconductor material 704*a*. In another version, the first additive process 702*a* may be implemented using more than one direct laser transfer apparatus 706*a*, with each direct laser transfer apparatus 706*a* dispensing the semiconductor precursor 703*a* with a different composition, to be mixed on the substrate 705 to provide the desired dopant polarity and dopant density. The first additive process 702*a* may be implemented as another type of additive process within the scope of this example.

The semiconductor precursor 703*a* is dispensed to form sublayers, each of which is heated to convert the semiconductor precursor 703*a* to the p-type semiconductor material 704*a*, before forming the successive sublayer. The semiconductor precursor 703*a* is heated by a first heating process 707*a*, which may be implemented as a scanned localized heating process 707*a*, as indicated in FIG. 7A.

A second additive process 702*b* dispenses a dielectric precursor 703*b* onto the p-type semiconductor material 704*a* in areas for a first buried isolation structure 718*a* and a second buried isolation structure 718*b*. The second additive process 702*b* may be implemented as a material jetting process 702*b* using a material jetting apparatus 706*b*, to dispense the dielectric precursor 703*b* in discrete droplets, as indicated in FIG. 7A. The dielectric precursor 703*b* is converted to dielectric material by a second heating process 707*b*, which may be implemented as a selective localized heating process 707*b* which focuses radiant heat on the dielectric precursor 703*b* to avoid excessive heating of the surrounding semiconductor precursor 703*a* or the p-type semiconductor material 704*a*.

The first additive process 702*a* is continued by dispensing the semiconductor precursor 703*a* to form a first isolated p-type region 704*b* over the first buried isolation structure 718*a*. The semiconductor precursor 703*a* which is dispensed onto the first buried isolation structure 718*a* may be converted to the first isolated p-type region 704*b* by using the first heating process 707*a* to heat the semiconductor precursor 703*a* from a lateral boundary of the first buried isolation structure 718*a*, so that the first isolated p-type region 704*b* is formed with the crystal structure and orientation of the p-type semiconductor material 704*a* laterally adjacent to the first buried isolation structure 718*a*.

The first additive process 702*a* and the first heating process 707*a* are continued to form a first isolated n-type region 704*c* over a first portion of the second buried isolation structure 718*b*, to form a second isolated p-type region 704*d* over a second portion of the second buried isolation structure 718*b*, and to form an n-type blocking region 704*e* over a third portion of the second buried isolation structure 718*b*, directly adjacent to the second isolated p-type region 704*d*. FIG. 7A shows the first isolated p-type region 704*b*, the first isolated n-type region 704*c* and the second isolated p-type region 704*d* partway to completion.

The second additive process 702*b* and the second heating process 707*b* are continued to form a first vertical isolation structure 709*a* separating the first isolated n-type region 704*c* from the second isolated p-type region 704*d*, and contiguous with the second buried isolation structure 718*b*. FIG. 7A shows the first vertical isolation structure 709*a* partway to completion.

Figure 7B:
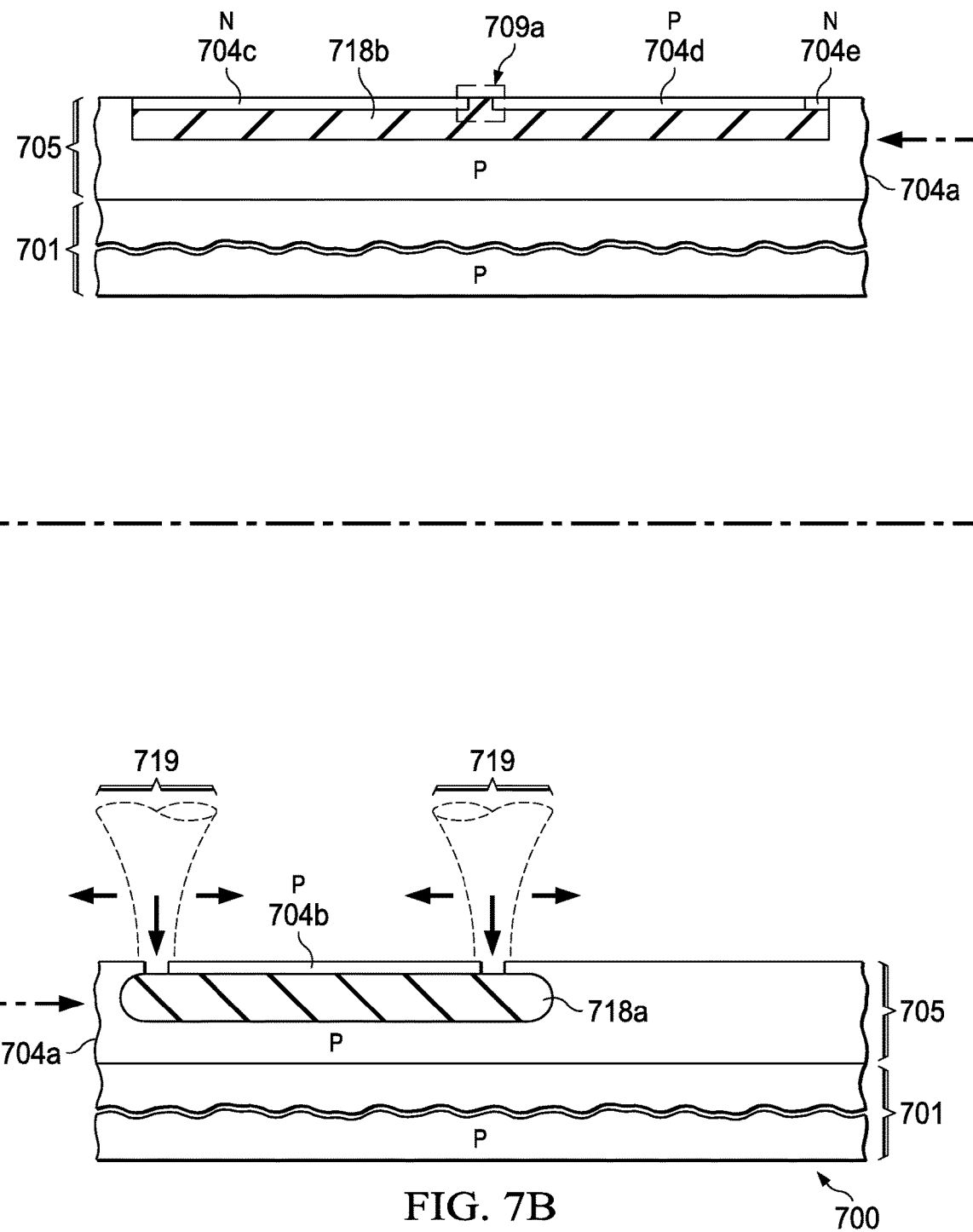

Referring to FIG. 7B, a first subtractive process 719 may be used to remove a portion of the first isolated p-type region 704*b* from over the first buried isolation structure 718*a* along a lateral perimeter of the first isolated p-type region 704*b*, exposing the first buried isolation structure 718*a*. The first subtractive process 719 may be implemented, for example, as a laser ablation process 719, as indicated schematically in FIG. 7B, a focused ion beam process, or a selective electrical discharge machining process. For the purposes of this disclosure, a subtractive process refers to a process which removes material from the substrate 705 in a selected area, and which leaves material of the substrate 705 adjacent to the removed material substantially undisturbed. A subtractive process may use a blanket protective layer, such as a thin film of organic polymer, which is subsequently removed. Another implementation of the first subtractive process 719 may include forming a layer of thermally sensitive polymer on the substrate 705, and removing the thermally sensitive polymer from along the lateral perimeter of the first isolated p-type region 704*b* using a scanning microscopic heated tip, similar to a tip on an atomic force microscope (AFM) tool. The portion of the first isolated p-type region 704*b*, which is exposed by the removal of the thermally sensitive polymer, is subsequently removed, while the remaining thermally sensitive polymer protects the remaining substrate 705. The thermally sensitive polymer is subsequently removed. The first isolated p-type region 704*b* is separated from the p-type semiconductor material 704*a* after the first subtractive process 719 is completed.

Figure 7C:
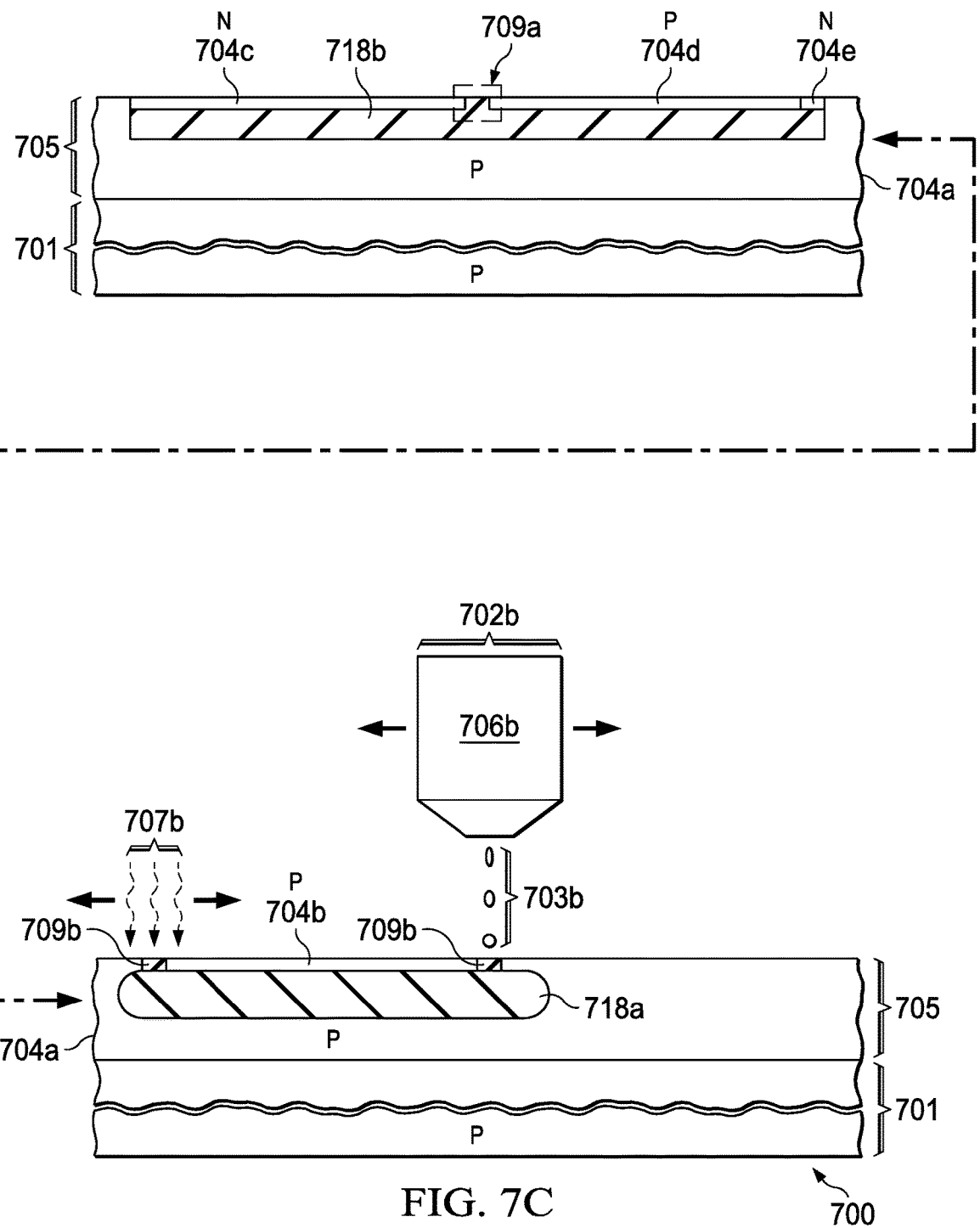

Referring to FIG. 7C, the second additive process 702*b*, using the material jetting apparatus 706*b*, and the second heating process 707*b* are continued to form a portion of a second vertical isolation structure 709*b* on the first buried isolation structure 718*a* in the area in which the first isolated p-type region 704*b* was removed as disclosed in reference to FIG. 7B. In another version of this example, the second vertical isolation structure 709*b* may be formed by a different additive process than the second additive process 702*b*. The second vertical isolation structure 709*b* contacts the first buried isolation structure 718*a* and isolates the first isolated p-type region 704*b* from the p-type semiconductor material 704*a*.

Figure 7D:
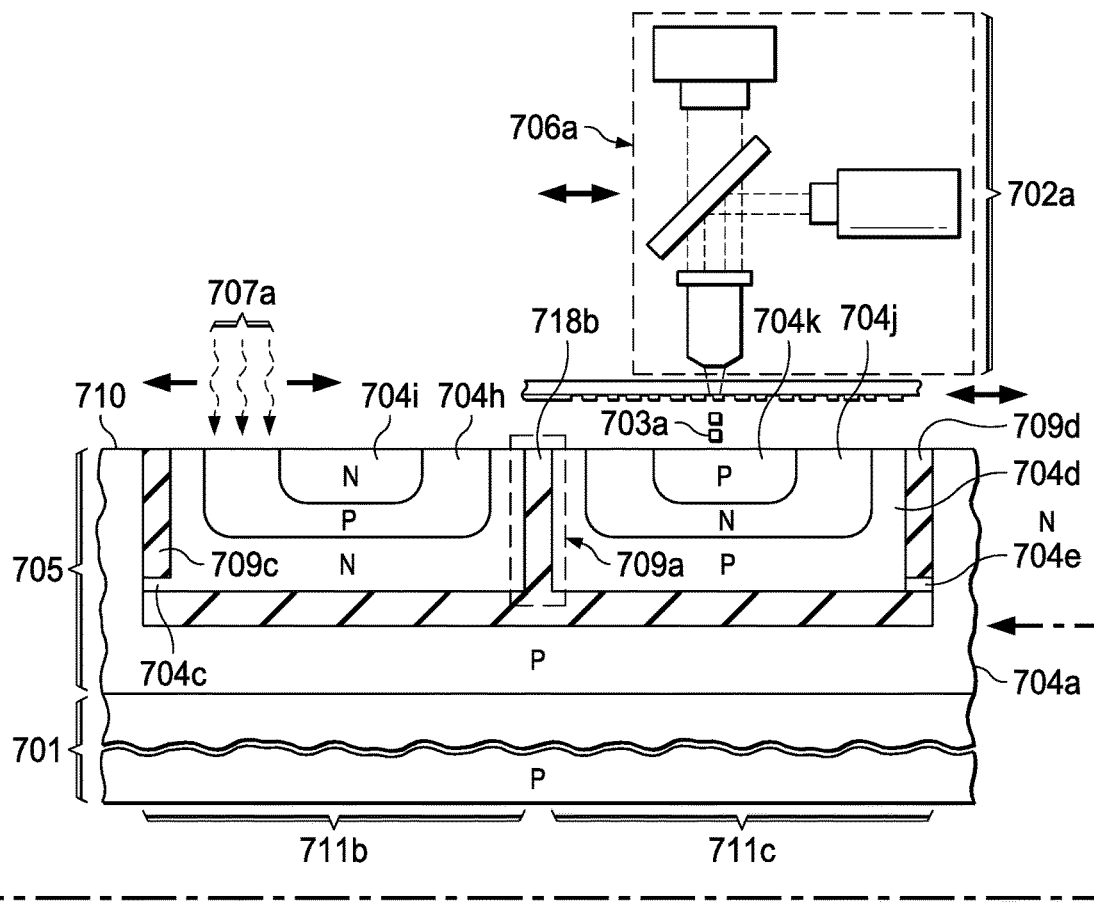
Figure 7D:
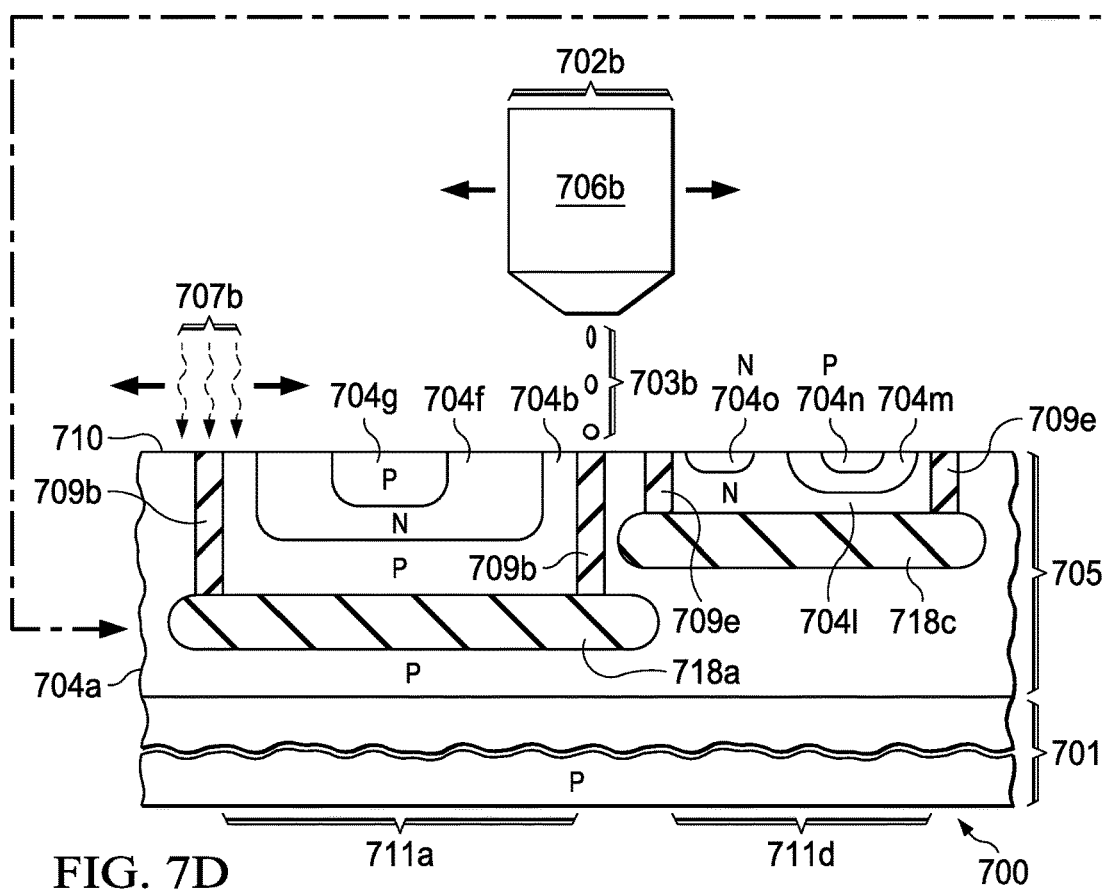

Referring to FIG. 7D, the first additive process 702*a*, using the direct laser transfer apparatus 706*a*, and the first heating process 707*a* are continued to form semiconductor elements of the substrate 705. The second additive process 702*b*, using the material jetting apparatus 706*b*, and the second heating process 707*b* are continued to form isolation structures of the substrate 705. The substrate 705 has a component surface 710 located opposite from the workpiece 701.

The microelectronic device 700 includes a first isolated n-channel JFET 711*a* located over the first buried isolation structure 718*a*. The first additive process 702*a* and the first heating process 707*a* form the remainder of the first isolated p-type region 704*b* over the first buried isolation structure 718*a*. The second additive process 702*b* and the second heating process 707*b* form the remainder of the second vertical isolation structure 709*b*, extending from the first buried isolation structure 718*a* to the component surface 710, laterally surrounding the first isolated p-type region 704*b*. The first isolated p-type region 704*b* is isolated from the p-type semiconductor material 704*a* by the second vertical isolation structure 709*b* in combination with the first buried isolation structure 718*a*. The first additive process 702*a* and the first heating process 707*a* form a first n-type channel 704*f* of the first isolated n-channel JFET 711*a* on the first isolated p-type region 704*b*. The first additive process 702*a* and the first heating process 707*a* further form a p-type gate 704*g* of the first isolated n-channel JFET 711*a* on the first n-type channel 704*f*. Forming the second vertical isolation structure 709*b* as disclosed in this example may advantageously enable the first isolated n-channel JFET 711*a* to be operated at potentials more than 30 volts above or below a potential of the p-type semiconductor material 704*a* without significant leakage current. The semiconductor elements of the first isolated n-channel JFET 711*a* and the isolation structures surrounding the first isolated n-channel JFET 711*a* are formed concurrently with the semiconductor elements of the other components of the microelectronic device and corresponding isolation structures, by adjusting the composition of the semiconductor precursor 703*a* and concurrent performance of the first additive process 702*a* and the second additive process 702*b*, as well as concurrent performance of the first heating process 707*a* and the second heating process 707*b*. Forming the first isolated n-channel JFET 711*a* using planar processes may be more complex and costly than using the additive processes 702*a* and 702*b*, especially if forming the first isolated n-channel JFET 711*a* requires additional steps such as photolithographic operations.

The microelectronic device 700 includes an isolated p-channel JFET 711*b* located over the first portion of the second buried isolation structure 718*b*. The first additive process 702*a* and the first heating process 707*a* form the remainder of the first isolated n-type region 704*c* over the second buried isolation structure 718*b*. The second additive process 702*b* and the second heating process 707*b* form the remainder of the first vertical isolation structure 709*a*, extending from the second buried isolation structure 718*b* to the component surface 710. The second additive process 702*b* and the second heating process 707*b* also form a third vertical isolation structure 709*c*, extending from a thin portion of the first isolated n-type region 704*c*, located over the second buried isolation structure 718*b*, to the component surface 710. The first vertical isolation structure 709*a* and the third vertical isolation structure 709*c* meet at points above and below a plane of FIG. 7D, so that a combination of the first vertical isolation structure 709*a* and the third vertical isolation structure 709*c* laterally surround the first isolated n-type region 704*c*, except for the thin portion of the first isolated n-type region 704*c*, located between the third vertical isolation structure 709*c* and the second buried isolation structure 718*b*. A combination of the first vertical isolation structure 709*a*, the third vertical isolation structure 709*c*, a p-n junction at an interface between the first isolated n-type region 704*c* and the p-type semiconductor material 704*a*, and the second buried isolation structure 718*b* provides electrical isolation of the first isolated n-type region 704*c* from the p-type semiconductor material 704*a*. The first additive process 702*a* and the first heating process 707*a* form a p-type channel 704*h* of the isolated p-channel JFET 711*b* on the first isolated n-type region 704*c*. The first additive process 702*a* and the first heating process 707*a* further form an n-type gate 704*i* of the isolated p-channel JFET 711*b* on the p-type channel 704*h*. The isolated p-channel JFET 711*b* may be operated at a potential that is several volts more positive than the potential of the p-type semiconductor material 704*a*; the p-n junction at an interface between the first isolated n-type region 704*c* and the p-type semiconductor material 704*a* would be reverse biased under such operating conditions. Leakage current through the p-n junction is limited by the reverse bias condition and dimensions of the p-n junction. The semiconductor elements of the isolated p-channel JFET 711*b* and the isolation structures surrounding the isolated p-channel JFET 711*b* are formed concurrently with the semiconductor elements of the other components of the microelectronic device 700 and corresponding isolation structures. Forming the isolated p-channel JFET 711*b* using planar processes may be more complex and costly.

The microelectronic device 700 includes a second isolated p-channel JFET 711*c* located over the second portion of the second buried isolation structure 718*b*. The first additive process 702*a* and the first heating process 707*a* form the remainder of the second isolated p-type region 704*d* over the second buried isolation structure 718*b*. The second additive process 702*b* and the second heating process 707*b* form a fourth vertical isolation structure 709d, extending from the n-type blocking region 704e to the component surface 710. The first vertical isolation structure 709a and the fourth vertical isolation structure 709d meet at points above and below the plane of FIG. 7D, so that a combination of the first vertical isolation structure 709a and the fourth vertical isolation structure 709d laterally surround the second isolated p-type region 704d, except for the n-type blocking region 704e. A combination of the first vertical isolation structure 709a, the fourth vertical isolation structure 709d, the n-type blocking region 704e, and the second buried isolation structure 718b provides electrical isolation of the second isolated p-type region 704d from the p-type semiconductor material 704a. The first additive process 702a and the first heating process 707a form a second n-type channel 704j of the second isolated n-channel JFET 711c on the second isolated p-type region 704d. The first additive process 702a and the first heating process 707a further form a second p-type gate 704k of the second isolated p-channel JFET 711c on the second n-type channel 704j. The second isolated n-channel JFET 711c may be operated at a potential that is several volts more positive or more negative than the potential of the p-type semiconductor material 704a; the n-type blocking region 704e provides at least one reverse biased p-n junction under such operating conditions. Leakage current through the n-type blocking region 704e is limited by the reverse bias condition and dimensions of the n-type blocking region 704e. The semiconductor elements of the second isolated p-channel JFET 711c and the isolation structures surrounding the second isolated p-channel JFET 711c are formed concurrently with the semiconductor elements of the other components of the microelectronic device 700 and corresponding isolation structures, accruing a similar advantage of cost and complexity reduction compared to planar processing.

The second additive process 702b and the second heating process 707b form a third buried isolation structure 718c on the p-type semiconductor material 704a. The first additive process 702a and the first heating process 707a form a second isolated n-type region 704l over the third buried isolation structure 718c. The second additive process 702b and the second heating process 707b further form a fifth vertical isolation structure 709e contacting the third buried isolation structure 718c and extending to the component surface 710, laterally surrounding the second isolated n-type region 704l. The second isolated n-type region 704l and the fifth vertical isolation structure 709e may be formed by a method similar to the method used to form the first isolated p-type region 704b and the second vertical isolation structure 709b, as disclosed in reference to FIG. 7A through FIG. 7D. The microelectronic device 700 includes an isolated p-n junction 711d over the third buried isolation structure 718c, isolated from the p-type semiconductor material 704a by the fifth vertical isolation structure 709e combined with the third buried isolation structure 718c. The second isolated n-type region 704l provides a cathode of the isolated p-n junction 711d. The first additive process 702a and the first heating process 707a form a p-type anode 704m of the isolated p-n junction 711d on the second isolated n-type region 704l. The first additive process 702a may adjust the composition of the semiconductor precursor 703a to form the second isolated n-type region 704l and the p-type anode 704m with appropriate dopant densities to provide a desired breakdown voltage and leakage current for the isolated p-n junction 711d. The first additive process 702a and the first heating process 707a further form a p-type anode contact region 704n on the p-type anode 704m, and form an n-type cathode contact region 704o on the second isolated n-type region 704l. The p-type anode contact region 704n may be formed by the first additive process 702a and the first heating process 707a to have an average dopant density more than 10 times the average dopant density of the p-type anode 704m, to provide a reduced resistance to the p-type anode 704m. Similarly, the n-type cathode contact region 704o may be formed by the first additive process 702a and the first heating process 707a to have an average dopant density more than 10 times the average dopant density of the second isolated n-type region 704l to provide a reduced resistance to the cathode of the isolated p-n junction 711d. The semiconductor elements of the isolated p-n junction 711d and the isolation structures surrounding the isolated p-n junction 711d are formed concurrently with the semiconductor elements of the other components of the microelectronic device 700 and corresponding isolation structures, further accruing the advantage of cost and complexity reduction compared to planar processing.

The advantage of forming the semiconductor elements and isolation structures of the microelectronic device 700 using the additive processes as disclosed in this example become more pronounced as the number of component types increases. In this example, the microelectronic device 700 is disclosed as having four component types. Forming the semiconductor elements and isolation structures for each component type using planar processes may require a separate set of mask formation and ion implant operations to attain desired dopant densities and spatial dimensions, undesirably increasing cost and complexity. Forming the semiconductor elements and isolation structures for each component type concurrently using the additive processes may provide a lower overall fabrication cost for the microelectronic device 700.

Figure 8A:
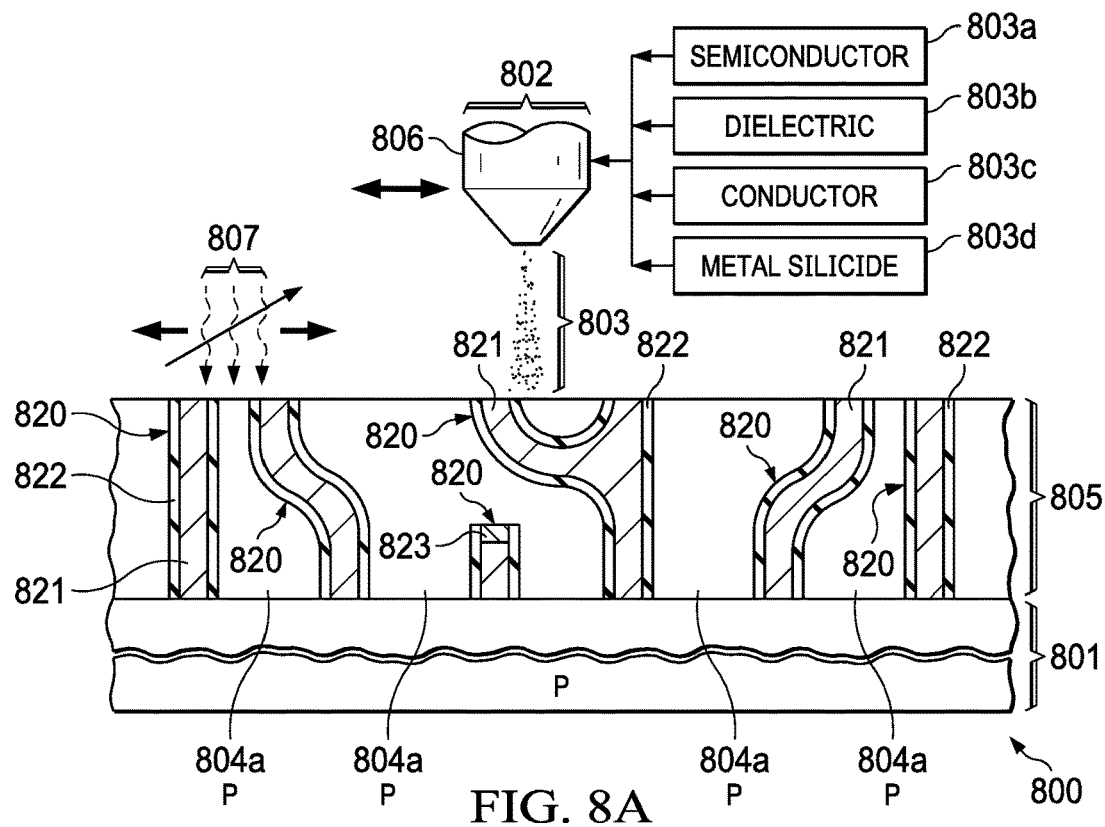
FIG. 8A through FIG. 8C are cross sections of a microelectronic device depicted in stages of another example method of formation.
Figure 8C:
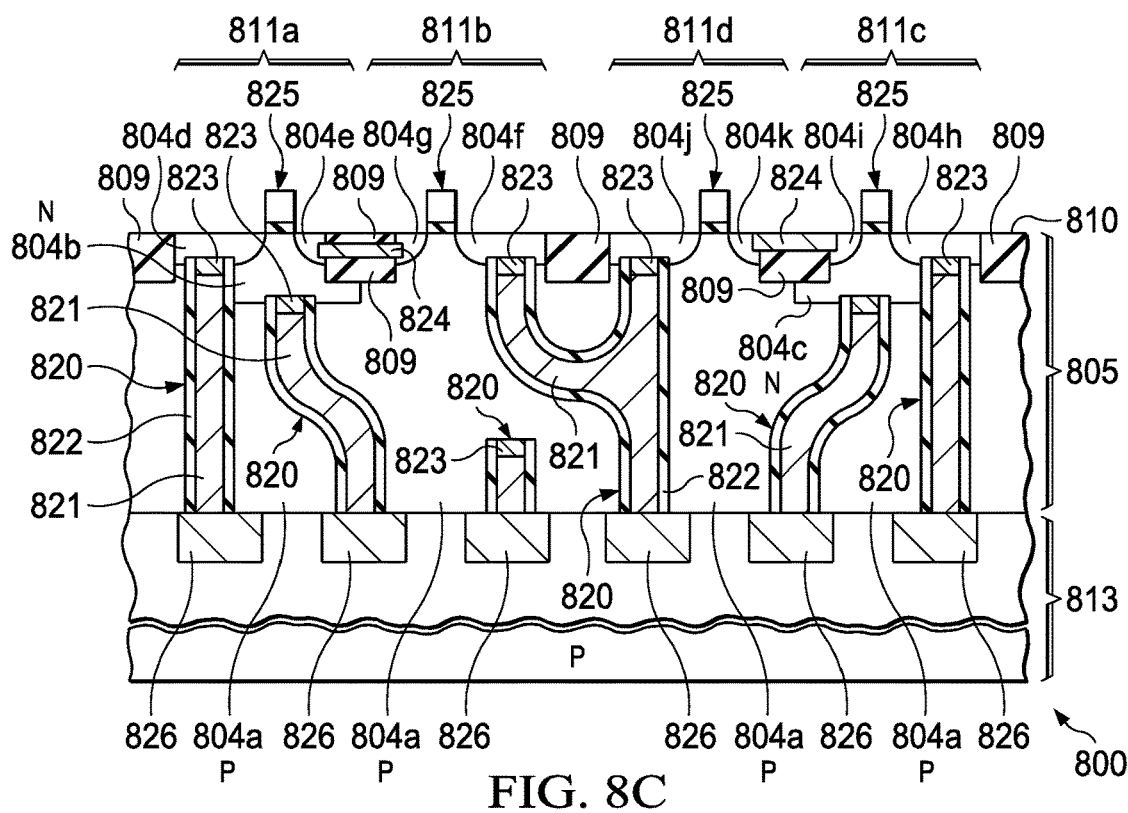
Figure 8B:
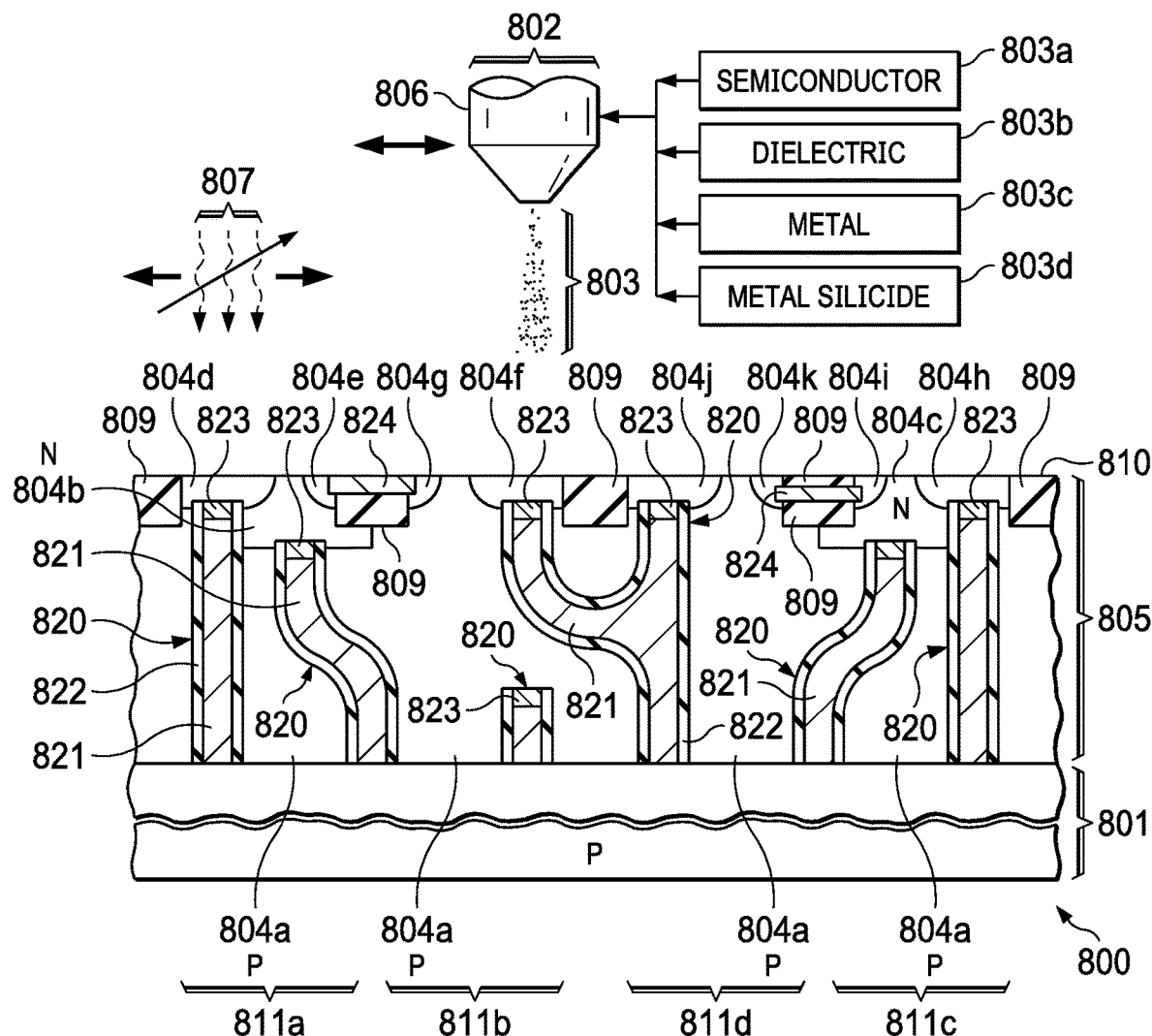

FIG. 8A through FIG. 8C are cross sections of a microelectronic device depicted in stages of another example method of formation. Referring to FIG. 8A, the microelectronic device 800 is formed on a workpiece 801, which has a crystalline structure. An additive process 802 and a heating process 807 form a substrate 805 of the microelectronic device 800 on the workpiece 801. The additive process 802 may be implemented using a dispensing apparatus 806 which dispenses a precursor 803. The dispensing apparatus 806 may be configured to accept a semiconductor precursor 803a, a dielectric precursor 803b, a conductor precursor 803c, and a metal silicide precursor 803d. A composition of the precursor 803 that is dispensed by the dispensing apparatus 806 may be obtained by selecting one or more of the semiconductor precursor 803a, the dielectric precursor 803b, the conductor precursor 803c, or the metal silicide precursor 803d. The semiconductor precursor 803a may be provided as one or more semiconductor precursors with various dopant materials, optionally in varying concentrations, optionally to be mixed as needed by the dispensing apparatus 806. The dielectric precursor 803b may be provided as one or more dielectric precursors, which may include nanoparticles of silicon dioxide, silicon nitride, aluminum oxide, or titanium oxide, for example, and may include one or more liquid precursors such as TEOS or BTBAS. The dielectric precursors may be mixed as needed by the dispensing apparatus 806. The conductor precursor 803c may include electrical conductor inks, with nanoparticles of tungsten, titanium, platinum, aluminum, graphene flakes, or other electrical conductors, dispersed in a solvent or liquid binder. The metal silicide precursor 803d may include nanoparticles of a metal silicide, such as tungsten silicide, platinum silicide, titanium silicide, cobalt silicide, nickel silicide, molybdenum silicide, or tantalum silicide, in a solvent or liquid binder.

The heating process 807 may be implemented as a scanned radiant heating process with an adjustable intensity, as indicated schematically in FIG. 8A. A radiant spectrum of the heating process 807 may be adjustable to enhance absorption by the specific precursor being heated, that is, the semiconductor precursor 803a, the dielectric precursor 803b, the conductor precursor 803c, or the metal silicide precursor 803d.

The precursor 803 is initially dispensed onto the workpiece 801 to form a sublayer of the precursor 803. The composition of the precursor 803 is selected to provide a desired composition of elements of the substrate 805 being formed. The sublayer may thus include one or more areas containing only the semiconductor precursor 803a, other areas containing only the dielectric precursor 803b, further areas containing only the conductor precursor 803c, and so on. The sublayer is heated by the heating process 807 to convert the precursor 803 in the sublayer to semiconductor material, dielectric material, metal, or metal silicide. Subsequent sublayers are formed on the substrate 805 by dispensing the precursor 803 using the additive process 802; the sublayers are heated by the heating process 807 to convert the newly-dispensed precursor 803 to semiconductor material, dielectric material, metal, or metal silicide.

The substrate 805 is formed by repeated iterations of the additive process 802 and the heating process 807 to include a p-type semiconductor material 804a. The p-type semiconductor material 804a may be formed using the semiconductor precursor 803a.

In this example, the additive process 802 and the heating process 807 are used to form substrate via structures 820 in the substrate 805, extending through the p-type semiconductor material 804a. The substrate via structures 820 include vias 821 that are electrically conductive, and dielectric liners 822 around the vias 821 that electrically isolate the vias 821 from the p-type semiconductor material 804a. The substrate via structures 820 may be straight, curved, branched, or may have other configurations. The vias 821 may be formed using the conductor precursor 803c, and may include one or more metals, graphene, or other electrically conductive material. The dielectric liners 822 may be formed using the dielectric precursor 803b, and may include, for example, silicon dioxide, silicon nitride, silicon oxynitride, aluminum oxide, titanium oxide, or any combination thereof. One or more of the substrate via structures 820 may provide an electrical connection to semiconductor material in the substrate 805, such as the p-type semiconductor material 804a. The substrate via structures 820 may include a contact cap 823 which includes metal silicide to provide a desired electrical connection to the p-type semiconductor material 804a and other subsequently-formed semiconductor materials in the substrate 805. The contact cap 823 contacts the corresponding via 821 and the semiconductor material. The contact cap 823 may be formed using the metal silicide precursor 803d.

Referring to FIG. 8B, the additive process 802 and the heating process 807 are continued to form the substrate 805, which extends from the workpiece 801 to a component surface 810 located opposite from the workpiece 801. The additive process 802 and the heating process 807 form semiconductor elements, in the substrate 805, of active components of the microelectronic device 800. The active components may include, by way of example, a first PMOS transistor 811a, a first NMOS transistor 811b, a second PMOS transistor 811c, and a second NMOS transistor 811d. The transistors 811a, 811b, 811c, and 811d, are shown in FIG. 8B partway to completion; gates of the transistors 811a, 811b, 811c, and 811d, may be formed subsequent to completion of the substrate 805.

The additive process 802 and the heating process 807 form a first n-type well 804b on the p-type semiconductor material 804a, in the area for the first PMOS transistor 811a. The first PMOS transistor 811a includes a first p-type source 804d and a first p-type drain 804e, formed on the first n-type well 804b by the additive process 802 and the heating process 807.

The additive process 802 and the heating process 807 form a second n-type well 804c on the p-type semiconductor material 804a, in the area for a second PMOS transistor 811c. The second PMOS transistor 811c includes a second p-type source 804h and a second p-type drain 804i, formed on the second n-type well 804c by the additive process 802 and the heating process 807.

The additive process 802 and the heating process 807 form a first n-type source 804f and a first n-type drain 804g on the p-type semiconductor material 804a, in the area for the first NMOS transistor 811b, and form a second n-type source 804j and a second n-type drain 804k, in the area for the second NMOS transistor 811d. The first p-type source 804d, the first p-type drain 804e, the second p-type source 804h, the second p-type drain 804i, the first n-type source 804f, the first n-type drain 804g, the second n-type source 804j, and the second n-type drain 804k are formed concurrently by the additive process 802 and the heating process 807.

The additive process 802 and the heating process 807 also form trench isolation structures 809 which laterally isolate the first PMOS transistor 811a, the first NMOS transistor 811b, the second PMOS transistor 811c, and the second NMOS transistor 811d. The trench isolation structures 809 are formed using the dielectric precursor 803b, and may include dielectric material such as silicon dioxide, silicon nitride, silicon oxynitride, aluminum oxide, or titanium oxide.

The additive process 802 and the heating process 807 are used to complete formation of the substrate via structures 820, making contact to various semiconductor elements in the substrate 805. The substrate via structures 820 may provide electrical connections to the first n-type well 804b and the second n-type well 804c, eliminating a need for electrical connections to the first n-type well 804b and the second n-type well 804c through the component surface 810, thus advantageously reducing a density of interconnects in the microelectronic device 800 above the component surface 810. The substrate via structures 820 may provide electrical connections to the first p-type source 804d, the second p-type source 804h, the first n-type source 804f, and the second n-type source 804j, accruing a similar advantage. Forming the substrate via structures 820 to have different lengths and to have curved portions may be attained at a lower fabrication cost and complexity using the additive process 802 and the heating process 807, than by using planar processes such as deep RIE processes.

The additive process 802 and the heating process 807 may be used to form local interconnects 824 which provide low resistance electrical connections in the substrate 805 between various semiconductor elements of the substrate 805. For example, one of the local interconnects 824 may connect the first p-type drain 804e to the first n-type drain 804g, as part of a logic gate containing the first PMOS transistor 811a and the first NMOS transistor 811b. Similarly, another of the local interconnects 824 may connect the first p-type drain 804e to the first n-type drain 804g, as part of a logic gate containing the first PMOS transistor 811a and the first NMOS transistor 811b. The local interconnects 824 may include metal silicide, to provide low resistance electrical connections to the semiconductor elements of the substrate 805. The local interconnects 824 may be formed using the metal silicide precursor 803d. Some instances of the local interconnects 824 may extend to the component surface 810, as depicted in FIG. 8B. Other instances of the local interconnects 824 may be covered by portions of the trench isolation structures 809, also as depicted in FIG. 8B. The local interconnects 824 may also eliminate a need for electrical connections between the first p-type drain 804e and the first n-type drain 804g, and between the first p-type drain 804e and the first n-type drain 804g, above the component surface 810, thus advantageously further reducing the density of interconnects in the microelectronic device 800 above the component surface 810. Reducing the density of interconnects in the microelectronic device 800 may enable a higher density of the transistors 811a, 811b, 811c, and 811d and thus lower area for the microelectronic device 800 or may provide additional process latitude for forming the interconnects above the component surface 810, resulting in lower fabrication costs.

Referring to FIG. 8C, gate structures 825 are formed on the component surface 810 in the areas for the first PMOS transistor 811a, the first NMOS transistor 811b, the second PMOS transistor 811c, and the second NMOS transistor 811d. The gate structures 825 may include, for example, gate dielectric layers on the component surface 810 and gates on the gate dielectric layers. The gate structures 825 may be formed by planar processes. Interconnects and dielectric layers, not shown, may be formed over the component surface 810 to electrically couple the transistors 811a, 811b, 811c, and 811d.

The substrate 805 may be subsequently separated from the workpiece 801 of FIG. 8B. The workpiece 801 may be ground away by a grinding or lapping process. The workpiece 801 may be cleaved from the substrate 805 and reused.

The substrate 805 may be subsequently attached to a carrier 813 having leads 826 which are electrically coupled to the substrate via structures 820. The carrier 813 may be implemented, for example, as a ceramic chip carrier, a printed circuit (PC) board, or a lead frame. The leads 826 are electrically conductive, and may include copper, silver, gold, platinum, palladium, nickel, aluminum, graphite, graphene, carbon nanotubes (CNTs), or other electrically conductive material. The leads 826 may be electrically coupled to the substrate via structures 820 by solder, electrically conductive adhesive, or other electrically conductive material. The carrier 813 may provide power and ground during operation of the microelectronic device 800, and may further provide bias voltages such as drain biases and well biases, sometimes referred to as back gate biases, to the transistors 811a, 811b, 811c, and 811d, during operation of the microelectronic device 800. Forming the substrate via structures 820 with curved shapes as depicted in FIG. 8C may enable using a standard configuration of the leads 826, advantageously reducing costs compared to custom carriers.

Figure 9A:
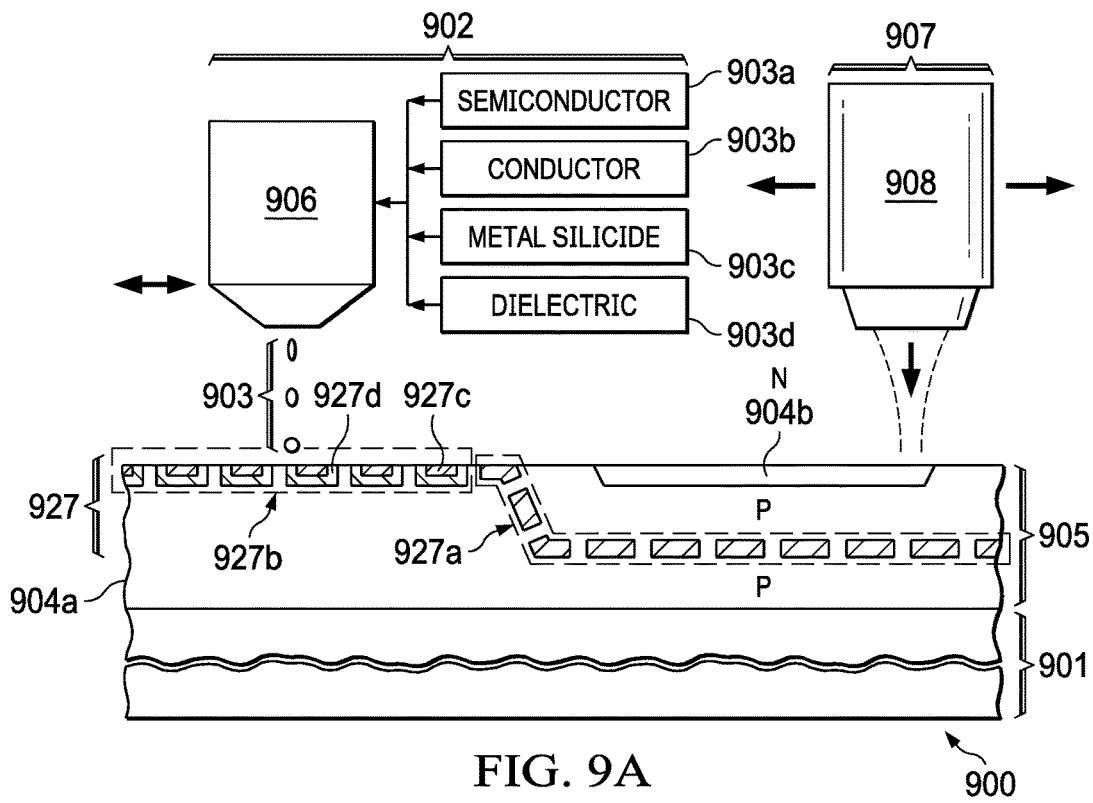
FIG. 9A and FIG. 9B are cross sections of a microelectronic device depicted in stages of a further example method of formation.
Figure 9B:
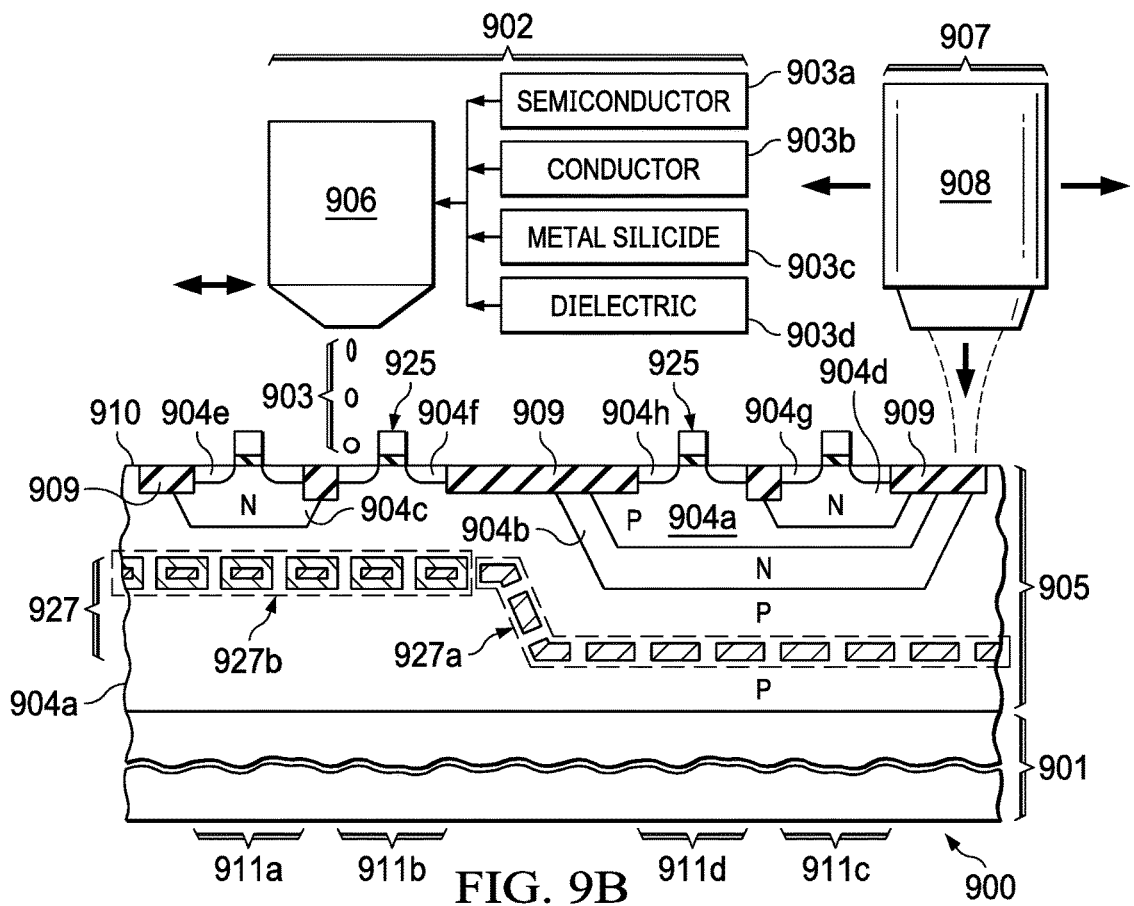

FIG. 9A and FIG. 9B are cross sections of a microelectronic device depicted in stages of a further example method of formation. Referring to FIG. 9A, the microelectronic device 900 is formed on a workpiece 901, which has a crystalline structure. An additive process 902 and a heating process 907 form a substrate 905 of the microelectronic device 900 on the workpiece 901. In one version of this example, the additive process 902 may be implemented using a dispensing apparatus 906 which dispenses a precursor 903. The dispensing apparatus 906 may be configured to accept a semiconductor precursor 903a, a conductor precursor 903b, a metal silicide precursor 903c, and a dielectric precursor 903d, and a composition of the precursor 903 that is dispensed by the dispensing apparatus 906 may be obtained by selecting one or more of the semiconductor precursor 903a, the dielectric precursor 903d, the conductor precursor 903b, or the metal silicide precursor 903c, as described in reference to FIG. 8A. Having the dispensing apparatus 906 configured to accept the three precursors 903a, 903b, and 903c may advantageously reduce equipment costs of the dispensing apparatus 906. In another version of this example, the additive process 902 may be implemented using multiple dispensing apparatus 906, working in parallel, each configured to accept the semiconductor precursor 903a, the conductor precursor 903b, and the metal silicide precursor 903c, to independently provide desired compositions for the precursor 903 from each dispensing apparatus 906. Having multiple dispensing apparatus 906 working in parallel may advantageously reduce a process time to form the substrate 905. In a further version of this example, the additive process 902 may be implemented using multiple dispensing apparatus 906, each configured to accept one of the semiconductor precursor 903a, the conductor precursor 903b, or the metal silicide precursor 903c. The multiple dispensing apparatus 906 in such a version may be configured to operate in parallel or in series. Having multiple dispensing apparatus 906, each configured to accept one of the precursors 903a, 903b, or 903c, may advantageously reduce equipment costs and process complexity of the additive process 902.

In one version of this example, the heating process 907 may be implemented using a single localized heating apparatus 908 which is configured to adjust a thermal power, and optionally a radiative spectrum, applied to the precursor 903, depending on a composition of the precursor 903. In another version, the heating process 907 may be implemented using multiple localized heating apparatus 908, each of which is configured to independently adjust thermal power and radiative spectra applied to the precursor 903. In a further version, the heating process 907 may be implemented using multiple localized heating apparatus 908, a first of which is configured to optimally provide thermal power to the precursor 903 having primarily the semiconductor precursor 903a, a second of which is configured to optimally provide thermal power to the precursor 903 having primarily the conductor precursor 903b, and so on. Each implementation of the heating process 907 may provide a desired tradeoff between equipment costs and process time to form the substrate 905.

The precursor 903 may be dispensed to form sublayers of desired compositions, as described in reference to FIG. 8A. Each sublayer is heated by the heating process 907 to convert the precursor 903 in the sublayer to semiconductor material, metal, or metal silicide, as determined by the local composition of the precursor 903. In this way, a p-type semiconductor material 904a is formed on the workpiece 901.

In this example, the additive process 902 and the heating process 907 are used to form a substrate shunting layer 927 in the substrate 905. The substrate shunting layer 927 provides a layer having a low sheet resistance, for example, less than 10 ohms per square, and optionally less than 1 ohm per square, in electrical contact with the p-type semiconductor material 904a. The substrate shunting layer 927 may reduce latch-up during operation of the microelectronic device 900, including radiation-induced latch-up, by shunting localized excess charge and reducing local voltage excursions.

In one version of this example, the substrate shunting layer 927 may have a contiguous mesh configuration, with holes in the mesh. The holes in the mesh may allow formation of the p-type semiconductor material 904a above the substrate shunting layer 927 by providing a seed layer from the underlying p-type semiconductor material 904a below the substrate shunting layer 927. In another version, the substrate shunting layer 927 may have a discontinuous segmented configuration. Other configurations for the substrate shunting layer 927 are within the scope of this example.

The substrate shunting layer 927 may include a first substrate shunting layer 927a having primarily metal silicide with a substantially homogeneous composition. The metal silicide may include, for example, tungsten silicide, platinum silicide, titanium silicide, cobalt silicide, nickel silicide, molybdenum silicide, tantalum silicide, or a combination thereof. The metal silicide may advantageously provide a low resistance electrical connection to the p-type semiconductor material 904a. Forming the substrate shunting layer 927 with a substantially homogeneous composition may advantageously reduce fabrication cost and complexity.

The substrate shunting layer 927 may include a second substrate shunting layer 927b having a metal core 927c surrounded by a metal silicide sheath 927d. The metal core 927c may include, for example, tungsten, nickel, platinum, titanium, molybdenum, cobalt, or aluminum. The metal silicide sheath 927d may include any of the metal silicide materials disclosed for the first substrate shunting layer 927a. The metal core 927c may advantageously provide a low sheet resistance for the second substrate shunting layer 927b, while the metal silicide sheath 927d may provide a low resistance electrical connection between the p-type semiconductor material 904a and the metal core 927c.

The substrate shunting layer 927 may include both the first substrate shunting layer 927a and the second substrate shunting layer 927b, or may include only one or the other. The second substrate shunting layer 927b may be formed under circuits expected to generate substantial current in the underlying p-type semiconductor material 904a, to more effectively reduce localized excess charge or local voltage excursions. The substrate shunting layer 927 may be formed to have different vertical positions in the substrate 905 under different components, to provide more effective reduction of localized excess charge or local voltage excursions. Forming the substrate shunting layer 927 as disclosed in this example may be less costly using the additive process 902 and the heating process 907, compared to using planar processes. Using the additive process 902 and the heating process 907 to form the substrate 905 may enable lower temperature processing compared to planar processing using ion implants and thermal anneals, advantageously reducing thermal stress between the substrate shunting layer 927 and the p-type semiconductor material 904a. Moreover, the lower temperature processing may improve compatibility with the metals in the metal core 927c.

The additive process 902 and the heating process 907 are continued to form an n-type isolation well 904b on the p-type semiconductor material 904a. The substrate shunting layer 927 is formed to be located a desired vertical distance, say 0.5 microns to 2 microns, from a bottom of the n-type isolation well 904b, to provide effective reduction of localized excess charge or local voltage excursions without inducing excess leakage current from the n-type isolation well 904b.

Referring to FIG. 9B, the additive process 902 and the heating process 907 are continued to complete formation of the substrate 905, which extends to a component surface 910 located opposite from the workpiece 901. The additive process 902 and the heating process 907 are used to complete the n-type isolation well 904b, and to form additional p-type semiconductor material 904a over the n-type isolation well 904b. The additive process 902 and the heating process 907 are subsequently used to form a first n-type well 904c in an area for a first PMOS transistor 911a, and to form a second n-type well 904d in an area for a second PMOS transistor 911c. The second n-type well 904d is formed over the n-type isolation well 904b, and is separated from the n-type isolation well 904b by the additional p-type semiconductor material 904a over the n-type isolation well 904b. The additive process 902 and the heating process 907 are subsequently used to form first p-type source and drain regions 904e on the first n-type well 904c in the area for the first PMOS transistor 911a, to form first n-type source and drain regions 904f on the p-type semiconductor material 904a in an area for a first NMOS transistor 911b, to form second p-type source and drain regions 904g on the second n-type well 904d in the area for the second PMOS transistor 911c, and to form second n-type source and drain regions 904h on the additional p-type semiconductor material 904a over the n-type isolation well 904b area for the second NMOS transistor 911d.

The additive process 902 and the heating process 907 are used to form isolation structures 909 in the substrate 905, using the dielectric precursor 903d. The dielectric precursor 903d may include, for example, fluid precursors and nanoparticles for forming silicon dioxide, silicon nitride, silicon oxynitride, boron nitride, aluminum oxide, or titanium oxide. The isolation structures 909 laterally separate the transistors 911a, 911b, 911c, and 911d. The isolation structures 909 may include, for example, amorphous or polycrystalline dielectric material, such as silicon dioxide, silicon nitride, silicon oxynitride, boron nitride, aluminum oxide, or titanium oxide.

The substrate shunting layer 927 may be formed to have varying depths in the substrate 905 from the component surface 910, to provide effective reduction of localized excess charge or local voltage excursions without inducing excess leakage current from components of the microelectronic device 900. The substrate shunting layer 927 may be formed to have varying sheet resistances under different components to further provide effective reduction of localized excess charge or local voltage excursions.

Gate structures 925 are formed on the component surface 910 in the areas for the first PMOS transistor 911a, the first NMOS transistor 911b, the second PMOS transistor 911c, and the second NMOS transistor 911d. The gate structures 925 may include gate dielectric layers on the component surface 910 and gates on the gate dielectric layers, any of which may be formed by planar processes.

Figure 10A:
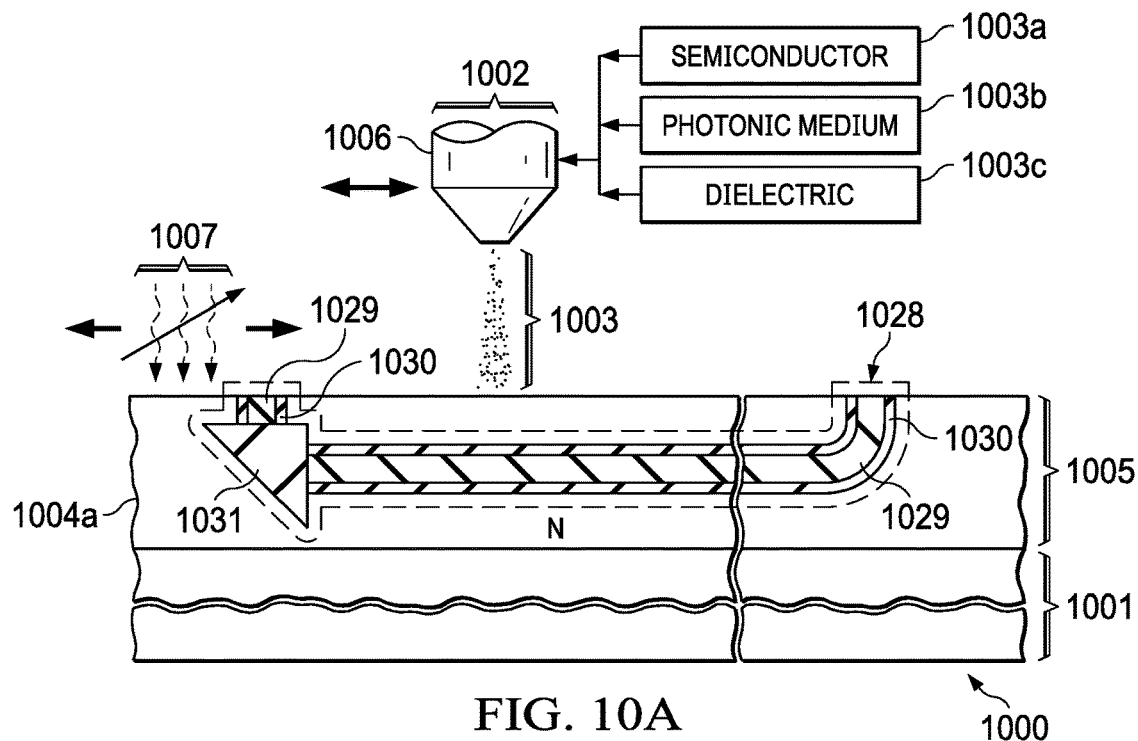
FIG. 10A and FIG. 10B are cross sections of a microelectronic device depicted in stages of another example method of formation.
Figure 10B:
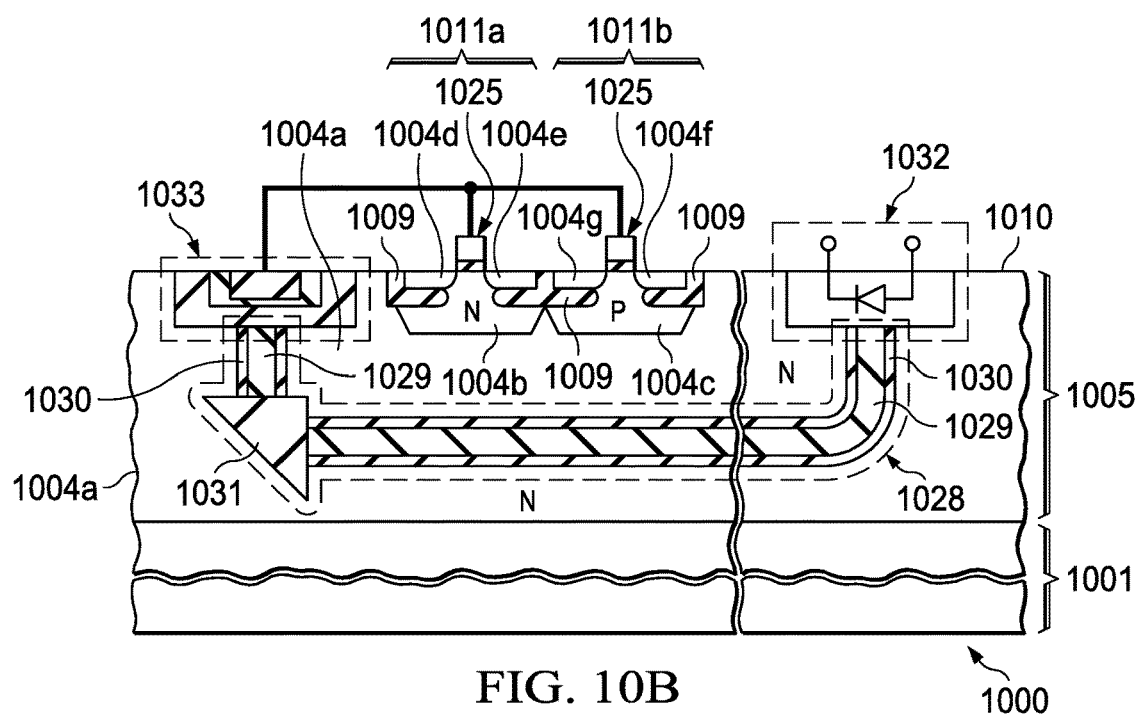

FIG. 10A and FIG. 10B are cross sections of a microelectronic device depicted in stages of another example method of formation. Referring to FIG. 10A, the microelectronic device 1000 is formed on a workpiece 1001, which has a crystalline structure. An additive process 1002 and a heating process 1007 form a substrate 1005 of the microelectronic device 1000 on the workpiece 1001. The additive process 1002 of this example is implemented to dispense a precursor 1003, which may be any combination of a semiconductor precursor 1003a, a photonic medium precursor 1003b, and a dielectric precursor 1003c. The additive process 1002 may be implemented in any of the modes disclosed in the examples herein, for example the modes disclosed in reference to the additive process 902 of FIG. 9A and FIG. 9B. The photonic medium precursor 1003b includes precursors for forming a photonic transmission medium. The photonic transmission medium transmits photonic signals in a desired wavelength band, such as the visible band, from about 400 nanometers to about 800 nanometers, the near infrared (IR) band, from about 800 nanometers to about 2 microns, the midwave IR band, from about 2 microns to about 5 microns, or the terahertz (THz) band, from about 30 microns to about 3000 microns. To form the photonic transmission medium for the visible band, the photonic medium precursor 1003b may include, for example, HSQ, MSQ, TEOS, or BTBAS. To form the photonic transmission medium for the near IR band, the photonic medium precursor 1003b may include, for example, metal organic reagents for barium fluoride, calcium fluoride, or zinc selenide. To form the photonic transmission medium for the midwave IR band, the photonic medium precursor 1003b may include, for example, metal organic reagents for zinc selenide, cadmium telluride, cesium bromide, cesium iodide, or arsenic trisulfide. To form the photonic transmission medium for the THz band, the photonic medium precursor 1003b may include, for example, polymers such as polymethylpentene, polyethylene, polypropylene, or polytetrafluoroethylene, optionally with nanoparticles of titanium oxide, zirconium oxide, aluminum oxide, barium sulfate, or zinc sulfide, to increase an index of refraction of the photonic transmission medium.

The heating process 1007 may be implemented as one or more localized heating processes, optionally with adjustable power outputs, as indicated schematically in FIG. 10A. The heating process 1007 may be scanned relative to the workpiece 1001 to heat desired areas of the substrate 1005. The heating process 1007 may be implemented according to any of the examples disclosed herein, for example, using a laser, an LED, or other radiant heat apparatus.

The precursor 1003 may be dispensed to form sublayers of desired compositions, as described in reference to FIG. 8A. Each sublayer is heated by the heating process 1007 to convert the precursor 1003 in the sublayer to semiconductor material, the photonic transmission medium, or dielectric material, as determined by the local composition of the precursor 1003.

The additive process 1002 and the heating process 1007 form an n-type semiconductor material 1004a on the workpiece 1001. The additive process 1002 and the heating process 1007 further form a photonic transmission conduit 1028 in the substrate 1005. The photonic transmission conduit 1028 includes a photonic transmission core 1029, and may optionally include a reflective sheath 1030 surrounding the photonic transmission core 1029. The photonic transmission core 1029 is formed using the photonic medium precursor 1003b, and has a composition that is appropriate for transmission of photonic signals to be transmitted through the photonic transmission conduit 1028 during operation of the microelectronic device 1000. The reflective sheath 1030, if formed, may have a refractive index lower than a refractive index of the photonic transmission core 1029, to provide internal reflection at a boundary between the photonic transmission core 1029 and the reflective sheath 1030, advantageously reducing loss of the photonic signals. The photonic transmission conduit 1028 may optionally include one or more photonic signal processing elements 1031, such as a reflector, as depicted in FIG. 10A. The photonic signal processing elements 1031 may be formed using any combinations of the semiconductor precursor 1003a, the photonic medium precursor 1003b, and the dielectric precursor 1003c.

Referring to FIG. 10B, the additive process 1002 and the heating process 1007 of FIG. 10A are continued to form the substrate 1005. The substrate 1005 extends to a component surface 1010, located opposite from the workpiece 1001. In this example, the substrate 1005 includes an n-type well 1004b of n-type semiconductor material, formed on the n-type semiconductor material 1004a, and a p-type well 1004c of p-type semiconductor material, formed on the n-type semiconductor material 1004a. The substrate 1005 also includes a p-type source 1004d and a p-type drain 1004e of a PMOS transistor 1011a, formed on the n-type well 1004b, and includes an n-type source 1004f and an n-type drain 1004g of an NMOS transistor 1011b, formed on the p-type well 1004c. The n-type well 1004b, the p-type well 1004c, the p-type source 1004d, the p-type drain 1004e, the n-type source 1004f, and the n-type drain 1004g may be formed by the additive process 1002 and the heating process 1007, or may optionally be formed by planar processes.

The additive process 1002 and the heating process 1007 are further used to form isolation structures 1009 which laterally isolate the PMOS transistor 1011a and the NMOS transistor 1011b. The isolation structures 1009 may include dielectric material, and may be formed using the dielectric precursor 1003c of FIG. 10A. In this example, the isolation structures 1009 may partially underlap the p-type source 1004d, the p-type drain 1004e, the n-type source 1004f, and the n-type drain 1004g, as depicted in FIG. 10B, to reduce junction capacitances between the n-type well 1004b and the p-type source and drain 1004d and 1004e, and between the p-type well 1004c and the n-type source and drain 1004f and 1004g. Reducing the junction capacitances may advantageously enable the PMOS transistor 1011a and the NMOS transistor 1011b to operate at higher speeds, compared to transistors with conventional isolation structures that do not underlap source/drain regions. Forming the isolation structures 1009 so as to partially underlap the p-type source 1004d, the p-type drain 1004e, the n-type source 1004f, and the n-type drain 1004g may be accomplished at lower fabrication cost and complexity compared to using planar processes, due to difficulty in forming the underlapping portions of the isolation structures 1009 using planar processes.

The microelectronic device 1000 further includes a photonic signal emitter 1032 which is coupled to the photonic transmission conduit 1028. The photonic signal emitter 1032 may be located in the substrate 1005, as depicted in FIG. 10B, or may be located outside of the substrate 1005. The photonic signal emitter 1032, if located in the substrate 1005, may be formed by the additive process 1002 and the heating process 1007, or may be formed by another method. The microelectronic device 1000 also includes a photonic signal detector 1033, which is coupled to the photonic transmission conduit 1028, at a different location from the photonic signal emitter 1032. The photonic signal detector 1033 may be located in the substrate 1005, as depicted in FIG. 10B, or may be located outside of the substrate 1005. The photonic signal detector 1033, if located in the substrate 1005, may be formed by the additive process 1002 and the heating process 1007, or may be formed by another method.

Gate structures 1025 are formed on the component surface 1010 in the areas for the PMOS transistor 1011a and the NMOS transistor 1011b. The gate structures 1025 may include gate dielectric layers on the component surface 1010 and gates on the gate dielectric layers, any of which may be formed by planar processes. During operation of the microelectronic device 1000, photonic signals may be emitted by the photonic signal emitter 1032, transmitted through the photonic transmission conduit 1028, and converted to electrical signals by the photonic signal detector 1033. The PMOS transistor 1011*a* and the NMOS transistor 1011*b* may be electrically coupled to the photonic signal detector 1033, as indicated schematically in FIG. 10B, so that the electrical signals from the photonic signal detector 1033 may be used by a circuit which includes the PMOS transistor 1011*a* and the NMOS transistor 1011*b*. Alternatively, the PMOS transistor 1011*a* and the NMOS transistor 1011*b* may be electrically coupled to the photonic signal emitter 1032, so that the electrical signals from the PMOS transistor 1011*a* and the NMOS transistor 1011*b* may be used to generate the photonic signals from the photonic signal emitter 1032. The photonic transmission conduit 1028 may provide a channel for transmission of signals in the substrate 1005 which is advantageously immune to interference from circuits in the microelectronic device 1000. Forming the photonic transmission conduit 1028 by the additive process 1002 and the heating process 1007 may provide a lower fabrication cost than forming the photonic transmission conduit 1028 by other methods.

Figure 11A:
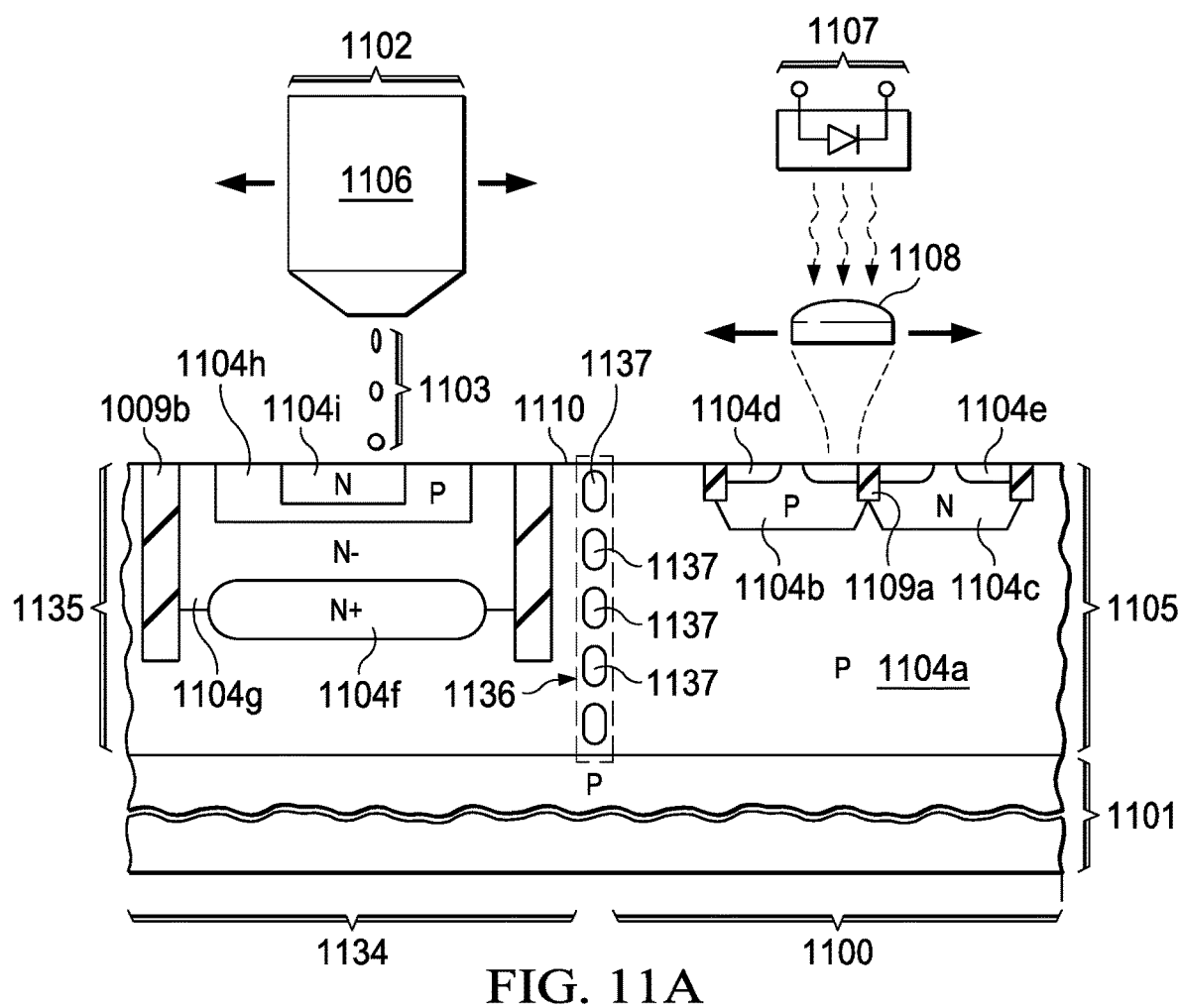
FIG. 11A through FIG. 11C are cross sections of a microelectronic device depicted in stages of a further example method of formation.
Figure 11B:
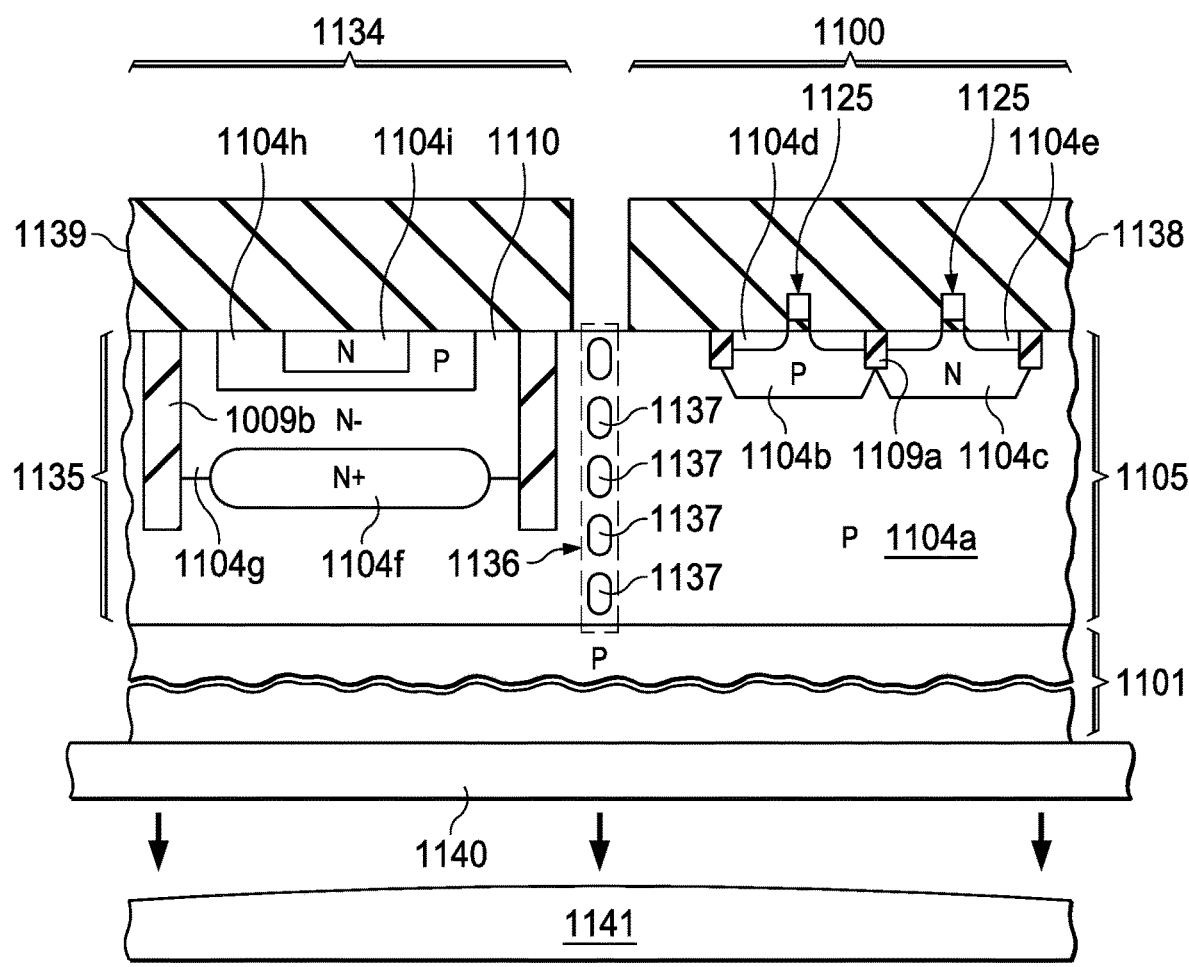
Figure 11C:
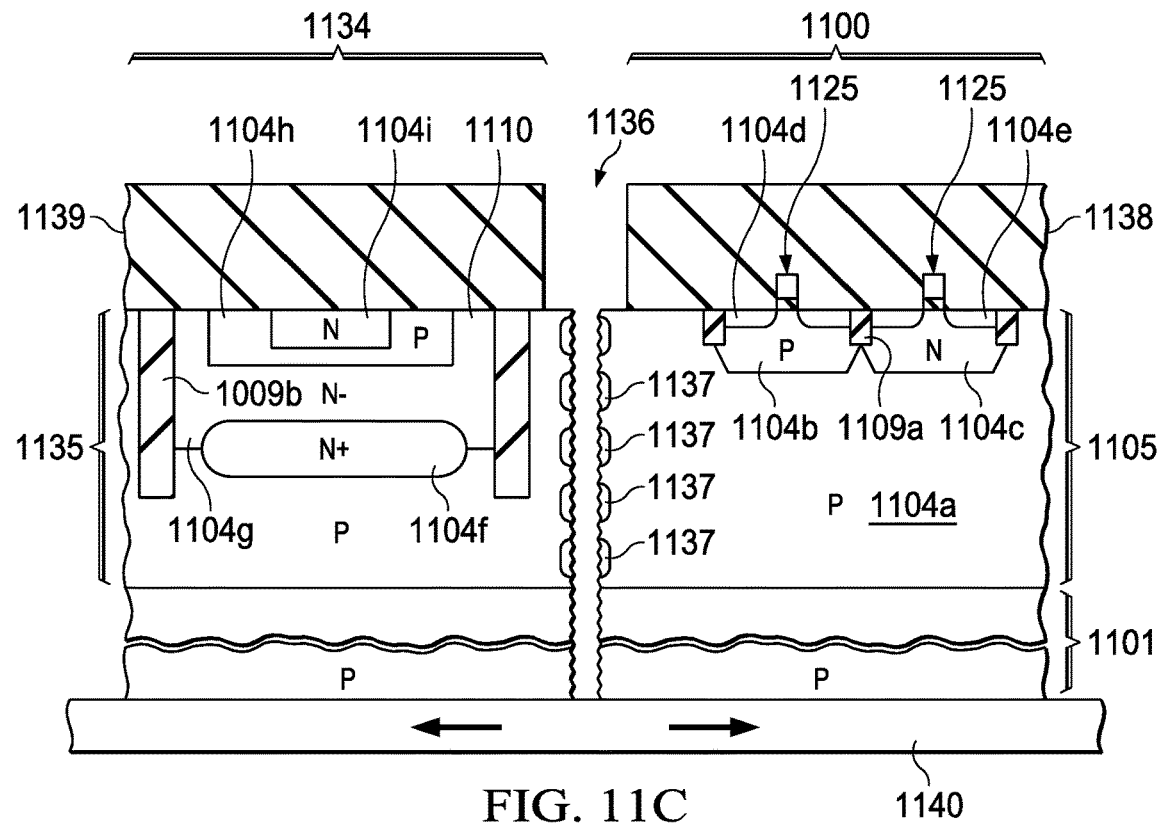

FIG. 11A through FIG. 11C are cross sections of a microelectronic device depicted in stages of a further example method of formation. Referring to FIG. 11A, the microelectronic device 1100, which is a first microelectronic device 1100 in this example, and a second microelectronic device 1134 are formed on a workpiece 1101. The workpiece 1101 has a crystalline structure. The first microelectronic device 1100 has a first substrate 1105, and the second microelectronic device 1134 has a second substrate 1135. The first microelectronic device 1100 is laterally separated from the second microelectronic device 1134 by a singulation region 1136.

The first substrate 1105 and the second substrate 1135 are formed concurrently by an additive process 1102 and a heating process 1107. The additive process 1102 may be implemented with one or more separate additive apparatus 1106, each dispensing a precursor 1103. In one version of this example, the additive process 1102 may use multiple identical additive apparatus 1106, operating in parallel, each dispensing the precursor 1103 with varying compositions, as needed to form elements of the first substrate 1105 and the second substrate 1135. In another version, the additive process 1102 may use multiple different additive apparatus 1106, each dispensing the precursor 1103 with separate, unvarying, compositions, as needed to form elements of the first substrate 1105 and the second substrate 1135. In a further version, the additive process 1102 may use multiple different additive apparatus 1106, each dispensing the precursor 1103 with separate compositions for classes of materials, such as semiconductor, dielectric, and metal silicide, as needed to form elements of the first substrate 1105 and the second substrate 1135.

The heating process 1107 may be implemented as disclosed in any of the examples herein. In one version of this example, the heating process 1107 may use multiple radiative heating apparatus 1108, operating in parallel, each varying power output, and optionally radiative wavelength spectra, as needed to convert the precursor 1103 to desired solid material compositions. In another version, the heating process 1107 may use multiple radiative heating apparatus 1108, each having fixed power output and radiative wavelength spectra, wherein different radiative heating apparatus 1108 are used for different compositions of the precursor 1103.

The first substrate 1105, the second substrate 1135, and the singulation region 1136 are formed concurrently, sublayer by sublayer, using the additive process 1102 and the heating process 1107. The additive process 1102 dispenses the precursor 1103 across the workpiece 1101 to form a first sublayer of the precursor 1103 which extends across the first substrate 1105, the second substrate 1135, and the singulation region 1136. The heating process 1107 heats the precursor 1103 in the first sublayer to convert the precursor 1103 to solid material. In the case depicted in FIG. 11A, the precursor 1103 is for a p-type semiconductor material 1104*a*, across the first substrate 1105, the second substrate 1135, and the singulation region 1136. Subsequently, the additive process 1102 dispenses the precursor 1103 on the p-type semiconductor material 1104*a*, to form a second sublayer of the precursor 1103 which extends across the first substrate 1105, the second substrate 1135, and the singulation region 1136. The heating process 1107 heats the precursor 1103 in the second sublayer to convert the precursor 1103 to solid material. The additive process 1102 forms subsequent sublayers of the precursor 1103, each sublayer extending across the first substrate 1105, the second substrate 1135, and the singulation region 1136. A local composition of each sublayer is adjusted to provide the desired solid material of the first substrate 1105. The heating process 1107 heats the precursor 1103 in the instant sublayer to convert the precursor 1103 to solid material, prior to forming the next sublayer. The iterative process of forming a sublayer of the precursor 1103 by the additive process 1102, and heating the precursor 1103 in the sublayer to convert the precursor 1103 to solid material of the first substrate 1105, is continued to complete formation of the first substrate 1105, the second substrate 1135, and the singulation region 1136. The first substrate 1105, the second substrate 1135, and the singulation region 1136 extend to a component surface 1110, located opposite from the workpiece 1101.

In this example, the first substrate 1105 and the second substrate 1135 have different structures. In one aspect of this example, the first substrate 1105 may be formed to include structures such as wells, buried layers, sources and drains, or isolation structures, which are not formed in the second substrate 1135, and vice versa. In another aspect, corresponding structures in the first substrate 1105 and the second substrate 1135 may have different spatial dimensions, different dopant polarities, or dopant densities, which would prevent the corresponding structures from being formed concurrently using planar processes. In a further aspect, the first microelectronic device 1100 and the second microelectronic device 1134 may have different components or circuits. By way of example, the first substrate 1105 may include a p-type well 1104*b* on the p-type semiconductor material 1104*a*, an n-type well 1104*c* on the p-type semiconductor material 1104*a*, n-type source/drain regions 1104*d* of an NMOS transistor on the p-type well 1104*b*, p-type source/drain regions 1104*e* of a PMOS transistor on the n-type well 1104*c*, and shallow isolation structures 1109*a* of dielectric material. The second substrate 1135 may include an n-type buried layer 1104*f* on the p-type semiconductor material 1104*a*, an n-type collector 1104*g* of a bipolar junction transistor on the n-type buried layer 1104*f*, a p-type base 1104*h* of the bipolar junction transistor on the n-type collector 1104*g*, an n-type emitter 1104*i* of the bipolar junction transistor on the p-type base 1104*h*, and deep isolation structures 1109*b* of dielectric material.

Forming the first substrate 1105 concurrently with the second substrate 1135 may be accomplished using the additive process 1102 and the heating process 1107 at a lower cost and with less process complexity than by using planar processes. The workpiece 1101 may accommodate multiple microelectronic devices having multiple designs, which may advantageously provide lower fabrication costs for desired quantities of the multiple designs, compared to fabricating multiple workpieces, each having microelectronic devices of one of the multiple designs. This capability may be particularly advantageous for fabrication facilities which produce multiple products, in small quantities for each product.

The singulation region 1136 includes singulation assist structures 1137, which may extend from proximate to the workpiece 1101 to proximate to the component surface 1110, as depicted in FIG. 11A. The singulation assist structures 1137 include one or more materials different from the surrounding semiconductor material, such as the p-type semiconductor material 1104a, which have mechanical properties that facilitate singulation of the first substrate 1105 from the second substrate 1135. Singulation refers to a process of physically separating the first substrate 1105 from the second substrate 1135. The singulation assist structures 1137 may include, for example, OSG or lightly aggregated dielectric microparticles, which have lower mechanical strength than the surrounding semiconductor material.

Referring to FIG. 11B, gate structures 1125 are formed on the component surface 1110 over the p-type well 1104b and the n-type well 1104c. A first interconnect region 1138 of the first microelectronic device 1100 is formed on the component surface 1110 over the first substrate 1105. A second interconnect region 1139 of the second microelectronic device 1134 is formed on the component surface 1110 over the second substrate 1135. The first interconnect region 1138 includes electrically conductive interconnect members, such as interconnect lines, vias, and contacts, which electrically couple components of the first microelectronic device 1100 to each other. Similarly, the second interconnect region 1139 includes electrically conductive interconnect members which electrically couple components of the second microelectronic device 1134 to each other. A spatial configuration of the electrically conductive interconnect members in the first interconnect region 1138 and a spatial configuration of the electrically conductive interconnect members in the second interconnect region 1139 may be different, due to differences in the circuits or components between the first microelectronic device 1100 and the second microelectronic device 1134. The first interconnect region 1138 and the second interconnect region 1139 may optionally terminate adjacent to the singulation region 1136, to further assist singulation of the first microelectronic device 1100 from the second microelectronic device 1134.

Singulation tape 1140, sometimes referred to as saw tape, is applied to the workpiece 1101, on a surface opposite from the first substrate 1105, the second substrate 1135, and the singulation region 1136. The singulation tape 1140 has an adhesive that adheres to the workpiece 1101. The singulation tape 1140 may be mounted in a frame, not shown, to maintain the first microelectronic device 1100 and the second microelectronic device 1134 in a planar orientation after singulation.

The workpiece 1101 is disposed onto a singulation fixture 1141, which may have a domed face contacting the singulation tape 1140. Disposing the workpiece 1101 onto the singulation fixture 1141 causes lateral stress to pull apart the singulation assist structures 1137, separating the first microelectronic device 1100 from the second microelectronic device 1134 along the singulation region 1136. Other methods and fixtures to separate the first microelectronic device 1100 from the second microelectronic device 1134, such as roller fixtures, are within the scope of this example. Further, separation of the first microelectronic device 1100 from the second microelectronic device 1134 may be achieved by sawing, mechanical scribing, laser scribing, or other methods. The singulation assist structures 1137 may advantageously reduce process times and costs for the singulation process.

Referring to FIG. 11C, the singulation tape 1140 may be stretched to laterally separate the first microelectronic device 1100 from the second microelectronic device 1134. Lateral separation may facilitate removal of the first microelectronic device 1100 from the singulation tape 1140. The first microelectronic device 1100 may be removed from the singulation tape 1140 using a pick-and-place process, for example.

Figure 12A:
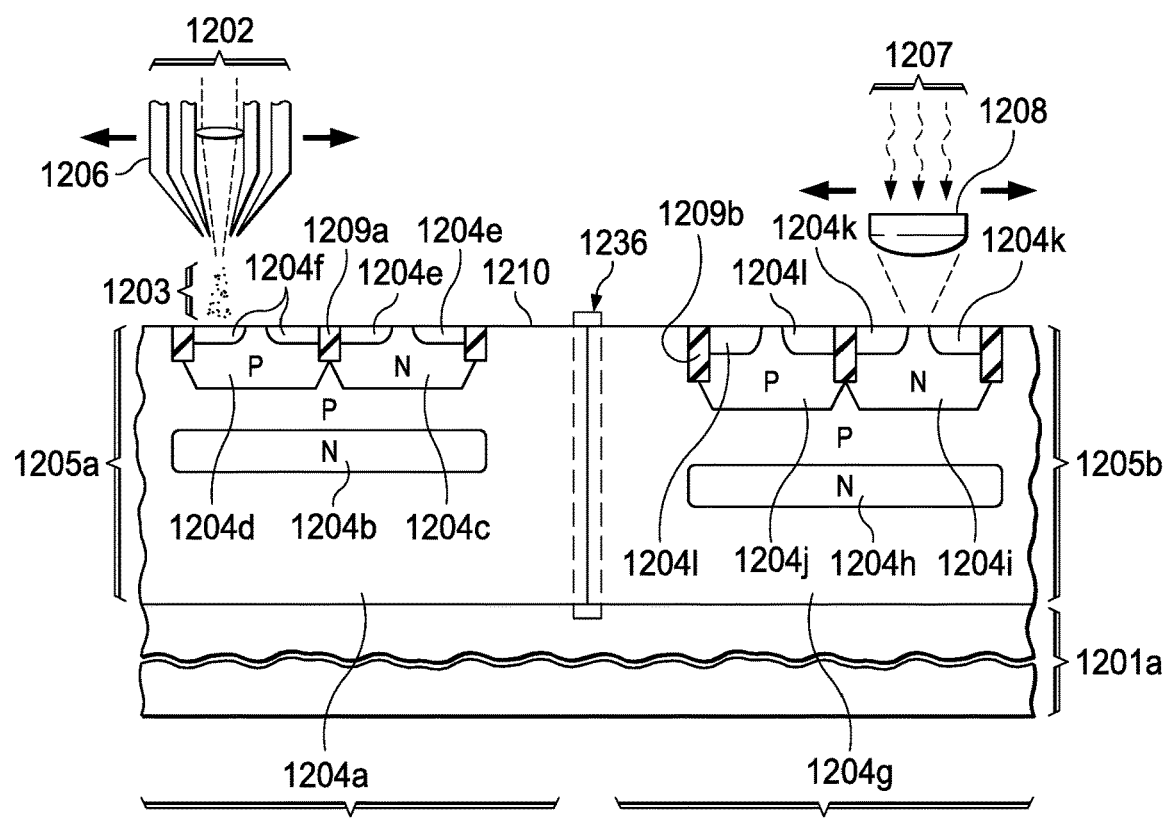
FIG. 12A through FIG. 12C are cross sections of a microelectronic device depicted in stages of another example method of formation.
Figure 12B:
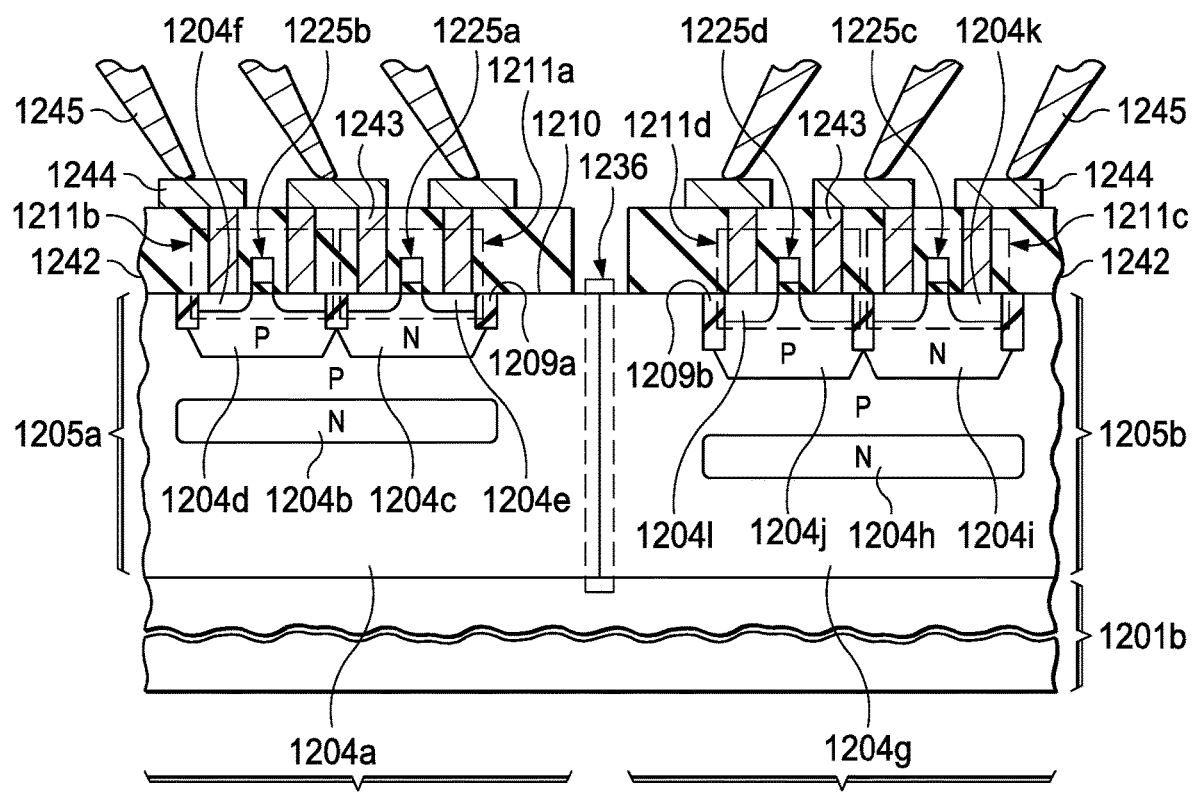
Figure 12C:
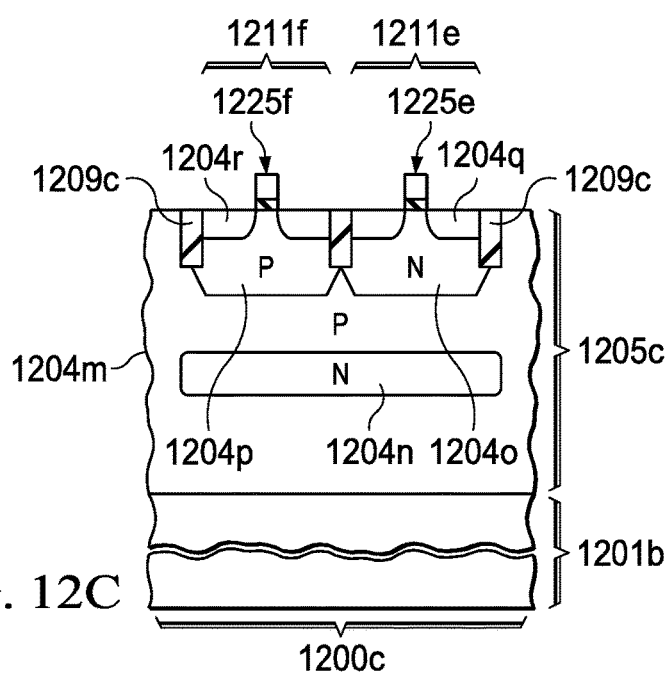

FIG. 12A through FIG. 12C are cross sections of a microelectronic device depicted in stages of another example method of formation. Referring to FIG. 12A, a first test microelectronic device 1200a and a second test microelectronic device 1200b are formed on a first workpiece 1201a. The first workpiece 1201a has a crystalline structure. The first test microelectronic device 1200a has a first substrate 1205a, and the second test microelectronic device 1200b has a second substrate 1205b. The first test microelectronic device 1200a may be laterally separated from the second test microelectronic device 1200b by a singulation region 1236. In this example, the first test microelectronic device 1200a and the second test microelectronic device 1200b are versions of a same device, so that the first test microelectronic device 1200a and the second test microelectronic device 1200b have corresponding components, such as transistors, and circuits. The components of the first test microelectronic device 1200a and the second test microelectronic device 1200b include elements in the first substrate 1205a and the second substrate 1205b. The elements of the components include wells, source and drain regions, buried layers, isolation structural elements, and such. In this example, a first set of elements in the first substrate 1205a, and a second set of elements in the second substrate 1205b, corresponding to the first set of elements, that is, providing similar functionalities as the first set of elements, have at least one physical parameter that is different between the first set of elements and the second set of elements. The physical parameter may be an average dopant density, a lateral or vertical dimension, or a location relative to other components. The first test microelectronic device 1200a and the second test microelectronic device 1200b may be evaluated, for example by electrical testing, to estimate an impact of the physical parameter on performance of the first test microelectronic device 1200a, based on differences in performance between the first test microelectronic device 1200a and the second test microelectronic device 1200b. The estimate of the impact of the physical parameter on performance of the first test microelectronic device 1200a may be used to form the microelectronic device 1200c, shown in FIG. 12C, with improved performance compared to performances of the first test microelectronic device 1200a and the second test microelectronic device 1200b.

The first substrate 1205a and the second substrate 1205b are formed concurrently by a first additive process 1202 and a first heating process 1207. The first additive process 1202 may be implemented with one or more separate first additive apparatus 1206, depicted in FIG. 12A as a directed energy process apparatus 1206, each dispensing a first precursor

1203. The first precursor 1203 may include one or more semiconductor precursors, one or more dielectric precursors, and so on, as needed to form elements of the first substrate 1205*a* and the second substrate 1205*b*. The first heating process 1207 may be implemented as disclosed in any of the examples herein. The first heating process 1207 may be implemented with one or more first radiative heating apparatus 1208, depicted in FIG. 12A as a scanned focused radiative heating apparatus 1208.

The first substrate 1205*a*, the second substrate 1205*b*, and the singulation region 1236 are formed concurrently, sublayer by sublayer, using the first additive process 1202 and the first heating process 1207, for example as disclosed in reference to FIG. 11A and FIG. 11B. The first substrate 1205*a*, the second substrate 1205*b*, and the singulation region 1236 extend to a component surface 1210, located opposite from the first workpiece 1201*a*.

The first substrate 1205*a* and the second substrate 1205*b* include corresponding elements, formed by the first additive process 1202 and the first heating process 1207. By way of example, the first substrate 1205*a* may include a first p-type semiconductor material 1204*a*, a first n-type buried layer 1204*b* in the first p-type semiconductor material 1204*a*, a first n-type well 1204*c* on the first p-type semiconductor material 1204*a* and over the first n-type buried layer 1204*b*, a first p-type well 1204*d* on the first p-type semiconductor material 1204*a* and over the first n-type buried layer 1204*b*, first p-type source/drain regions 1204*e* on the first n-type well 1204*c*, first n-type source/drain regions 1204*f* on the first p-type well 1204*d*, and first isolation structures 1209*a* laterally surrounding the first p-type source/drain regions 1204*e* and the first n-type source/drain regions 1204*f*. The second substrate 1205*b* includes corresponding elements: a second p-type semiconductor material 1204*g*, a second n-type buried layer 1204*h* in the second p-type semiconductor material 1204*g*, a second n-type well 1204*i* on the second p-type semiconductor material 1204*g* and over the second n-type buried layer 1204*h*, a second p-type well 1204*j* on the second p-type semiconductor material 1204*g* and over the second n-type buried layer 1204*h*, second p-type source/drain regions 1204*k* on the second n-type well 1204*i*, second n-type source/drain regions 1204*l* on the second p-type well 1204*j*, and second isolation structures 1209*b* laterally surrounding the second p-type source/drain regions 1204*k* and the second n-type source/drain regions 1204*l*.

The corresponding elements of the first substrate 1205*a* and the second substrate 1205*b* are formed to have at least one physical parameter that has different values for the corresponding elements. By way of example, the first p-type semiconductor material 1204*a* may have a higher average dopant density than the second p-type semiconductor material 1204*g*. The first n-type buried layer 1204*b* may be located closer to the component surface 1210 than the second n-type buried layer 1204*h*. The second n-type well 1204*i* may extend deeper from the component surface 1210 than the first n-type well 1204*c* and may have a lower average dopant density than the first n-type well 1204*c*. Similarly, the second p-type well 1204*j* may extend deeper from the component surface 1210 than the first p-type well 1204*d* and may have a lower average dopant density than the first p-type well 1204*d*. The second p-type source/drain regions 1204*k* may extend deeper from the component surface 1210 than the first p-type source/drain regions 1204*e* and may have lower average dopant densities than the first p-type source/drain regions 1204*e*. Similarly, the second n-type source/drain regions 1204*l* may extend deeper from the component surface 1210 than the first n-type source/drain regions 1204*f* and may have lower average dopant densities than the first n-type source/drain regions 1204*f*. The first isolation structures 1209*a* may extend deeper from the component surface 1210 than the second isolation structures 1209*b*.

Referring to FIG. 12B, a first gate structure 1225*a* and a second gate structure 1225*b* are formed on the first n-type well 1204*c* and the first p-type well 1204*d*, respectively, and a third gate structure 1225*c* and a fourth gate structure 1225*d* are formed on the second n-type well 1204*i* and the second p-type well 1204*j*, respectively. The first gate structure 1225*a* the second gate structure 1225*b*, the third gate structures 1225*c*, and the fourth gate structure 1225*d* may be formed by planar processes. The first gate structure 1225*a* and the first p-type source/drain regions 1204*e* are elements of a first PMOS transistor 1211*a* of the first test microelectronic device 1200*a*. The second gate structure 1225*b* and the first n-type source/drain regions 1204*f* are elements of a first NMOS transistor 1211*b* of the first test microelectronic device 1200*a*. Similarly, the third gate structure 1225*c* and the second p-type source/drain regions 1204*k* are elements of a second PMOS transistor 1211*c* of the second test microelectronic device 1200*b*. The fourth gate structure 1225*d* and the second n-type source/drain regions 1204*l* are elements of a second NMOS transistor 1211*d* of the second test microelectronic device 1200*b*.

A pre-metal dielectric (PMD) layer 1242 may be formed over the component surface 1210, over the first substrate 1205*a* and the second substrate 1205*b*. The PMD layer 1242 may include one or more sub-layers of dielectric material, for example a PMD liner of silicon nitride, a layer of silicon dioxide-based material formed by a high density plasma (HDP) or a chemical vapor deposition (CVD) process using TEOS and ozone, a layer of silicon dioxide-based material such as PSG or BPSG, and a cap layer of silicon nitride, silicon oxynitride, silicon carbide or silicon carbide nitride. Contacts 1243 may be formed through the PMD layer 1242 to make electrical connections to the components of the first test microelectronic device 1200*a* and the second test microelectronic device 1200*b*, including the first p-type source/drain regions 1204*e*, the first n-type source/drain regions 1204*f*, the second p-type source/drain regions 1204*k*, and the second n-type source/drain regions 1204*l*, as depicted in FIG. 12B. The contacts 1243 may be formed by etching contact holes through the PMD layer 1242, and forming a titanium liner, followed by a titanium nitride liner, extending into the contact holes. A layer of tungsten is formed, by a metal organic chemical vapor deposition (MOCVD) process, on the titanium nitride liner, filling the contact holes. The tungsten, titanium nitride and titanium are removed from over a top surface of the PMD layer 1242 by a tungsten CMP process, leaving the tungsten fill metal, titanium nitride liner and titanium liner in the contact holes to provide the contacts 1243. Probe pads 1244 may be formed on the PMD layer 1242, making electrical connections to the contacts 1243. The probe pads 1244 may be formed be forming an adhesion layer, which may include titanium, on the PMD layer 1242 and the contacts 1243, and forming a pad layer, which may include primarily aluminum, on the adhesion layer. An etch mask is formed over the pad layer, by a photolithographic process, and the pad layer and adhesion layer are removed where exposed by the etch mask by an etch process, such as an RIE process, leaving the probe pads 1244 on the contacts 1243.

The first test microelectronic device 1200*a* and the second test microelectronic device 1200*b* may be evaluated, for example by electrical testing. Electrical testing may be performed by using probe tips 1245 on the probe pads 1244 to electrically connect the components in the first test microelectronic device 1200a and the second test microelectronic device 1200b to an electrical test apparatus, not shown. Electrical parameters of the components in the first test microelectronic device 1200a and the second test microelectronic device 1200b may be compared. For example, on-state currents, off-state currents, and threshold voltages, first PMOS transistor 1211a may be compared to corresponding parameters of the second PMOS transistor 1211c. Other methods of evaluating the first test microelectronic device 1200a and the second test microelectronic device 1200b, such as construction analysis using cross section samples and a transmission electron microscope (TEM), are within the scope of this example. Comparison of the parameters of the first PMOS transistor 1211a versus the second PMOS transistor 1211c, in conjunction with the physical parameters of the first p-type semiconductor material 1204a versus the second p-type semiconductor material 1204g, the first n-type buried layer 1204b versus the second n-type buried layer 1204h, the first n-type well 1204c versus the second n-type well 1204i, the first p-type source/drain regions 1204e versus the second p-type source/drain regions 1204k, and the first isolation structures 1209a versus the second isolation structures 1209b, may enable an estimate of optimum physical parameters for elements of a third PMOS transistor 1211e, shown in FIG. 12C, in the microelectronic device 1200c. Similarly, comparison of the parameters of the first NMOS transistor 1211b versus the second NMOS transistor 1211d, in conjunction with the physical parameters of the first p-type semiconductor material 1204a versus the second p-type semiconductor material 1204g, the first n-type buried layer 1204b versus the second n-type buried layer 1204h, the first p-type well 1204d versus the second p-type well 1204j, the first n-type source/drain regions 1204f versus the second n-type source/drain regions 1204l, and the first isolation structures 1209a versus the second isolation structures 1209b, may enable an estimate of optimum physical parameters for elements of a third NMOS transistor 1211f, shown in FIG. 12C, in the microelectronic device 1200c.

Referring to FIG. 12C, the microelectronic device 1200c is formed to be a version of the same device as the first test microelectronic device 1200a and the second test microelectronic device 1200b. The microelectronic device 1200c has components, such as transistors, and circuits, corresponding to the components in the first test microelectronic device 1200a and the second test microelectronic device 1200b. The microelectronic device 1200c has elements of the components, including wells, source and drain regions, buried layers, isolation structural elements, and such, that correspond to the elements of the components in the first test microelectronic device 1200a and the second test microelectronic device 1200b. The microelectronic device 1200c is formed so that physical parameters of the elements of the components in the microelectronic device 1200c have values determined by the estimate of optimum physical parameters, using the physical parameters of the first test microelectronic device 1200a and the second test microelectronic device 1200b in conjunction with the evaluation of the first test microelectronic device 1200a and the second test microelectronic device 1200b.

In this example, the microelectronic device 1200c includes a third substrate 1205c. In one version of this example, the third substrate 1205c may be formed on a second workpiece 1201b. In another version, the third substrate 1205c may be implemented as a semiconductor wafer, without a separate workpiece. In one version of this example, the third substrate 1205c may be formed by one or more additive processes. In another version, the third substrate 1205c may be formed by planar processes or other methods.

In this example, the third substrate 1205c may include a third p-type semiconductor material 1204m, a third n-type buried layer 1204n in the third p-type semiconductor material 1204m, a third n-type well 1204o on the third p-type semiconductor material 1204m and over the third n-type buried layer 1204n, a third p-type well 1204p on the third p-type semiconductor material 1204m and over the third n-type buried layer 1204n, third p-type source/drain regions 1204q on the third n-type well 1204o, third n-type source/drain regions 1204r on the third p-type well 1204p, and third isolation structures 1209c laterally surrounding the third p-type source/drain regions 1204q and the third n-type source/drain regions 1204r.

The microelectronic device 1200c includes a fifth gate structure 1225e formed on the third n-type well 1204o. The fifth gate structure 1225e and the third p-type source/drain regions 1204q are elements of a third PMOS transistor 1211e of the microelectronic device 1200c. The microelectronic device 1200c further includes a sixth gate structure 1225f formed on the third p-type well 1204p. The sixth gate structure 1225f and the third n-type source/drain regions 1204r are elements of a third NMOS transistor 1211f of the microelectronic device 1200c. Performance of the third PMOS transistor 1211e, quantified by parameters such as on-state current, off-state current, and threshold voltage, for example, may be better than the performances of the first PMOS transistor 1211a and the second PMOS transistor 1211c. Similarly, performance of the third NMOS transistor 1211f may be better than the performances of the first NMOS transistor 1211b and the second NMOS transistor 1211d.

Forming the first test microelectronic device 1200a and the second test microelectronic device 1200b using the first additive process 1202 and the first heating process 1207 may provide a lower cost for optimizing performance of the microelectronic device 1200c, compared to using planar processes, as variations in the physical parameters between the elements of the first test microelectronic device 1200a and the second test microelectronic device 1200b using planar processes may involve separate photolithographic operations for each element of the components. Additional instances of the microelectronic device 1200c may be mass produced, optionally using planar processes.

Figure 13A:
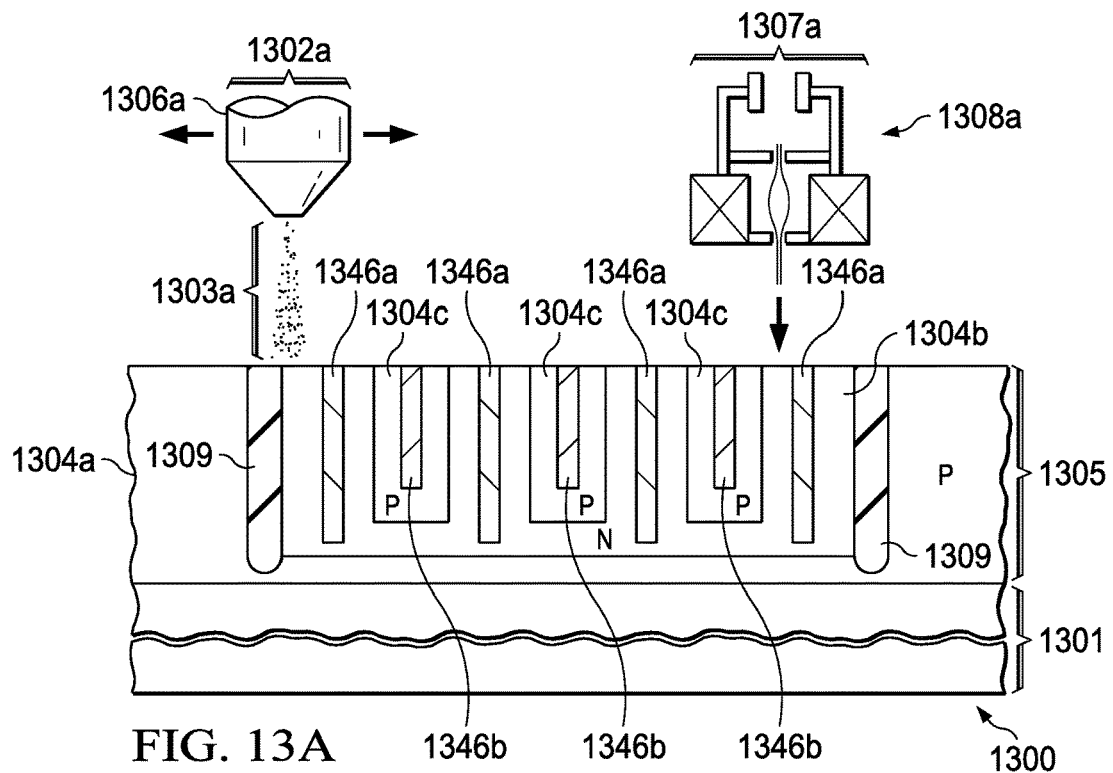
FIG. 13A through FIG. 13C are cross sections of a microelectronic device depicted in stages of a further example method of formation.
Figure 13B:
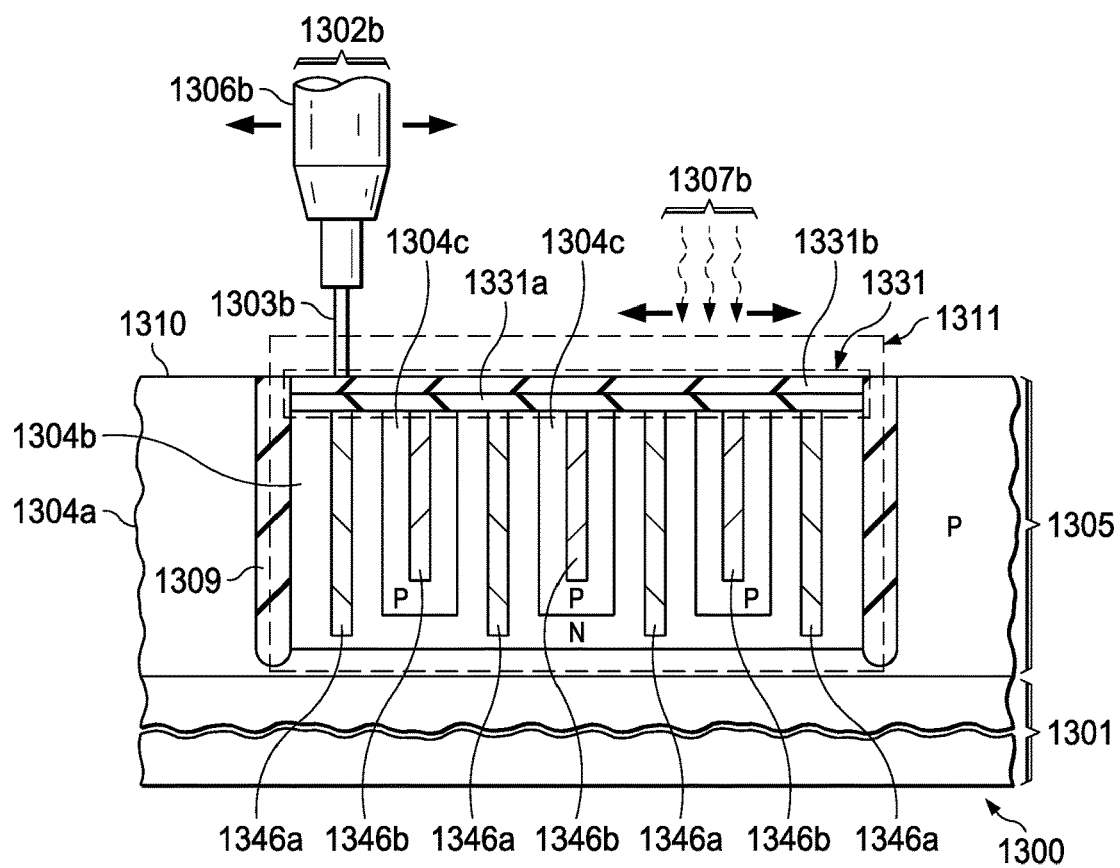
Figure 13C:
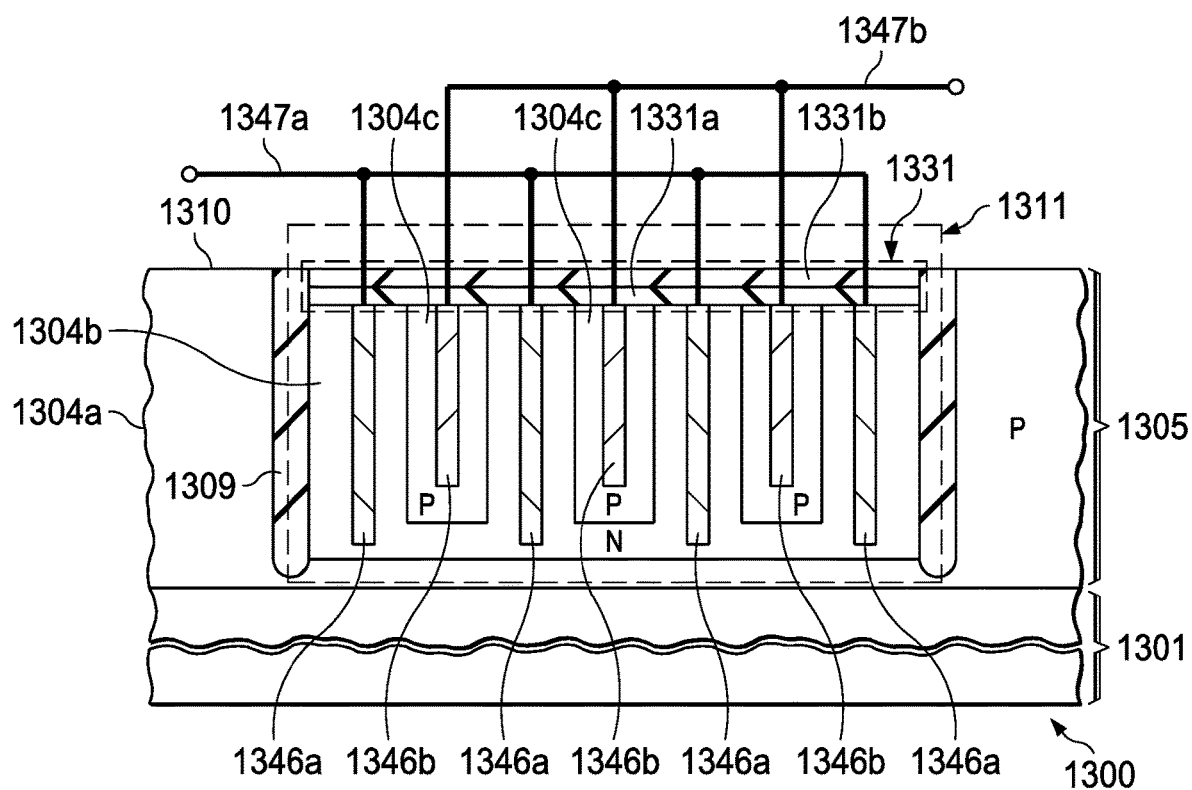

FIG. 13A through FIG. 13C are cross sections of a microelectronic device depicted in stages of a further example method of formation. Referring to FIG. 13A, the microelectronic device 1300 is formed on a workpiece 1301, which has a crystalline structure. A first additive process 1302a and a first heating process 1307a form a substrate 1305 of the microelectronic device 1300 on the workpiece 1301. The first additive process 1302a of this example is implemented to dispense a first precursor 1303a, which may be any combination of a semiconductor precursor, a dielectric precursor, a metal silicide precursor, and a conductive precursor. The first additive process 1302a may be implemented in any of the modes disclosed in the examples herein. FIG. 13A depicts the first additive process 1302a implemented using an electrostatic deposition apparatus 1306a. Other additive apparatus for the first additive process 1302a are within the scope of this example. FIG. 13A depicts the first heating process 1307a implemented using an electron beam apparatus 1308a, which may be moved laterally with respect to the workpiece 1301. Other heating apparatus for the first heating process 1307a are within the scope of this example. The precursor 1303a is dispensed to form sublayers, in which a local composition of the sublayers is adjusted to form semiconductor, dielectric, conductor, and metal silicide elements of the substrate 1305. Each sublayer is heated by the first heating process 1307a to convert the precursor to solid material of the substrate 1305.

The semiconductor elements of the substrate 1305, formed by the first additive process 1302a and the first heating process 1307a, include a p-type semiconductor material 1304a formed on the workpiece 1301, an n-type cathode 1304b formed on the p-type semiconductor material 1304a, and a p-type parallel anode 1304c laterally distributed on the n-type cathode 1304b, as depicted in FIG. 13A. The n-type cathode 1304b may include n-type silicon, and the p-type parallel anode 1304c may include p-type silicon. Alternatively, the n-type cathode 1304b and the p-type parallel anode 1304c may include semiconductor materials having a higher or lower bandgap energy than silicon, to provide enhanced absorption of photons at desired wavelengths. For example, the the n-type cathode 1304b and the p-type parallel anode 1304c may include an alloy semiconductor of silicon and carbon, or an alloy semiconductor of silicon and germanium.

The dielectric elements of the substrate 1305, formed by the first additive process 1302a and by the first heating process 1307a, include a deep isolation structure 1309 laterally surrounding the n-type cathode 1304b. The deep isolation structure 1309 may include silicon dioxide, or silicon dioxide-based dielectric material. The deep isolation structure 1309 may be formed using a different implementation of the first heating process 1307a, such as a radiative heating process, which may be more appropriate for forming dielectric material than the electron beam apparatus 1308a.

The conductor elements of the substrate 1305, formed by the first additive process 1302a and the first heating process 1307a, include a cathode parallel contact plate 1346a laterally distributed on the n-type cathode 1304b, and an anode parallel contact plate 1346b formed on the p-type parallel anode 1304c. The cathode parallel contact plate 1346a and the anode parallel contact plate 1346b may include a metal, such as tungsten, titanium, tantalum, nickel, or a combination thereof, surrounded by a metal silicide, such as tungsten silicide, titanium silicide, platinum silicide, cobalt silicide, or nickel silicide, contacting the n-type cathode 1304b and the p-type parallel anode 1304c.

The p-type parallel anode 1304c, the cathode parallel contact plate 1346a, and the anode parallel contact plate 1346b may have vertical orientations, wherein thickness dimensions of the p-type parallel anode 1304c, the cathode parallel contact plate 1346a, and the anode parallel contact plate 1346b extend in directions parallel to a boundary between the workpiece 1301 and the substrate 1305. A thickness dimension of an element is a minimum dimension of the element, as opposed to a length dimension or a height dimension, both of which are greater than the thickness dimension.

Referring to FIG. 13B, formation of the p-type semiconductor material 1304a, the n-type cathode 1304b, the p-type parallel anode 1304c, the deep isolation structure 1309, the cathode parallel contact plate 1346a, and the anode parallel contact plate 1346b are continued. The n-type cathode 1304b, the p-type parallel anode 1304c, the cathode parallel contact plate 1346a, and the anode parallel contact plate 1346b are elements of a photodetector 1311 of the microelectronic device 1300.

The photodetector 1311 also includes an anti-reflection element 1331 formed over the n-type cathode 1304b and the p-type parallel anode 1304c. The anti-reflection element 1331 may include optically transmissive sublayers 1331a and 1331b, having different values of refraction index, selected to reduce optical reflection from the photodetector 1311. The transmissive sublayers 1331a and 1331b are elements of the substrate 1305. The transmissive sublayers 1331a and 1331b may be formed by a second additive process 1302b, depicted in FIG. 13B as using a material extrusion apparatus 1306b which dispenses an optical dielectric precursor 1303b. A composition of the optical dielectric precursor 1303b may be adjusted to provide the desired values for the refraction index for the transmissive sublayers 1331a and 1331b. For example, the optically transmissive sublayer 1331a may include titanium oxide, zirconium oxide, hafnium oxide, or such, to increase its index of refraction, while the optically transmissive sublayer 1331b may include silicon dioxide, silicon nitride, or silicon oxynitride. The optical dielectric precursor 1303b is heated by a second heating process 1307b, which may be implemented as a scanned radiative heating process. The substrate 1305 extends from the workpiece 1301 to a component surface 1310.

Referring to FIG. 13C, the cathode parallel contact plate 1346a is electrically coupled to a cathode bus 1347a, and the anode parallel contact plate 1346b is electrically coupled to an anode bus 1347b. The cathode bus 1347a and the anode bus 1347b may be formed in an interconnect region of the microelectronic device 1300 above the component surface 1310. Other implementations for the cathode bus 1347a and the anode bus 1347b are within the scope of this example. The photodetector 1311 is configured to detect photons having energies above bandgap energies of the n-type cathode 1304b and the p-type parallel anode 1304c, entering the substrate 1305 through the anti-reflection element 1331. The photodetector 1311 may have a high optical detection efficiency, due to the vertical orientations of the n-type cathode 1304b and the p-type parallel anode 1304c, which may extend for a sufficient depth below the component surface 1310 to capture a desired fraction of the photons. The vertical orientations of the cathode parallel contact plate 1346a and the anode parallel contact plate 1346b may provide low resistance connections to the n-type cathode 1304b and the p-type parallel anode 1304c, respectively, providing a low series resistance for the photodetector 1311. The n-type cathode 1304b, the p-type parallel anode 1304c, the cathode parallel contact plate 1346a, and the anode parallel contact plate 1346b may be extended laterally to provide a desired area for the photodetector 1311 while maintaining the high optical detection efficiency and the low series resistance. Forming the n-type cathode 1304b, the p-type parallel anode 1304c, the cathode parallel contact plate 1346a, and the anode parallel contact plate 1346b with the vertical orientations may be attained with lower fabrication cost and complexity using the first additive process 1302a and the first heating process 1307a, compared to using planar processes.

Figure 14A:
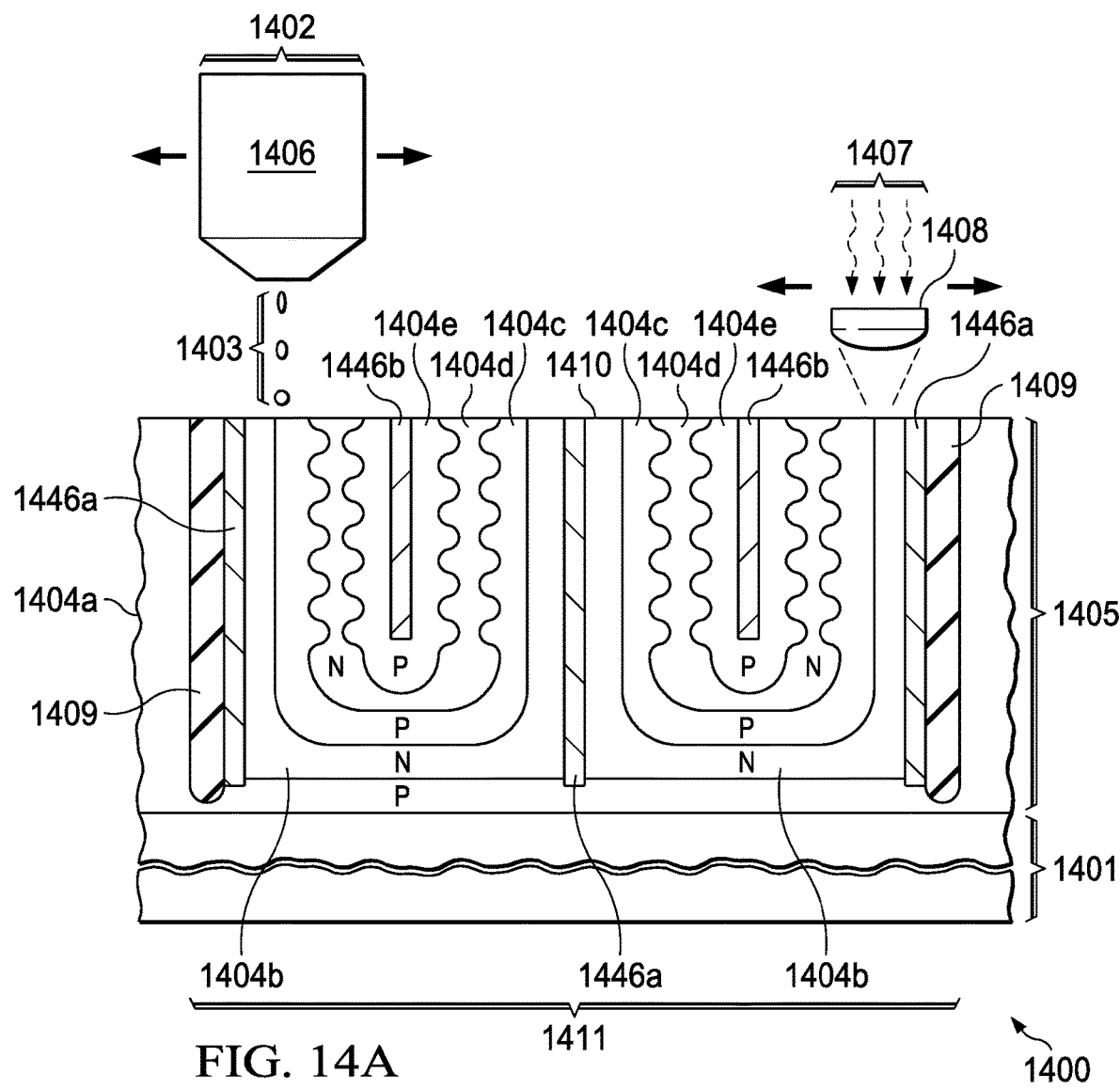
FIG. 14A and FIG. 14B are cross sections of a microelectronic device depicted in stages of another example method of formation.
Figure 14B:
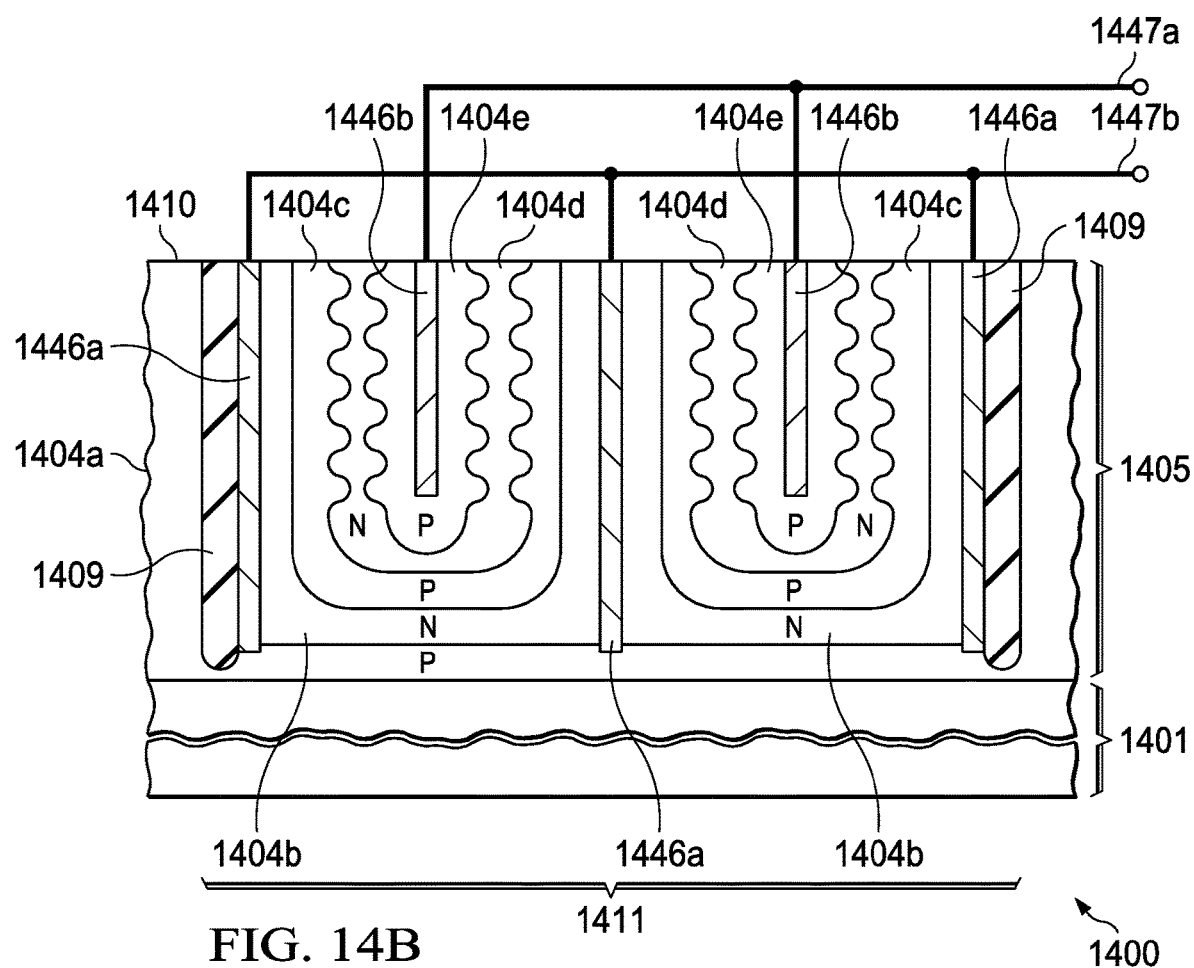

FIG. 14A and FIG. 14B are cross sections of a microelectronic device depicted in stages of another example method of formation. Referring to FIG. 14A, the microelectronic device 1400 is formed on a workpiece 1401, which has a crystalline structure. An additive process 1402 and a heating process 1407 form a substrate 1405 of the microelectronic device 1400 on the workpiece 1401. The additive process 1402 of this example is implemented to dispense a precursor 1403, which may be any combination of a semiconductor precursor, a dielectric precursor, a metal silicide precursor, and a conductive precursor. The additive process 1402 may be implemented in any of the modes disclosed in the examples herein. FIG. 14A depicts the additive process 1402 implemented using a material jetting apparatus 1406, however, other, or additional, additive apparatus may be used. FIG. 14A depicts the heating process 1407 implemented using a scanned focused radiative apparatus 1408, however, other, or additional, heating apparatus may be used. The precursor 1403 is dispensed to form sublayers, in which a local composition of the sublayers is adjusted to form semiconductor, dielectric, conductor, and metal silicide elements of the substrate 1405. Each sublayer is heated by the heating process 1407 to convert the precursor to solid material of the substrate 1405.

The additive process 1402 and the heating process 1407 form a p-type semiconductor material 1404*a* on the workpiece 1401. The substrate 1405 extends from the workpiece 1401 to a component surface 1410, located opposite from the workpiece 1401. The microelectronic device 1400 includes an electrostatic discharge (ESD) component 1411 formed by the additive process 1402 and the heating process 1407 on the p-type semiconductor material 1404*a*. The ESD component 1411 includes an isolation structural element 1409 extending around a lateral perimeter of the ESD component 1411. The ESD component 1411 includes an n-type collector 1404*b* formed on the p-type semiconductor material 1404*a*, inside the isolation structural element 1409, a p-type collector 1404*c* formed on the n-type collector 1404*b*, an n-type emitter 1404*d* formed on the p-type collector 1404*c*, and a p-type emitter 1404*e* formed on the n-type emitter 1404*d*. The ESD component 1411 further includes a cathode contact 1446*a* in contact with the n-type collector 1404*b*, and an anode contact 1446*b* in contact with the p-type emitter 1404*e*. The cathode contact 1446*a* and the anode contact 1446*b* may include conductor material formed from the conductor precursor, and may optionally include metal silicide surrounding the conductor material, formed from the metal silicide precursor. The elements of the ESD component 1411, that is, the n-type collector 1404*b*, the p-type collector 1404*c*, the n-type emitter 1404*d*, the p-type emitter 1404*e*, the cathode contact 1446*a* and the anode contact 1446*b*, have vertical orientations, that is, they extend into the substrate 1405 perpendicularly from the component surface 1410. The elements of the ESD component 1411 may be formed to extend sufficiently deep into the substrate 1405 to provide a current capacity for expected current surges from ESD events. Furthermore, the n-type collector 1404*b*, the p-type collector 1404*c*, the n-type emitter 1404*d*, the p-type emitter 1404*e*, the cathode contact 1446*a* and the anode contact 1446*b* may be configured in parallel units, as depicted in FIG. 14A, to further increase the current capacity of the ESD component 1411. The vertical orientations of the elements of the ESD component 1411 may advantageously provide a desired area of the component surface 1410 for a specified surge current. A boundary between the p-type emitter 1404*e* and the n-type emitter 1404*d* may have lateral excursions, for example as a sinusoidal boundary, which may provide a desired trigger voltage for the ESD component 1411. Similarly, a boundary between the n-type emitter 1404*d* and the p-type collector 1404*c* may have lateral excursions, which may match the lateral excursions boundary between the p-type emitter 1404*e* and the n-type emitter 1404*d*, may also provide the desired trigger voltage. The vertically oriented configurations for the elements of the ESD component 1411 and the lateral excursions in the boundaries between the p-type emitter 1404*e*, the n-type emitter 1404*d*, and the p-type collector 1404*c*, may be formed at less fabrication cost and complexity using the additive process 1402 and the heating process 1407 than using planar processes. The lateral excursions in the boundaries are especially complex and costly to form using planar processes.

Referring to FIG. 14B, the cathode contact 1446*a* may be optionally connected to a cathode bus 1447*a*, which may be connected to a ground terminal of the microelectronic device 1400. Alternatively, the cathode contact 1446*a* may extend into the p-type semiconductor material 1404*a* to a depth sufficient to carry the expected surge currents without damaging the substrate 1405. The anode contact 1446*b* may be connected to an anode bus 1447*b*, which may be connected to an input/output (I/O) terminal of the microelectronic device 1400, so that the ESD component 1411 may protect the I/O terminal, and components connected to the I/O terminal, from ESD events. Instances of the ESD component 1411 may be connected to all I/O terminals of the microelectronic device 1400. The vertical orientations of the elements of the ESD component 1411 may provide a reduced area for the microelectronic device 1400 compared to ESD components formed by planar processes.

Figure 15A:
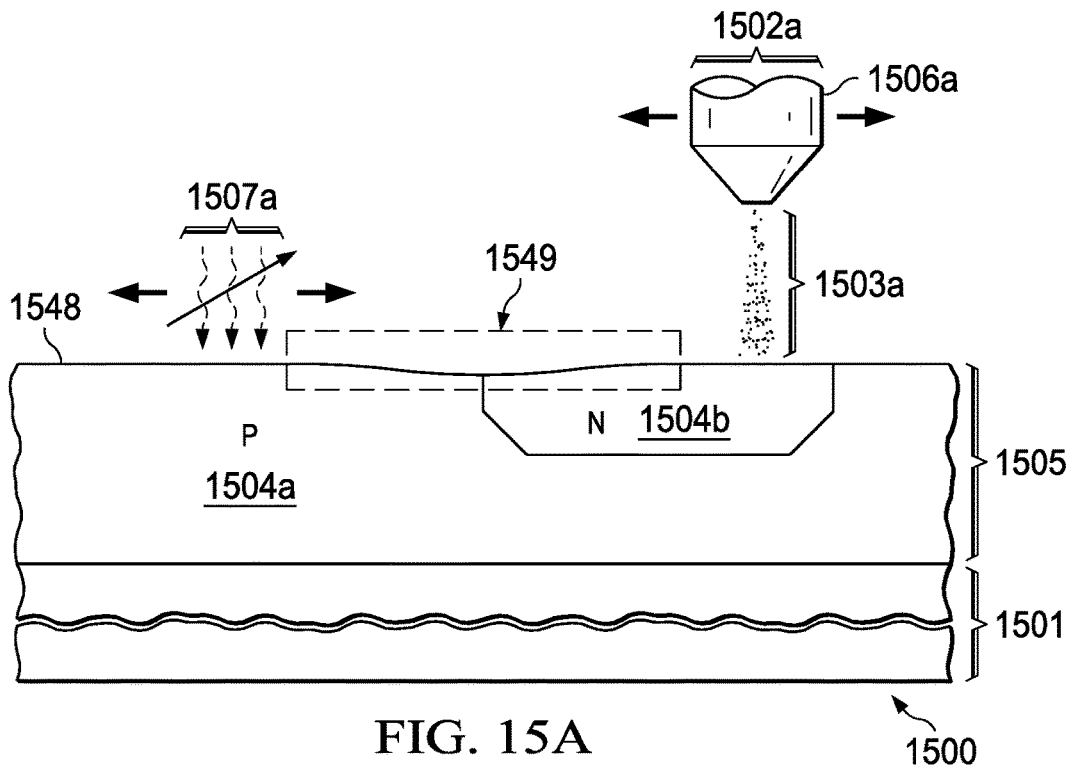
FIG. 15A through FIG. 15D are cross sections of a microelectronic device depicted in stages of a further example method of formation.

FIG. 15A through FIG. 15D are cross sections of a microelectronic device depicted in stages of a further example method of formation. Referring to FIG. 15A, the microelectronic device 1500 is formed on a workpiece 1501, which has a crystalline structure. A first additive process 1502*a* and a first heating process 1507*a* form a substrate 1505 of the microelectronic device 1500 on the workpiece 1501. The first additive process 1502*a* of this example is implemented to dispense a first precursor 1503*a*, which may be any combination of a semiconductor precursor, a dielectric precursor, a metal silicide precursor, a conductive precursor, and such, from a first additive process apparatus 1506*a*. FIG. 15A depicts the first additive process apparatus 1506*a* implemented as an electrostatic deposition apparatus 1506*a*, however, the first additive process 1502*a* may be implemented in any of the modes disclosed in the examples herein, and other implementations of the first additive process apparatus 1506*a* are within the scope of this example. The first heating process 1507*a* is depicted in FIG. 15A as an adjustable radiative heating process 1507*a*, which may be moved laterally with respect to the workpiece 1501. However, other implementations for the first heating apparatus 1508*a* are within the scope of this example. The first precursor 1503*a* is dispensed to form sublayers, in which a local composition of the sublayers is adjusted to form semiconductor elements, dielectric elements, conductor elements, metal silicide elements, and such, of the substrate 1505. Each sublayer is heated by the first heating process 1507*a* to convert the first precursor 1503*a* to solid material of the substrate 1505. FIG. 15A depicts the substrate 1505 as including a p-type semiconductor material 1504*a* formed on the workpiece 1501, and an n-type well 1504*b* formed on the p-type semiconductor material 1504*a*. Other elements in the substrate 1505 are within the scope of this example.

During formation of the substrate 1505, an initial top surface 1548 of the substrate 1505, located opposite from the workpiece 1501, may have a non-planar area 1549, which may be undesirable for continued formation of the microelectronic device 1500. The non-planar area 1549 may develop for a variety of reasons, such as variations in dispensed amounts of the first precursor 1503*a* or variations in lateral scan motion of the electrostatic deposition apparatus 1506*a*.

Figure 15B:
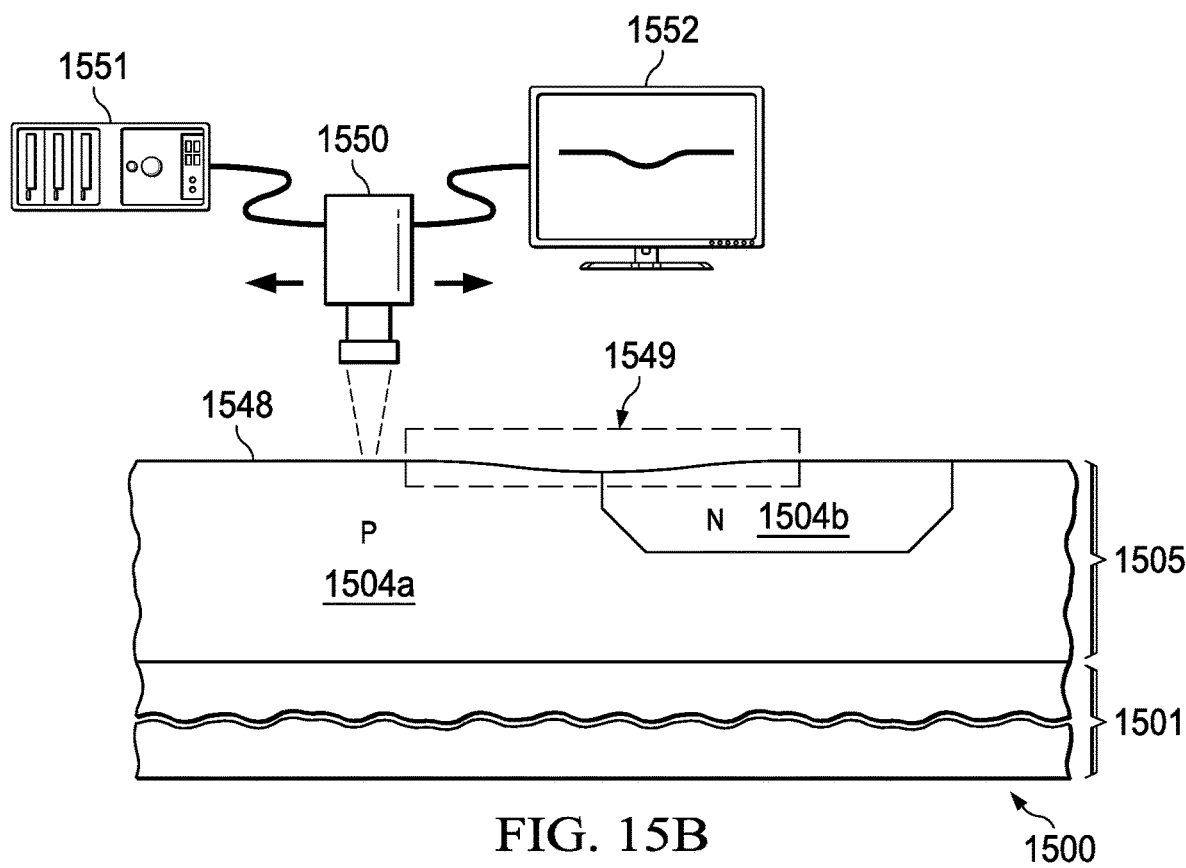

Referring to FIG. 15B, the initial top surface 1548 of the substrate 1505 is measured using a profilometry apparatus 1550, which provides an estimate of a deviation from planarity in the non-planar area 1549. The profilometry apparatus 1550 may be implemented as an optical profilometry apparatus 1550, as indicated in FIG. 15B. Alternatively, the profilometry apparatus 1550 may be implemented as a contact profilometry apparatus, an AFM profilometry apparatus, or other profilometry apparatus. Results of the measurement of the initial top surface 1548 of the substrate 1505 using the profilometry apparatus 1550 may be stored in a computer-readable media 1551, such as a magnetic disk apparatus, a flash memory apparatus, an optical memory apparatus, or other computer-readable media 1551. The results of the measurement using the profilometry apparatus 1550 may optionally be displayed, for example, on a monitor 1552, as depicted in FIG. 15A.

Figure 15C:
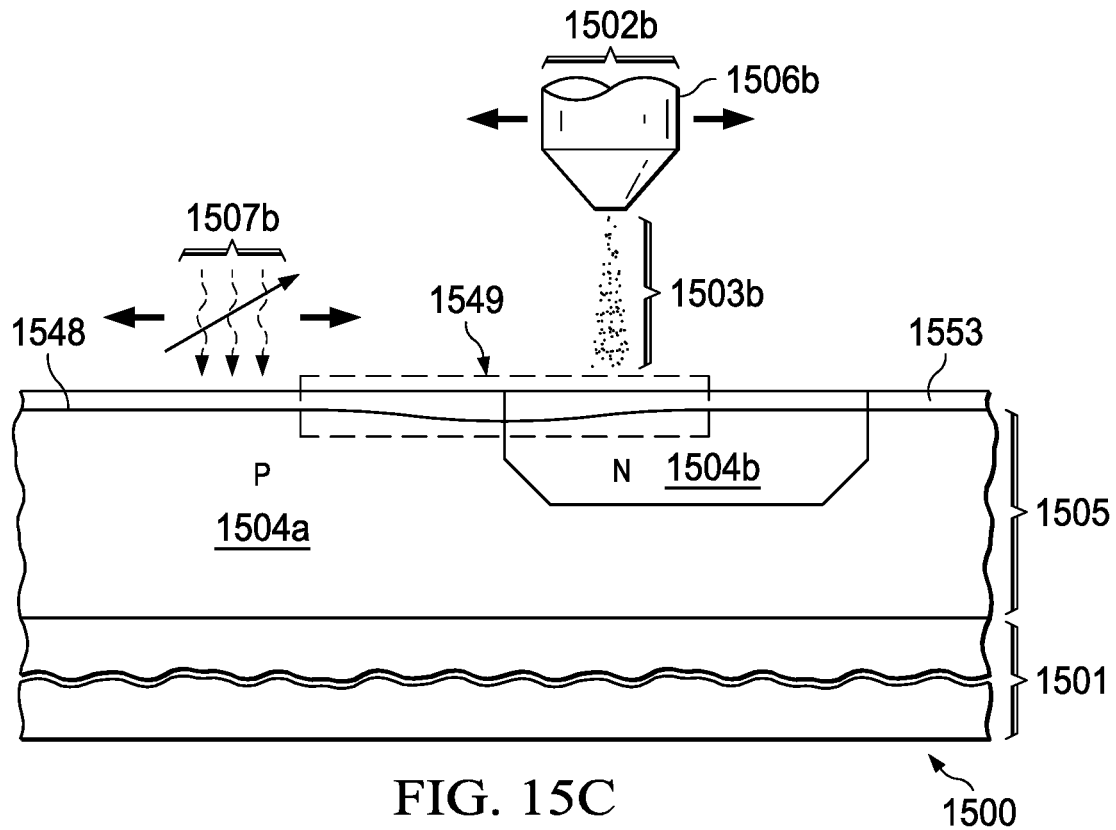

Referring to FIG. 15C, the results of the measurement of the initial top surface 1548 of the substrate 1505 using the profilometry apparatus 1550 of FIG. 15B are used by a second additive process 1502b, to form a corrective precursor sublayer 1553 on the initial top surface 1548 of the substrate 1505. The second additive process 1502b is implemented using a second additive process apparatus 1506b which dispenses a second precursor 1503b. The second additive process 1502b may be implemented as a continuation of the first additive process 1502a of FIG. 15A, or may be implemented using a second additive process apparatus 1506b that is different from the first additive process apparatus 1506a of FIG. 15A. The second precursor 1503b may optionally be different from the first precursor 1503a.

A second heating process 1507b is implemented to convert the corrective precursor sublayer 1553 to solid material of the substrate 1505. The second heating process 1507b may be a continuation of the first heating process 1507a of FIG. 15A, or may be implemented wherein the second heating apparatus 1508b is different from the first heating apparatus 1508a of FIG. 15A.

The second precursor 1503b is dispensed with a varying volume or lateral scan rate, to compensate for the deviation from planarity in the initial top surface 1548 of the substrate 1505. A composition of the corrective precursor sublayer 1553 may be adjusted to continue formation of the elements of the substrate 1505, such as the p-type semiconductor material 1504a and the n-type well 1504b.

Figure 15D:
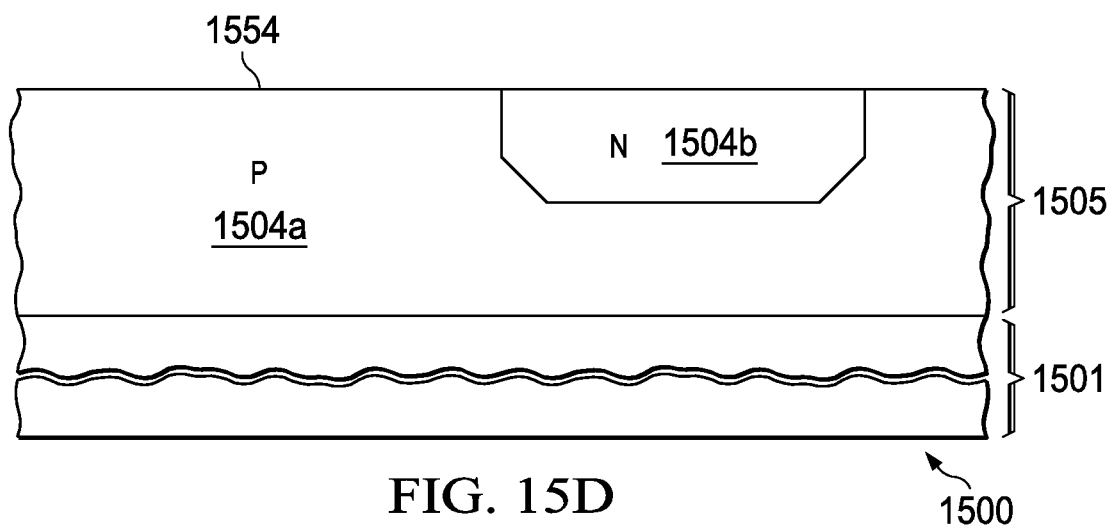

FIG. 15D depicts the microelectronic device 1500 after the corrective precursor sublayer 1553 of FIG. 15C is converted to solid material. The final top surface 1554 of the substrate 1505 at this point is more planar than the initial top surface 1548 of FIG. 15C before forming the corrective precursor sublayer 1553. Formation of the substrate 1505 may be continued using the first additive process 1502a and the first heating process 1507a of FIG. 15A, or using the second additive process 1502b and the second heating process 1507b. Additional profilometry measurements of the substrate 1505 may be made, and additional corrective precursor sublayers may be formed, as needed, to provide a desired planarity in a top surface of the substrate 1505.

Figure 16A:
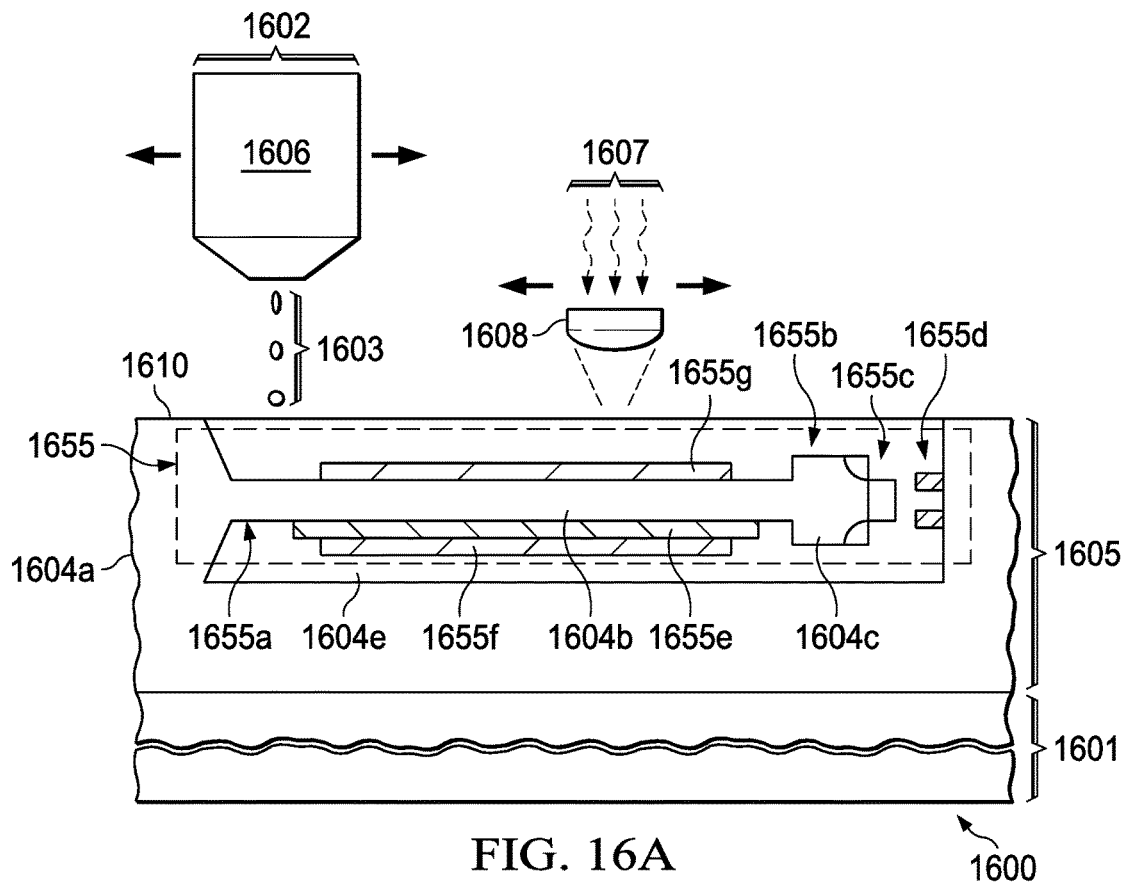
FIG. 16A and FIG. 16B are cross sections of a microelectronic device depicted in stages of another example method of formation.
Figure 16B:
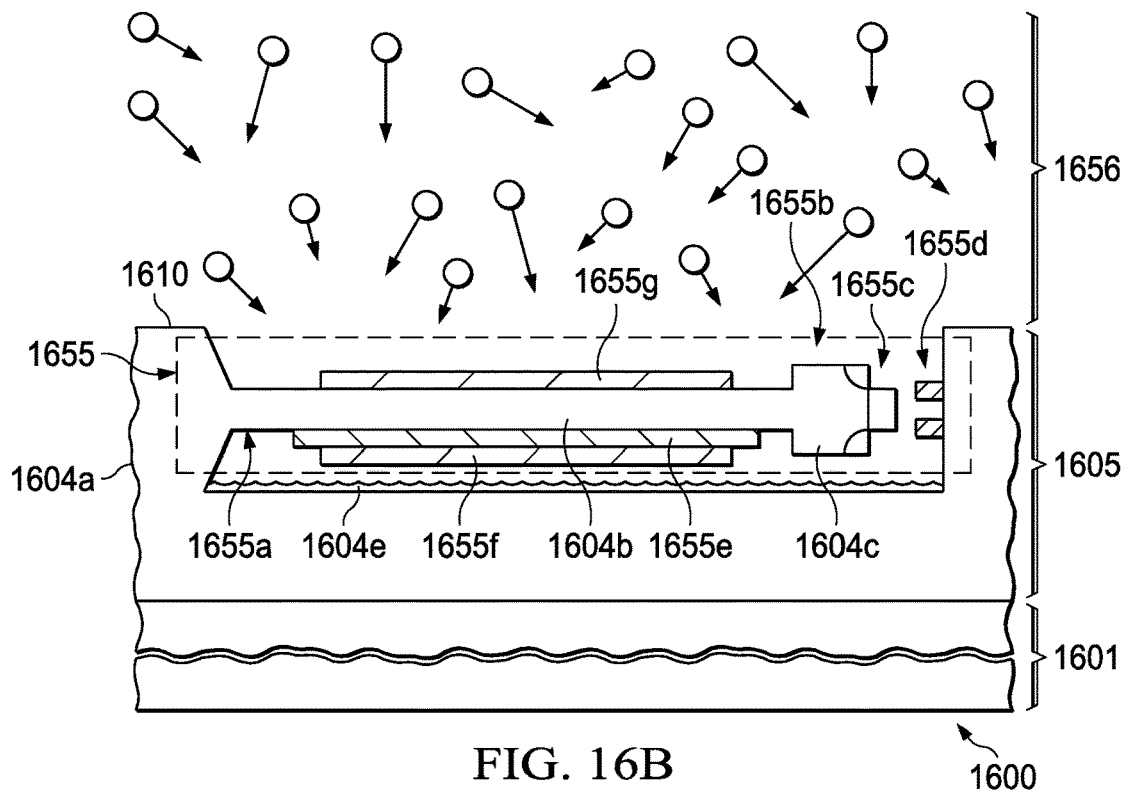

FIG. 16A and FIG. 16B are cross sections of a microelectronic device depicted in stages of another example method of formation. Referring to FIG. 16A, the microelectronic device 1600 is formed on a workpiece 1601, which has a crystalline structure. An additive process 1602 and a heating process 1607 form a substrate 1605 of the microelectronic device 1600 on the workpiece 1601. The additive process 1602 is implemented to dispense a precursor 1603, which may be any combination of a semiconductor precursor, a dielectric precursor, a metal silicide precursor, a conductive precursor, a piezoelectric precursor, or a polymer precursor. The piezoelectric precursor may include, for example, a sol gel solution for lead zirconate titanate (PZT) or lead lanthanum zirconate titanate (PLZT). FIG. 16A depicts the additive process 1602 implemented using a material jetting apparatus 1606, however, other, or additional, additive apparatus may be used. FIG. 16A depicts the heating process 1607 implemented using a scanned focused radiative apparatus 1608, however, other, or additional, heating apparatus may be used. The precursor 1603 is dispensed to form sublayers, in which a local composition of the sublayers is adjusted to form semiconductor elements, dielectric elements, metal silicide elements, conductor elements, piezoelectric elements, or polymer elements, of the substrate 1605. Each sublayer is heated by the heating process 1607 to convert the precursor to solid material of the substrate 1605.

The additive process 1602 and the heating process 1607 are used to form a base material 1604a of the substrate 1605. The base material 1604a may include semiconductor material such as crystalline silicon, or may include other structural material. The microelectronic device 1600 includes a MEMS structure 1655 which may be mechanically coupled to the base material 1604a, for example, as shown in FIG. 16A.

The MEMS structure 1655 has various elements, formed by the additive process 1602 and the heating process 1607. In this example, the elements of the MEMS structure 1655 may include movable element 1655a, such a cantilever beam 1655a, of a beam material 1604b, having desired mechanical properties, such as stiffness and density. The beam material 1604b may include, for example, crystalline silicon, crystalline quartz, amorphous silicon dioxide, crystalline aluminum oxide, silicon carbide, boron nitride, gallium nitride, or aluminum nitride. The beam material 1604b may be different from the base material 1604a. The beam material 1604b may be mechanically coupled to the base material 1604a at a first end of the cantilever beam 1655a.

The elements of the MEMS structure 1655 may also include a proof mass 1655b on a second end of the cantilever beam 1655a, located opposite from the first end of the cantilever beam 1655a. The proof mass 1655b may include a semiconductor material 1604c, and the proof mass 1655b may include a transistor 1655c formed in the semiconductor material 1604c. The elements of the MEMS structure 1655 may further include bias electrodes 1655d formed on the base material 1604a proximate to the transistor 1655c, configured to apply electric fields to the transistor 1655c during operation of the microelectronic device 1600.

The elements of the MEMS structure 1655 may include a first actuator layer 1655e on the cantilever beam 1655a. The first actuator layer 1655e may include, for example, a piezoelectric material, a shape memory material such as a shape memory polymer or a shape memory alloy of nickel and titanium, a bimetal material, artificial muscle material such as an ohmically heated polymer, or an electrostatic zipper actuator plate. The first actuator layer 1655e may be electrically coupled to electronic components, not shown, in the microelectronic device 1600 by conductors, not shown, formed by the additive process 1602 and the heating process 1607.

The elements of the MEMS structure 1655 may include a sensor layer 1655f on the first actuator layer 1655e. The sensor layer 1655f may include, for example, a resistive strain gauge material or a piezoelectric sensor material. The sensor layer 1655f may also be electrically coupled to electronic components, not shown, in the microelectronic device 1600.

The elements of the MEMS structure 1655 may further include a second actuator layer 1655g on the cantilever beam 1655a, located opposite from the first actuator layer 1655e. The second actuator layer 1655g may include any of the materials disclosed for the first actuator layer 1655e, and may have a similar composition to the first actuator layer 1655e. The second actuator layer 1655g may also be electrically coupled to electronic components, not shown, in the microelectronic device 1600.

A release material 1604d is formed by the additive process 1602 and the heating process 1607 around the MEMS structure 1655. The release material 1604d may advantageously support the sublayers of the precursor 1603 for formation of the elements of the MEMS structure 1655. The release material 1604d may include a material that is removable from the microelectronic device 1600 without degradation of the MEMS structure 1655 or other components of the microelectronic device 1600. The release material 1604d may include, for example, sodium silicate, organosilicate glass, PSG, polycrystalline silicon, unsaturated hydrocarbon polymer, or silicon-germanium.

The completed substrate 1605 extends to a component surface 1610, located opposite from the workpiece 1601. The release material 1604d may extend to the component surface 1610, as depicted in FIG. 16A. Using the additive process 1602 and the heating process 1607 to form the MEMS structure 1655 may enable forming the elements of the MEMS structure 1655 on sides and a bottom of the cantilever beam 1655a, which may be more costly or complex using planar processes.

Referring to FIG. 16B, the release material 1604d is removed, releasing the MEMS structure 1655. The release material 1604d may be removed by an anisotropic etch process that does not substantially degrade the MEMS structure 1655 or the base material 1604a. For example, the release material 1604d may be removed by a field-free dry etch process using gas-phase radicals 1656. In versions of this example in which the release material 1604d includes an unsaturated hydrocarbon polymer, the gas-phase radicals 1656 may include oxygen radicals such as oxygen ions, atomic oxygen, or ozone. In versions of this example in which the release material 1604d includes sodium silicate, organosilicate glass, PSG, or silicon-germanium, the gas-phase radicals 1656 may include hydrogen fluoride. Alternatively, the release material 1604d may be removed by a wet etch process using an etch solution having a low surface tension. In versions of this example in which the release material 1604d includes polycrystalline silicon, the wet etch process may use tetramethyl ammonium hydroxide. FIG. 16B depicts removal of the release material 1604d partway to completion. Using the additive process 1602 and the heating process 1607 to form the release material 1604d may enable the release material 1604d to include material that is easily removed without degrading the MEMS structure 1655 or the base material 1604a, while being compatible with forming the various elements of the MEMS structure 1655.

Figure 17A:
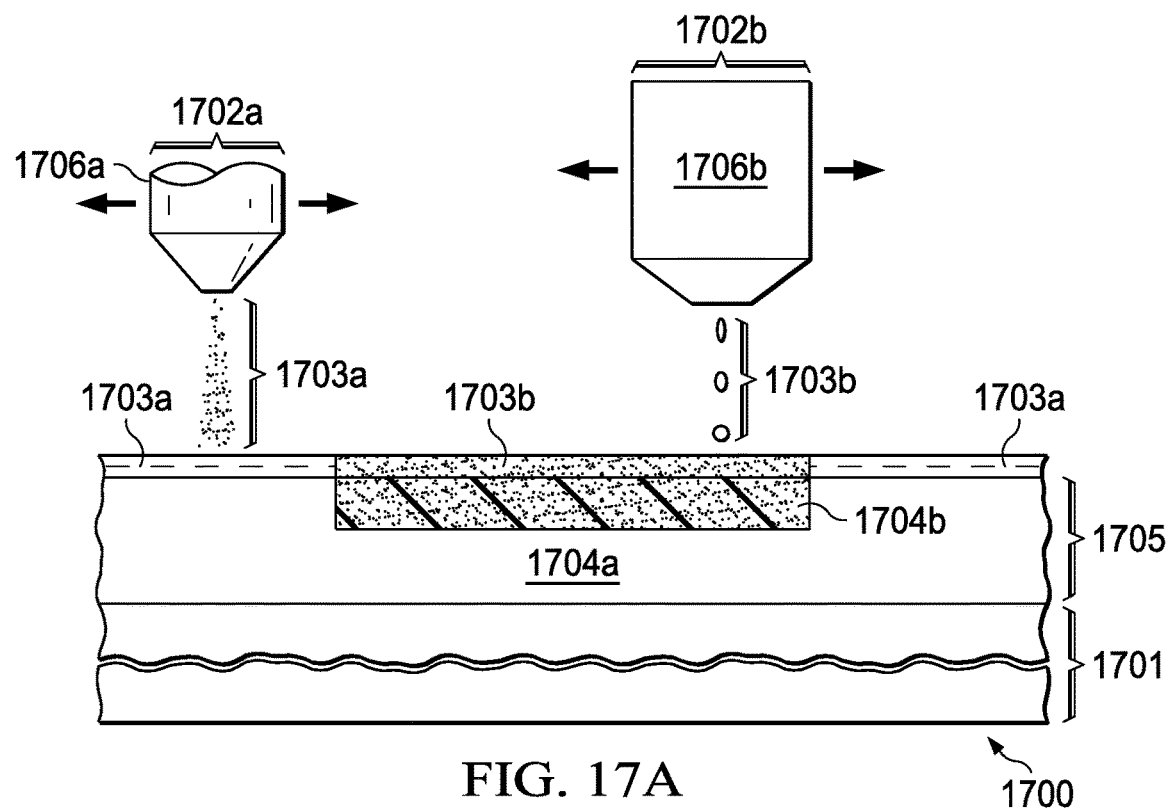
FIG. 17A and FIG. 17B are cross sections of a microelectronic device depicted in stages of a further example method of formation.
Figure 17B:
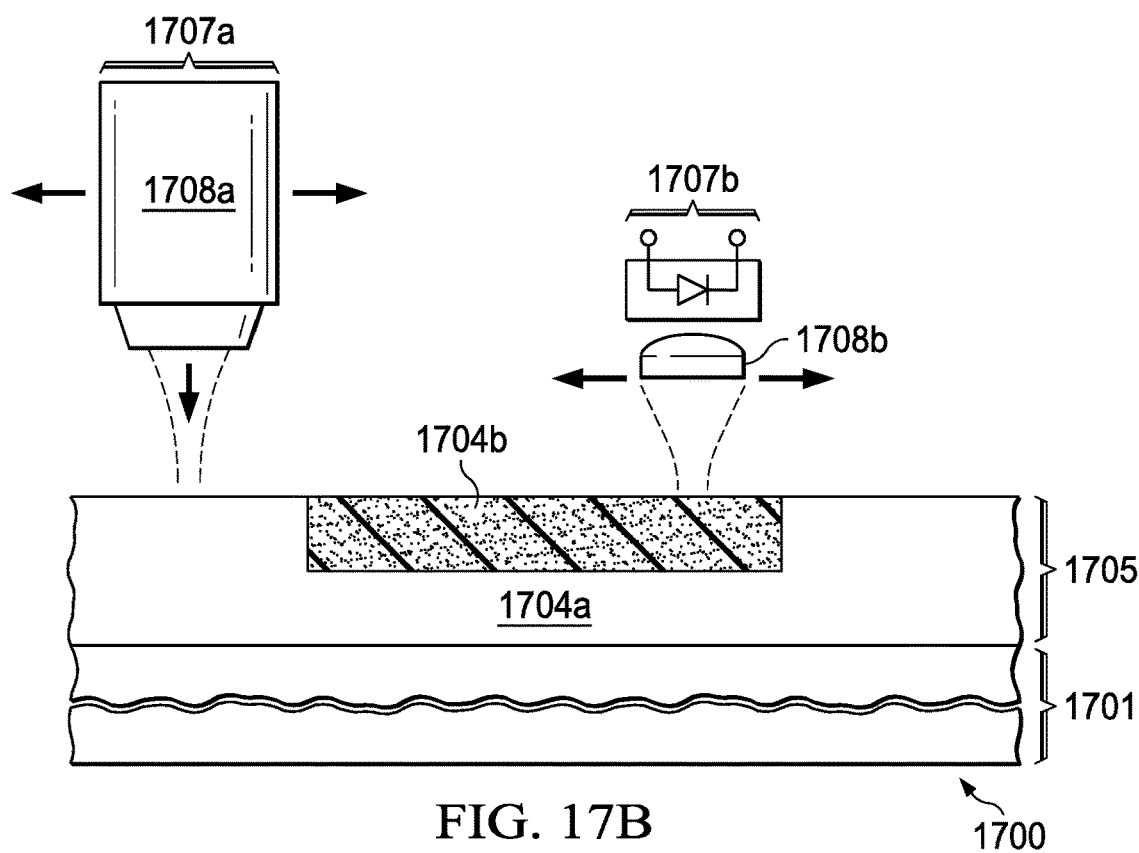

FIG. 17A and FIG. 17B are cross sections of a microelectronic device depicted in stages of a further example method of formation. Referring to FIG. 17A, the microelectronic device 1700 includes a substrate 1705 which is formed on a workpiece 1701 using additive processes and associated heating processes. The workpiece 1701 has a crystalline structure. The substrate 1705 includes a semiconductor material 1704a and a quantum dot matrix 1704b. The quantum dot matrix 1704b may be part of an optoelectronic component of the microelectronic device 1700.

A first additive process 1702a dispenses a semiconductor precursor 1703a onto the semiconductor material 1704a to form a sublayer of the semiconductor precursor 1703a on the semiconductor material 1704a, using a first additive process apparatus 1706a. The first additive process apparatus 1706a may be selected to facilitate dispensing the semiconductor precursor 1703a, which may include semiconductor nanoparticles and liquid semiconductor precursor, such as neopentasilane. The first additive process apparatus 1706a is depicted in FIG. 17A as an electrostatic deposition apparatus 1706a, however, other additive apparatus may be used.

A second additive process 1702b dispenses a quantum dot matrix precursor 1703b onto the quantum dot matrix 1704b to form a sublayer of the quantum dot matrix precursor 1703b on the quantum dot matrix 1704b, using a second additive process apparatus 1706b. The second additive process apparatus 1706b may be selected to facilitate dispensing the quantum dot matrix precursor 1703b, which may include quantum dots and liquid dielectric precursor, such as HSQ or MSQ. The second additive process apparatus 1706b is depicted in FIG. 17A as a material jetting apparatus 1706b, however, other additive apparatus, such as a material extrusion apparatus, may be used. Thus, the first additive process 1702a and the second additive process 1702b may use different additive process apparatus, each selected to facilitate dispensing the semiconductor precursor 1703a and the quantum dot matrix precursor 1703b, respectively.

Referring to FIG. 17B, a first heating process 1707a heats the sublayer of the semiconductor precursor 1703a, of FIG. 17A, on the semiconductor material 1704a, to convert the semiconductor precursor 1703a to the semiconductor material 1704a. Including semiconductor nanoparticles and liquid semiconductor precursor in the semiconductor precursor 1703a may enable conversion of the semiconductor precursor 1703a to the semiconductor material 1704a at a sufficiently low temperature, for example less than 400° C., to avoid degradation of the quantum dot matrix 1704b. The first heating process 1707a may use a scanned laser apparatus 1708a, which may localize heating of the semiconductor precursor 1703a and thus further reduce thermal impact on the quantum dot matrix 1704b. The first heating process 1707a may be performed to provide an appropriate thermal profile, for example, a short, high power pulse, to the semiconductor precursor 1703a without excessive heating.

A second heating process 1707b heats the sublayer of the quantum dot matrix precursor 1703b, of FIG. 17A, on the quantum dot matrix 1704b, to convert quantum dot matrix precursor 1703b to the quantum dot matrix 1704b. The second heating process 1707b may use a focused LED heating apparatus 1708b which is capable of providing a thermal profile having a wide dynamic range, appropriate for conversion of the quantum dot matrix precursor 1703b to the quantum dot matrix 1704b. For example, the focused LED heating apparatus 1708b may provide a low power phase to remove volatile material from the quantum dot matrix precursor 1703b, followed by a higher power phase to react the liquid dielectric precursor to form dielectric material without degrading the quantum dots.

The first additive process 1702a and the second additive process 1702b, dispensing the semiconductor precursor 1703a and the quantum dot matrix precursor 1703b, of FIG. 17A, combined with the first heating process 1707a and the second heating process 1707b, may enable forming the quantum dot matrix 1704*b* with an arbitrary shape and size in the semiconductor material 1704*a*. Forming the quantum dot matrix 1704*b* concurrently with the semiconductor material 1704*a* using the first additive process 1702*a* and the second additive process 1702*b* may advantageously reduce fabrication cost and complexity of the microelectronic device 1700.

Figure 18A:
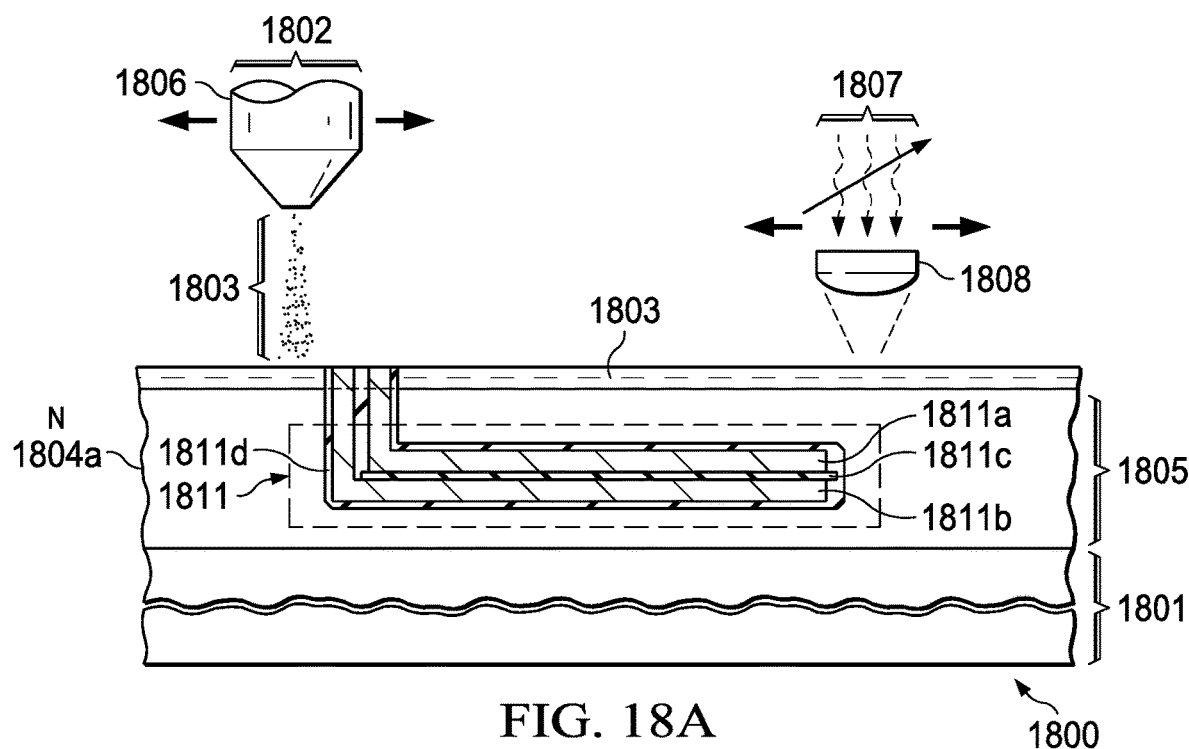
FIG. 18A and FIG. 18B are cross sections of a microelectronic device depicted in stages of another example method of formation.
Figure 18B:
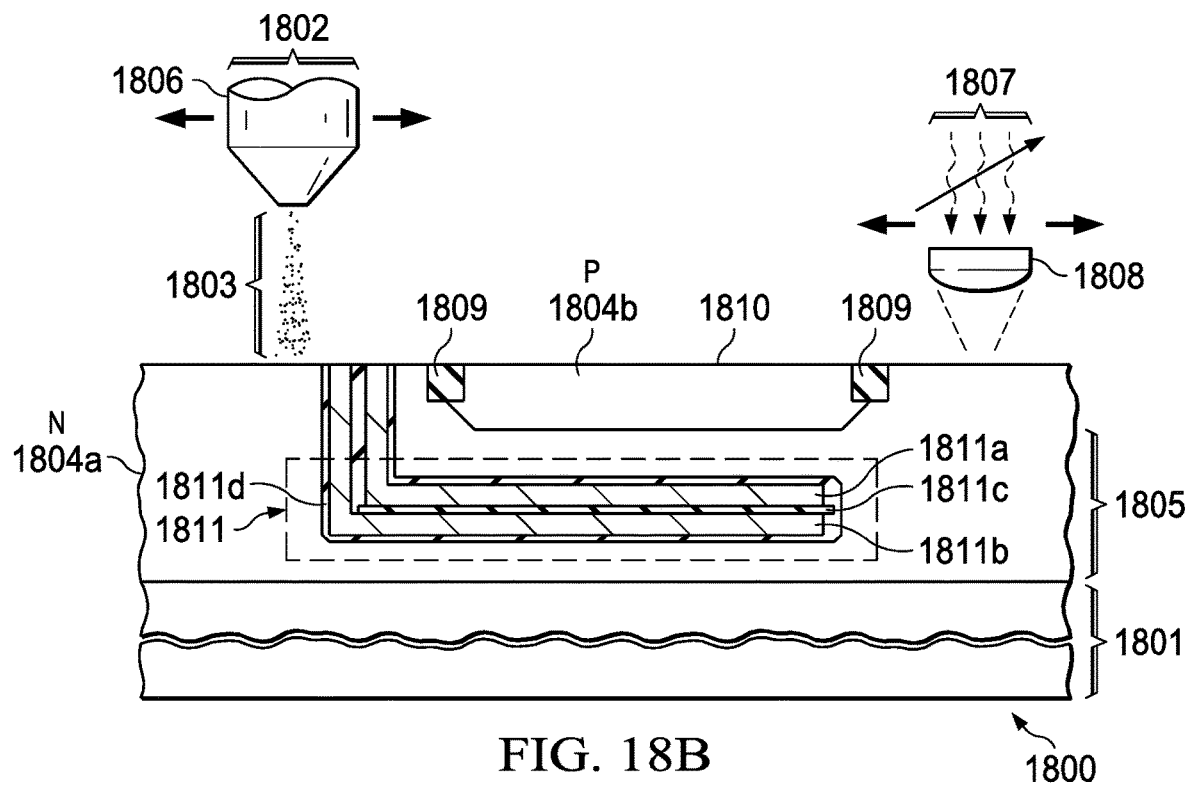

FIG. 18A and FIG. 18B are cross sections of a microelectronic device depicted in stages of another example method of formation. Referring to FIG. 18A, the microelectronic device 1800 is formed on a workpiece 1801, which has a crystalline structure. An additive process 1802 and a heating process 1807 form a substrate 1805 of the microelectronic device 1800 on the workpiece 1801. The additive process 1802 is implemented to dispense a precursor 1803, which may be any combination of a semiconductor precursor, a dielectric precursor, or a conductive precursor. FIG. 18A depicts the additive process 1802 implemented using an electrostatic deposition apparatus 1806, however, other, or additional, additive apparatus may be used. FIG. 18A depicts the heating process 1807 implemented using a scanned focused adjustable radiative apparatus 1808, however, other, or additional, heating apparatus may be used. The precursor 1803 is dispensed to form sublayers, in which a local composition of the sublayers is adjusted to form semiconductor elements, dielectric elements, or conductor elements, of the substrate 1805. Each sublayer is heated by the heating process 1807 to convert the precursor to solid material of the substrate 1805. A thermal profile provided by the heating process 1807 may be varied, for example in time duration or power, to effectively convert the precursor 1803 to the solid material of the substrate 1805.

The additive process 1802 and the heating process 1807 are used to form an n-type semiconductor material 1804*a* of the substrate 1805. The n-type semiconductor material 1804*a* may include, for example, crystalline silicon. To form the n-type semiconductor material 1804*a*, the precursor 1803 may include primarily, or substantially all, semiconductor precursor, such as silicon nanoparticles and liquid multi-silane semiconductor precursor.

The additive process 1802 and the heating process 1807 are further used to form a passive component 1811 in the substrate 1805. FIG. 18A depicts the passive component 1811 as a parallel plate capacitor 1811, however, other manifestations of the passive component 1811, such as an inductor, resistor, or antenna, are within the scope of the instant example. The parallel plate capacitor 1811 includes a first plate 1811*a*, a second plate 1811*b*, a capacitor dielectric layer 1811*c* located between the first plate 1811*a* and the second plate 1811*b*, and an isolation sheath 1811*d* surrounding the first plate 1811*a*, the second plate 1811*b*, and the capacitor dielectric layer 1811*c*. The first plate 1811*a* includes a conductive material such as metal, heavily doped semiconductor, or graphitic material. The second plate 1811*b* includes a conductive material, and may have a composition similar to a composition of the first plate 1811*a*. The capacitor dielectric layer 1811*c* includes dielectric material, and may include a material with a high dielectric constant, such as tantalum oxide, zirconium oxide, or hafnium oxide. The isolation sheath 1811*d* includes electrically insulating material, such as silicon dioxide, silicon nitride, or silicon oxynitride.

The n-type semiconductor material 1804*a* may be formed to extend over the first plate 1811*a* and the second plate 1811*b*, to provide space for additional components of the microelectronic device 1800 over at least a portion of the passive component 1811. The parallel plate capacitor 1811 may have conductive leads extending from the first plate 1811*a* and the second plate 1811*b*, as depicted in FIG. 18A. Forming the passive component 1811 using the additive process 1802 and the heating process 1807, may provide lower fabrication cost and complexity compared to forming a similar component using planar processes, as planar process commonly have difficulty forming conductive and dielectric layers below semiconductor material in a substrate.

Referring to FIG. 18B, the additive process 1802 and the heating process 1807 are used to complete formation of the substrate 1805. The substrate 1805 extends to a component surface 1810 located opposite from the workpiece 1801. The substrate 1805 may include elements formed over at least a portion of the parallel plate capacitor 1811, such as a p-type well 1804*b* and isolation structures 1809. Forming the passive component 1811 in the substrate 1805, in particular below other elements of the substrate 1805, may advantageously reduce a size of the microelectronic device 1800 compared to forming a similar passive component above the component surface 1810 outside of the substrate 1805.

Figure 19A:
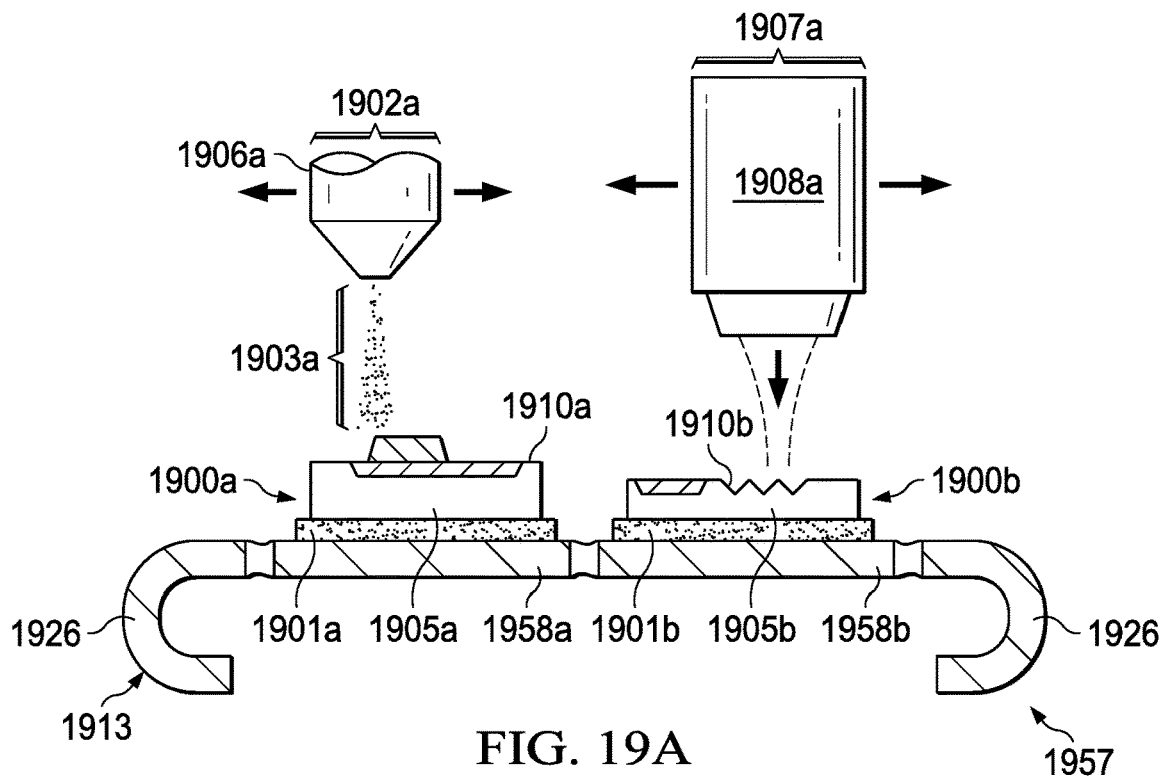
FIG. 19A and FIG. 19B are cross sections of a microelectronic device depicted in stages of another example method of formation.
Figure 19B:
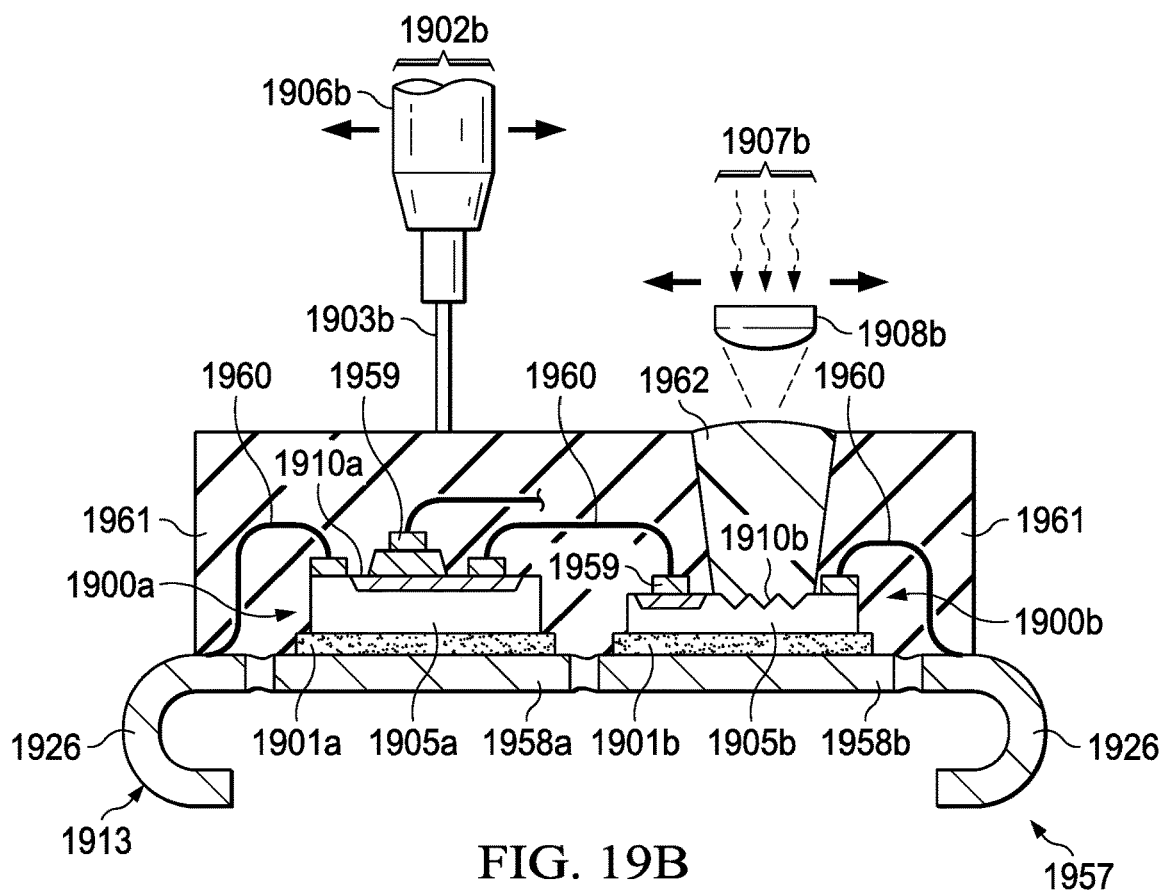

FIG. 19A and FIG. 19B are cross sections of a microelectronic device depicted in stages of another example method of formation. Referring to FIG. 19A, a multi-chip module 1957 which includes a first microelectronic device 1900*a* and a second microelectronic device 1900*b*. The first microelectronic device 1900*a* is formed on a first workpiece 1901*a*, which has a crystalline structure appropriate for a first substrate 1905*a* of the first microelectronic device 1900*a*. The second microelectronic device 1900*b* is formed on a second workpiece 1901*b*, which has a crystalline structure appropriate for a second substrate 1905*b* of the second microelectronic device 1900*b*. The first workpiece 1901*a* and the second workpiece 1901*b* are disposed on a chip carrier 1913, which may be manifested as a lead frame 1913, as depicted in FIG. 19A. The chip carrier 1913 may include, for example, a first die plate 1958*a*, on which the first workpiece 1901*a* is disposed, and a second die plate 1958*b*, on which the second workpiece 1901*b* is disposed. The chip carrier 1913 may include external leads 1926 which may be electrically coupled to the first microelectronic device 1900*a* and the second microelectronic device 1900*b* after the first microelectronic device 1900*a* and the second microelectronic device 1900*b* are formed on the first workpiece 1901*a* and the second workpiece 1901*b*, respectively. Other manifestations for the chip carrier 1913 are within the scope of this example.

A first additive process 1902*a* and a first heating process 1907*a* form the first substrate 1905*a* on the first workpiece 1901*a*, and form the second substrate 1095*b* on the second workpiece 1901*b*. The first microelectronic device 1900*a* and the second microelectronic device 1900*b* may be different types of devices. For example, the first microelectronic device 1900*a* may be manifested as signal processing device such as a bipolar transistor device, and the second microelectronic device 1900*b* may be manifested as an optoelectronic device such as a surface emitting laser. The first substrate 1905*a* may include primarily crystalline silicon, and the second substrate 1905*b* may include primarily III-V semiconductor material such as layers of gallium nitride, gallium aluminum nitride, and aluminum nitride. Other types of devices and materials for the first microelectronic device 1900*a* and the second microelectronic device 1900*b* are within the scope of this example.

The first additive process 1902*a* is implemented to dispense a first precursor 1903*a*, which may be any combination of a silicon semiconductor precursor, various III-V semiconductor precursors, and optionally other precursors, such as a dielectric precursor or a conductive precursor. FIG. 19A depicts the first additive process 1902a implemented using an electrostatic deposition apparatus 1906a, however, other, or additional, additive apparatus may be used. In particular, the first additive process 1902a may use one additive process apparatus to dispense silicon semiconductor precursor and another additive process apparatus to dispense III-V semiconductor precursor. FIG. 19A depicts the first heating process 1907a implemented using a scanned laser apparatus 1908a, however, other, or additional, heating apparatus may be used.

The first substrate 1905a extends from the first workpiece 1901a to a first component surface 1910a, and the second substrate 1905b extends from the second workpiece 1901b to a second component surface 1910b. The first component surface 1910a may be non-planar, to accommodate elements of the first substrate 1905a, as depicted in FIG. 19A. Similarly, the second component surface 1910b may be non-planar, to accommodate elements of the second substrate 1905b. An average thickness of the first substrate 1905a, measured from the first workpiece 1901a to the first component surface 1910a, may be different from an average thickness of the second substrate 1905b, measured from the second workpiece 1901b to the second component surface 1910b.

Forming the first substrate 1905a and the second substrate 1905b on the chip carrier 1913 using the first additive process 1902a and a first heating process 1907a may provide a lower fabrication cost and complexity than conventional fabrication using planar processes and pick-and-place assembly, in particular for small quantities of the multi-chip module 1957.

Referring to FIG. 19B, I/O terminals 1959 may be formed on the first component surface 1910a and the second component surface 1910b to provide electrical connections to the components in the first substrate 1905a and the second substrate 1905b, respectively. The I/O terminals 1959 may be formed by an additive process, not shown, or by another method. Wire bonds 1960 are subsequently formed to connect the I/O terminals 1959 with the external leads 1926. One or more of the wire bonds 1960 may connect an I/O terminal 1959 on the first component surface 1910a with another I/O terminal 1959 on the second component surface 1910b. The wire bonds 1960 may be formed using a wire bonding tool. Alternatively, electrical connections between the external leads 1926 and the components in the first substrate 1905a and the second substrate 1905b may be formed by an additive process, not shown.

A second additive process 1902b is used to form an encapsulation structure 1961 and a lens structure 1962 on the first microelectronic device 1900a, the second microelectronic device 1900b, and the chip carrier 1913. The encapsulation structure 1961 may protect the first microelectronic device 1900a and the second microelectronic device 1900b from mechanical and environmental degradation during assembly and use of the multi-chip module 1957. The lens structure 1962 may provide efficient optical transmission of optical signals from the second microelectronic device 1900b while also providing protection from mechanical and environmental degradation. The second additive process 1902b dispenses a second precursor 1903b, which may include a polymer resin, such as epoxy, for the encapsulation structure 1961 and may include an optically transparent resin, such as acrylic, for the lens structure 1962. The second additive process 1902b is depicted in FIG. 19B as implemented using a material extrusion apparatus 1906b, however, other additive process apparatus may be used. A second heating process 1907b, using a second heating apparatus 1908b may be implemented to cure the second precursor 1903b. Alternatively, the second precursor 1903b may be cured using ultraviolet (UV) light or may be cured at room temperature without use of the second heating process 1907b. Forming the encapsulation structure 1961 and the lens structure 1962 using the second additive process 1902b may provide lower cost packaging than using discrete lenses and molded encapsulation, in particular for small quantities or custom configurations of the first microelectronic device 1900a and the second microelectronic device 1900b.

Figure 20A:
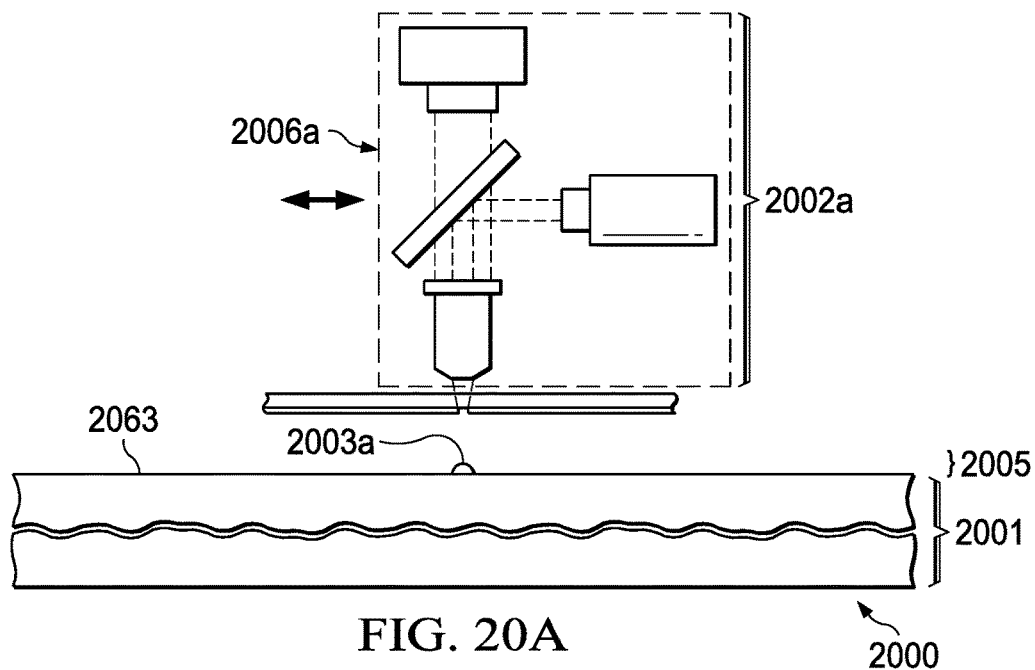
FIG. 20A through FIG. 20I are cross sections of a microelectronic device depicted in stages of another example method of formation.

FIG. 20A through FIG. 20I are cross sections of a microelectronic device depicted in stages of another example method of formation. Referring to FIG. 20A, the microelectronic device 2000 is formed on a workpiece 2001. A substrate 2005 of the microelectronic device 2000 is formed on a top surface 2063 of the workpiece 2001. In this example, the workpiece 2001 does not have a crystalline structure at the top surface 2063. The workpiece 2001 may have an amorphous structure at the top surface 2063.

A first additive process 2002a is configured to dispense a first precursor 2003a. The first precursor 2003a may include semiconductor nanoparticles and a liquid semiconductor precursor. The first additive process 2002a is implemented with a first additive process apparatus 2006a, which may include a direct laser deposition apparatus, as depicted in FIG. 20A. Other implementations of the first additive process 2002a are within the scope of the instant example.

The first additive process 2002a dispenses a first seed amount of the first precursor 2003a onto the top surface 2063 of the workpiece 2001. A volume of the first seed amount of the first precursor 2003a is such that upon conversion to semiconductor material, the first seed amount of the first precursor 2003a will convert to a single crystal having a desired first crystal orientation, for example a 100 orientation. The first seed amount of the first precursor 2003a may have a volume, for example, of $10^{-16}$ cm$^3$ to $10^{-18}$ cm$^3$. A material of the workpiece 2001 at the top surface 2063 of the workpiece 2001 may be selected to facilitate formation of the single crystal in the desired first crystal orientation. For example, the workpiece 2001 may have a layer of titanium dioxide or aluminum oxide, at the top surface 2063. The layer of titanium dioxide or aluminum oxide may be formed by an atomic layer deposition (ALD) process to provide a desired stoichiometry in the layer of titanium dioxide or aluminum oxide, which may further facilitate formation of the single crystal in the desired first crystal orientation.

Figure 20B:
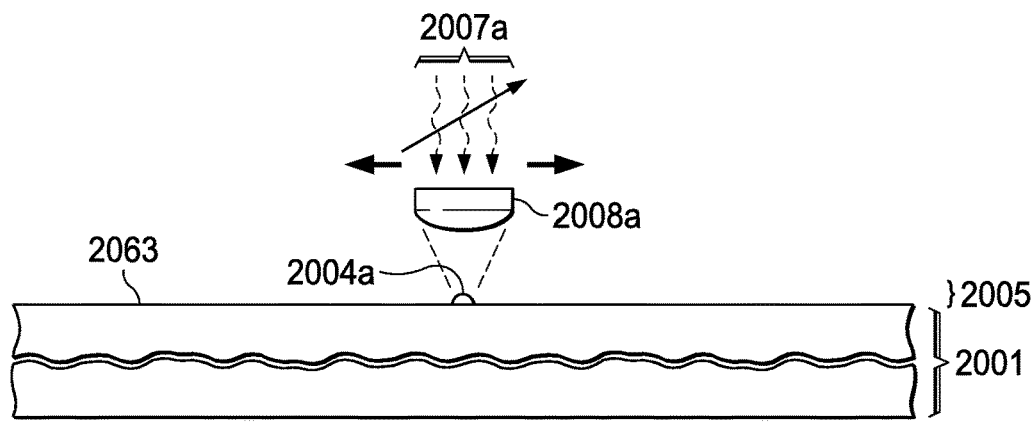

Referring to FIG. 20B, a first heating process 2007a heats the first seed amount of the first precursor 2003a, shown in FIG. 20A, to convert the first precursor 2003a to a first semiconductor material 2004a of the substrate 2005. The first semiconductor material 2004a is a single crystal. The first heating process 2007a is implemented with a first heating apparatus 2008a, which may include a focused adjustable radiative apparatus 2008a, as indicated in FIG. 20B. Other implementations of the first heating process 2007a are within the scope if this example.

Figure 20C:
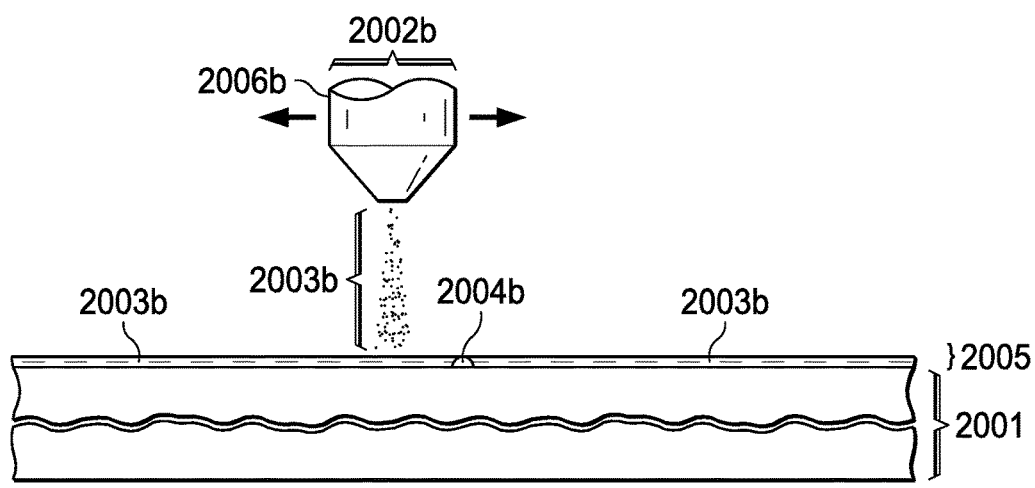

Referring to FIG. 20C, a second additive process 2002b dispenses a second precursor 2003b onto the workpiece 2001 in a sublayer adjacent to, and in contact with, the first semiconductor material 2004a. The second precursor 2003b includes semiconductor precursor material to form a solid semiconductor material having a same composition as the first semiconductor material 2004a. The second additive process 2002*b* is implemented with a second additive process apparatus 2006*b*, which may be different from the first additive process apparatus 2006*a* of FIG. 20A. The second additive process apparatus 2006*b*, depicted in FIG. 20C as an electrostatic deposition apparatus 2006*b*, may be selected to provide a higher dispense rate than the first additive process apparatus 2006*a*, to reduce fabrication time for the substrate 2005.

Figure 20D:
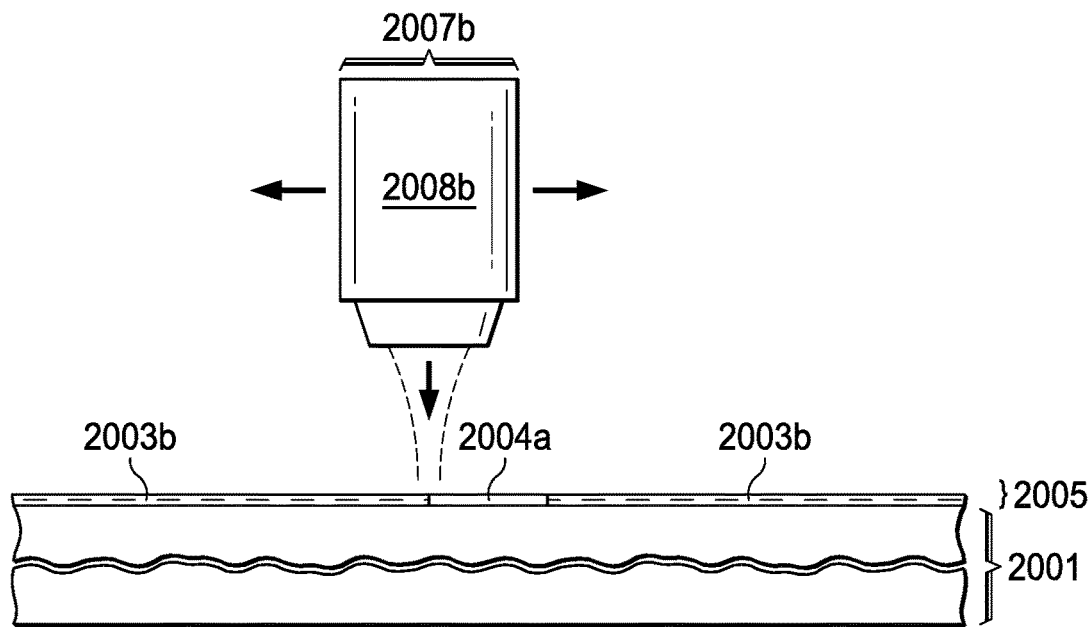

Referring to FIG. 20D, a second heating process 2007*b* heats the second precursor 2003*b* at a boundary between the first semiconductor material 2004*a* and the second precursor 2003*b*, to convert the second precursor 2003*b* to the first semiconductor material 2004*a* having a crystal orientation aligned with the first semiconductor material 2004*a*. The second heating process 2007*b* is implemented with a second heating apparatus 2008*b* that is appropriate for conversion of the second precursor 2003*b* in the sublayer to the first semiconductor material 2004*a*. The second heating apparatus 2008*b* is moved relative to the workpiece 2001 to convert more of the second precursor 2003*b* to the first semiconductor material 2004*a* along a boundary between the first semiconductor material 2004*a* and the second precursor 2003*b*. The second heating apparatus 2008*b* may be implemented with a different apparatus than the first heating apparatus 2008*a* of FIG. 20B. FIG. 20D depicts the second heating apparatus 2008*b* as a scanned laser apparatus. Other heating apparatus for the second heating process 2007*b* are within the scope of this example.

Figure 20E:
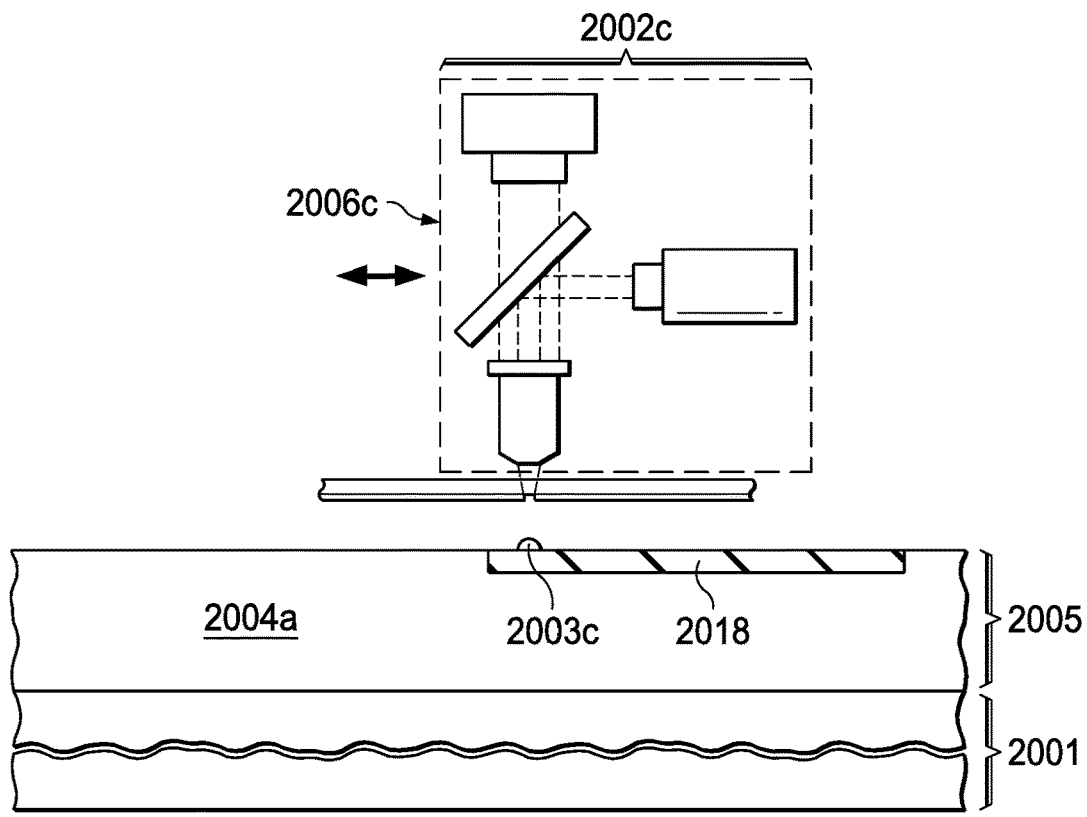

Referring to FIG. 20E, formation of the substrate 2005 is continued with formation of additional first semiconductor material 2004*a*. The additional first semiconductor material 2004*a* may be formed using the second additive process 2002*b* of FIG. 20C and the second heating process 2007*b* of FIG. 20D, or may be formed using other methods, such as epitaxial processes. The first semiconductor material 2004*a* formed as disclosed in reference to FIG. 20A through FIG. 20D provides a seed layer for the formation of the additional first semiconductor material 2004*a*.

Figure 20F:
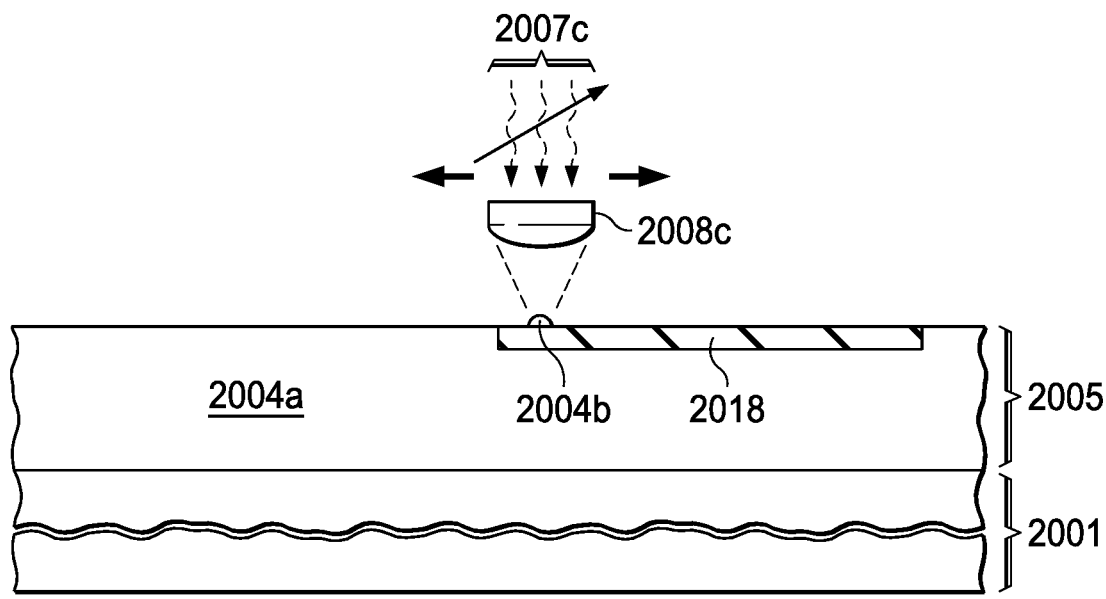
Figure 20G:
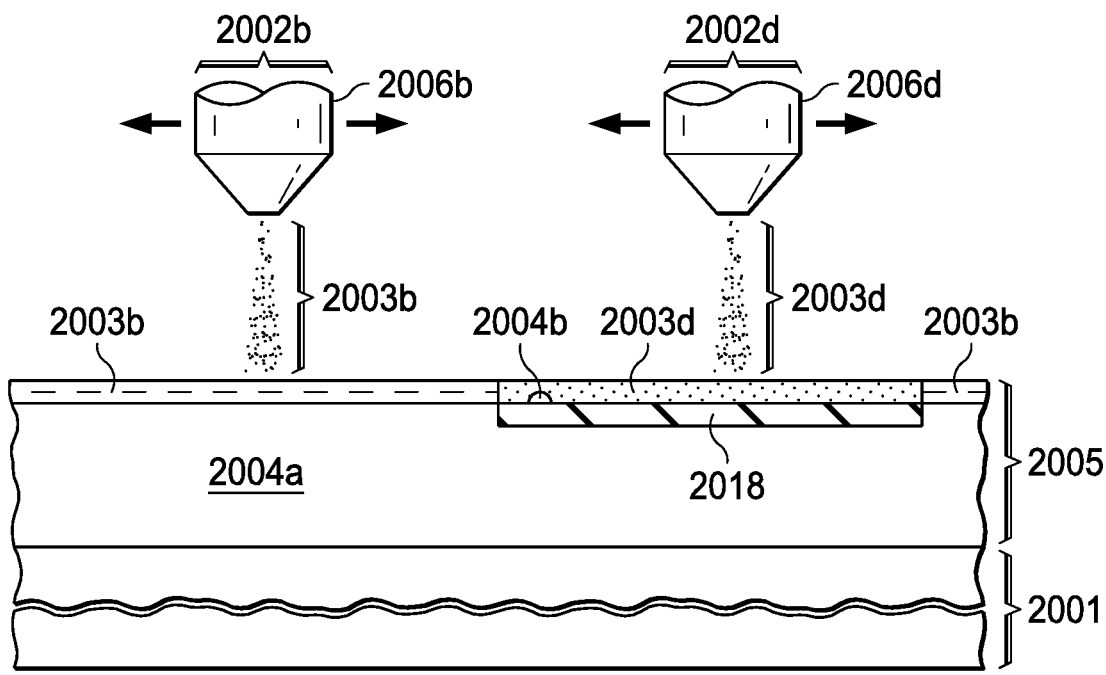
Figure 20H:
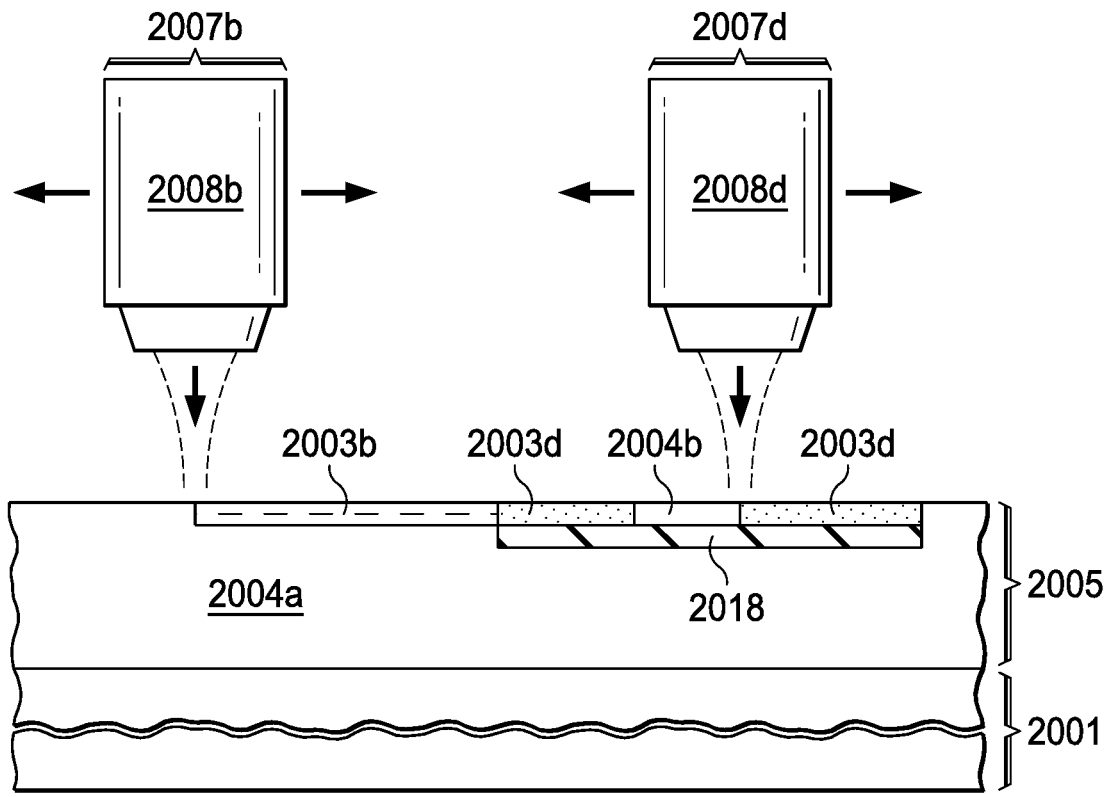

A buried isolation structure 2018 is formed on the first semiconductor material 2004*a*, in an area for a second semiconductor material 2004*b*, shown in FIG. 20H. Referring to FIG. 20E, the buried isolation structure 2018 may include, for example, silicon dioxide, and may be formed by an additive process and an associated heating process, or may be formed by other methods, such as oxidation of silicon in the first semiconductor material 2004*a*. Other materials for the buried isolation structure 2018, such as silicon nitride, silicon oxynitride, or aluminum oxide, are within the scope of this example. The buried isolation structure 2018 may have a non-crystalline structure, and may be substantially amorphous.

A third additive process 2002*c* is configured to dispense a third precursor 2003*c*. The third precursor 2003*c* may include semiconductor nanoparticles and a liquid semiconductor precursor. The third additive process 2002*c* is implemented with a third additive process apparatus 2006*c*, which may include a direct laser deposition apparatus, as depicted in FIG. 20E, and may be implemented with the first additive process apparatus 2006*a* of FIG. 20A. Other implementations of the third additive process 2002*c* are within the scope of the instant example.

The third additive process 2002*c* dispenses a second seed amount of the third precursor 2003*c* onto the buried isolation structure 2018. A volume of the second seed amount of the third precursor 2003*c* is such that upon conversion to solid semiconductor material, the third seed amount of the third precursor 2003*c* will convert to a single crystal having a desired second crystal orientation, for example a 110*a* orientation. The second seed amount of the third precursor 2003*c* may have a volume, for example, of $10^{-16}$ cm$^3$ to $10^{-18}$ cm$^3$, similar to the first seed amount of FIG. 20A. The buried isolation structure 2018 may have a layer of a material to facilitate formation of the single crystal in the desired second crystal orientation.

Referring to FIG. 20F, a third heating process 2007*c* heats the second seed amount of the third precursor 2003*c*, shown in FIG. 20E, to convert the third precursor 2003*c* to a second semiconductor material 2004*b* of the substrate 2005. The second semiconductor material 2004*b* is a single crystal. The third heating process 2007*c* is implemented with a third heating apparatus 2008*c*, and may be implemented with the first heating apparatus 2008*a* of FIG. 20B. Other implementations of the third heating process 2007*c* are within the scope if this example.

Referring to FIG. 20G, the second additive process 2002*b* dispenses the second precursor 2003*b* onto first semiconductor material 2004*a* to form a sublayer of the second precursor 2003*b* on the first semiconductor material 2004*a* where exposed by the buried isolation structure 2018. A fourth additive process 2002*d* dispenses a fourth precursor 2003*d* onto the buried isolation structure 2018 to form a sublayer of the fourth precursor 2003*d* adjacent to, and in contact with, the second semiconductor material 2004*b*. The fourth precursor 2003*d* includes semiconductor precursor material to form a solid semiconductor material having a same composition as the second semiconductor material 2004*b*. The fourth additive process 2002*d* is implemented with a fourth additive process apparatus 2006*d*, which may be similar to the second additive process apparatus 2006*b*, and may have similar advantages of a higher dispense rate than the third additive process apparatus 2006*c* of FIG. 20E, to reduce fabrication time for the substrate 2005.

Referring to FIG. 20H, the second heating process 2007*b* heats the second precursor 2003*b* to convert the second precursor 2003*b* to the first semiconductor material 2004*a*. A fourth heating process 2007*d* heats the fourth precursor 2003*d* at a boundary between the second semiconductor material 2004*b* and the fourth precursor 2003*d*, to convert the fourth precursor 2003*d* to the second semiconductor material 2004*b* on the buried isolation structure 2018 having a crystal orientation aligned with the second semiconductor material 2004*b*. The fourth heating process 2007*d* is implemented with a fourth heating apparatus 2008*d* that is appropriate for conversion of the fourth precursor 2003*d* in the sublayer to the second semiconductor material 2004*b*. The fourth heating apparatus 2008*d* is moved relative to the workpiece 2001 to convert more of the fourth precursor 2003*d* to the second semiconductor material 2004*b* along a boundary between the second semiconductor material 2004*b* and the fourth precursor 2003*d*. The fourth heating apparatus 2008*d* may be implemented with a similar apparatus to the second heating apparatus 2008*b*, and may be implemented as a continued use of the second heating apparatus 2008*b*. Other heating apparatus for the fourth heating process 2007*d* are within the scope of this example.

Figure 20I:
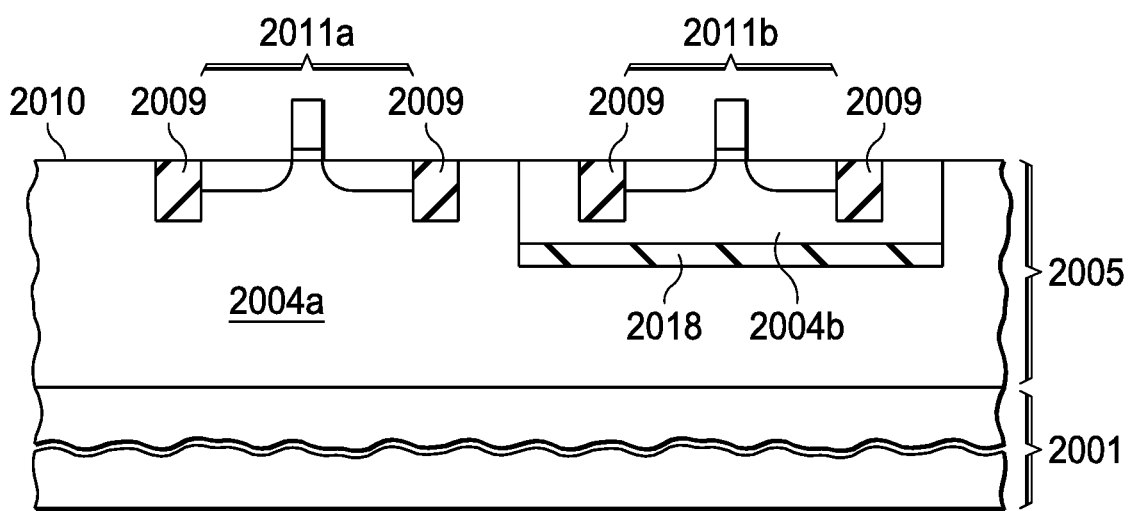

Referring to FIG. 20I, formation of the substrate 2005 is completed. The substrate 2005 extends to a component surface 2010, located opposite from the workpiece 2001. Isolation structures 2009 may be formed in the substrate 2005. The isolation structures 2009 may be formed by additive processes, planar processes, or a combination of additive processes and planar processes.

A first component 2011*a* of the microelectronic device 2000 may be formed in the first semiconductor material 2004a. Performance of the first component 2011a may be enhanced by the crystal orientation of the first semiconductor material 2004a. The first component 2011a is depicted in FIG. 20I as a MOS transistor 2011a, however, other manifestations of the first component 2011a, such as a bipolar junction transistor, or a JFET, are within the scope of this example. A second component 2011b of the microelectronic device 2000 may be formed in the second semiconductor material 2004b. Performance of the second component 2011b may be enhanced by the crystal orientation of the second semiconductor material 2004b. The second component 2011b is similarly depicted in FIG. 20I as a MOS transistor 2011b, however, other manifestations of the second component 2011b are within the scope of this example. The first component 2011a and the second component 2011b may be formed by additive processes, planar processes, or a combination of additive processes and planar processes. Forming the first semiconductor material 2004a and the second semiconductor material 2004b using the additive processes 2002a, 2002b, 2002c, and 2002d may provide the substrate 2005 with semiconductor regions having the first and second crystal orientations at lower fabrication cost and complexity compared to epitaxial or layer transfer processes.

Modifications are possible in the described embodiments, and other embodiments are possible, within the scope of the claims. Various features and processes of the examples disclosed herein may be combined in other implementations of example methods for forming microelectronic devices. For example, the method disclosed in reference to FIG. 1A through FIG. 1G cmay be used in combination with the methods disclosed in the other examples herein to form semiconductor regions and isolation structures extending through the substrates of the microelectronic devices. The method disclosed in reference to FIG. 2A through FIG. 2E, the method disclosed in reference to FIG. 3A through FIG. 3C, or the method disclosed in reference to FIG. 7A through FIG. 7D, may be used in combination with the methods disclosed in the other examples herein to form buried layers and isolated regions in the substrates of the microelectronic devices. The method disclosed in reference to FIG. 4A through FIG. 4D, the method disclosed in reference to FIG. 5A and FIG. 5B, or the method disclosed in reference to FIG. 6, may be used in combination with the methods disclosed in the other examples herein to form transistors in the substrates of the microelectronic devices. The method disclosed in reference to FIG. 8A through FIG. 8C, the method disclosed in reference to FIG. 9A and FIG. 9B, the method disclosed in reference to FIG. 13A through FIG. 13C, the method disclosed in reference to FIG. 14A and FIG. 14B, or the method disclosed in reference to FIG. 18A and FIG. 18B, may be used in combination with the methods disclosed in the other examples herein to form electrical conductor structures in the substrates of the microelectronic devices. The method disclosed in reference to FIG. 10A and FIG. 10B may be used in combination with the methods disclosed in the other examples herein to form photonic components in the substrates of the microelectronic devices. The method disclosed in reference to FIG. 11A through FIG. 11C, or the method disclosed in reference to FIG. 12A through FIG. 12C, may be used in combination with the methods disclosed in the other examples herein to form microelectronic devices with varying components in the substrates of the microelectronic devices. The method disclosed in reference to FIG. 15A through FIG. 15D may be used in combination with the methods disclosed in the other examples herein to form microelectronic devices with planar component surfaces on the substrates of the microelectronic devices. The method disclosed in reference to FIG. 16A and FIG. 16B may be used in combination with the methods disclosed in the other examples herein to form microelectronic devices with MEMS structures in the substrates of the microelectronic devices. The method disclosed in reference to FIG. 17A and FIG. 17B may be used in combination with the methods disclosed in the other examples herein to form microelectronic devices with quantum dot structures in the substrates of the microelectronic devices. The method disclosed in reference to FIG. 19A and FIG. 19B may be used in combination with the methods disclosed in the other examples herein to form the substrates of the microelectronic devices on chip carriers. The method disclosed in reference to FIG. 20A through FIG. 20I may be used in combination with the methods disclosed in the other examples herein to form the substrates of the microelectronic devices on workpieces without crystalline structures.

What is claimed is:

1. A method of forming a microelectronic device, comprising:
    forming a substrate on a workpiece, the substrate having a bottom surface contacting the workpiece and a component surface opposite from the bottom surface, by a process including:
    forming a first semiconductor structure on the workpiece for a first component by a first dispensing process using a first semiconductor precursor in the substrate of the microelectronic device, the first semiconductor structure and the first semiconductor precursor having a first conductivity type, the first semiconductor precursor including neopentasilane, the first semiconductor structure extending from the component surface to the bottom surface; and
    forming a second semiconductor structure on the workpiece for a second component by a second dispensing process using a second semiconductor precursor in the substrate, the second semiconductor structure and the second semiconductor precursor having a second conductivity type opposite from the first conductivity type, the second semiconductor structure extending from the component surface to the bottom surface; and
    removing the substrate from the workpiece and exposing the bottom surface.

2. A method of forming a microelectronic device, comprising:
    forming a substrate on a workpiece, the substrate having a bottom surface contacting the workpiece and a component surface opposite from the bottom surface, the component surface being planar, by a process including:
    forming a semiconductor material having a conductivity type by a first dispensing process using a semiconductor precursor in the substrate, the semiconductor precursor including neopentasilane and having the conductivity type; and
    forming a dielectric material by a second dispensing process using a dielectric precursor in the substrate, in which:
        the dielectric material contacts the semiconductor material; and
        the semiconductor material extends from the bottom surface to the component surface; and
    removing the substrate from the workpiece and exposing the bottom surface.

3. The method of claim 2, in which the dielectric material is in an isolation structure of the substrate.

4. The method of claim 2, in which the dielectric material extends to the component surface.

5. A method of forming a microelectronic device, comprising:
- forming a substrate on a workpiece, the substrate having a bottom surface contacting the workpiece and a component surface opposite from the bottom surface, the component surface being planar, by a process including:
  - forming a first semiconductor structure for a first component by a first dispensing process using a first semiconductor precursor that includes neopentasilane, the first semiconductor structure and the first semiconductor precursor having a first conductivity type, the first semiconductor structure extending to the component surface;
  - forming a second semiconductor structure for a second component by a second dispensing process using a second semiconductor precursor, the second semiconductor structure and the second semiconductor precursor having a second conductivity type, opposite from the first conductivity type, the second semiconductor structure extending to the component surface; and
  - forming a dielectric material by a third dispensing process using a precursor, the dielectric material contacting the first semiconductor structure, contacting the second semiconductor structure, and laterally separating the first semiconductor structure from the second semiconductor structure; and
- removing the substrate from the workpiece and exposing the bottom surface.

6. The method of claim 5, in which the dielectric material extends to the component surface.

7. The method of claim 5, in which the first semiconductor structure extends to the bottom surface, and the second semiconductor structure extends to the bottom surface.

8. The method of claim 7, in which the dielectric material extends to the bottom surface.

9. The method of claim 5, including forming component structures on the component surface.

\* \* \* \* \*